(12) United States Patent
Shino

(10) Patent No.: US 7,911,000 B2
(45) Date of Patent: Mar. 22, 2011

(54) SEMICONDUCTOR MEMORY DEVICE

(75) Inventor: Tomoaki Shino, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 95 days.

(21) Appl. No.: 12/360,399

(22) Filed: Jan. 27, 2009

(65) Prior Publication Data

US 2009/0189222 A1      Jul. 30, 2009

(30) Foreign Application Priority Data

Jan. 28, 2008  (JP) ................................ 2008-016579

(51) Int. Cl.
*H01L 21/70* (2006.01)
(52) U.S. Cl. .......... 257/368; 257/E21.646; 257/E27.084
(58) Field of Classification Search ......................... None
See application file for complete search history.

(56) References Cited

U.S. PATENT DOCUMENTS

| | | | | |
|---|---|---|---|---|
| 6,239,465 B1 * | 5/2001 | Nakagawa | .................... | 257/331 |
| 2008/0277725 A1 | 11/2008 | Shino | | |

FOREIGN PATENT DOCUMENTS

| | | |
|---|---|---|
| JP | 8-64778 | 3/1996 |
| JP | 2002-329795 | 11/2002 |
| JP | 2003-86712 | 3/2003 |
| JP | 2005-26366 | 1/2005 |
| JP | 2007-18588 | 1/2007 |
| WO | WO 2009/005075 A2 | 1/2009 |

OTHER PUBLICATIONS

U.S. Appl. No. 12/598,866, filed Nov. 4, 2009, Shino.

* cited by examiner

*Primary Examiner* — Julio J Maldonado
*Assistant Examiner* — Shaka Scarlett
(74) *Attorney, Agent, or Firm* — Oblon, Spivak, McClelland, Maier & Neustadt, L.L.P.

(57) ABSTRACT

A memory includes a U-shape layer on a substrate; a first diffusion layer provided at an upper part of the U-shaped layer; a second diffusion layer provided at a lower part of the U-shaped layer; a body formed at an intermediate portion of the U-shaped layer between the first and the second diffusion layers; a first gate dielectric film provided on an outer side surface of the U-shaped layer; a first gate electrode provided on the first gate dielectric film; a second gate dielectric film provided on an inner side surface of the U-shaped layer; a second gate electrode provided on the second gate dielectric film; a bit line contact connecting the bit line to the first diffusion layer; a source line contact connecting the source line to the second diffusion layer, wherein cells adjacent in the first direction alternately share the bit line contact and the source line contact.

20 Claims, 64 Drawing Sheets

A-A CROSS SECTION

A-A CROSS SECTION

HOLDING STATE

WRITE OPERATION

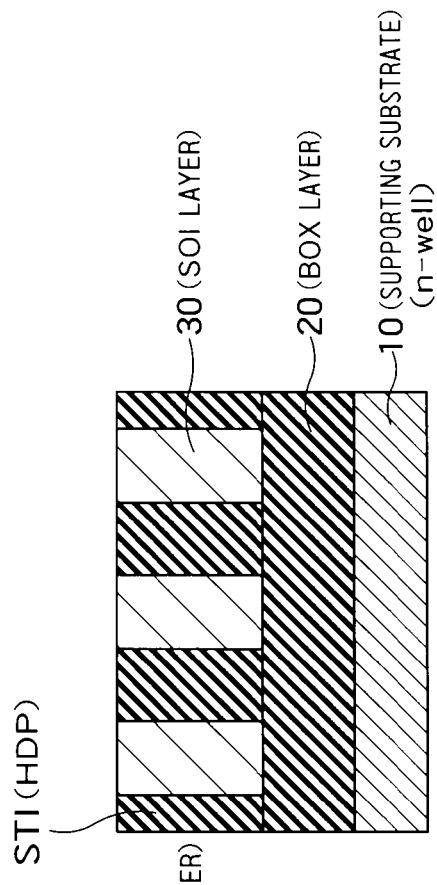
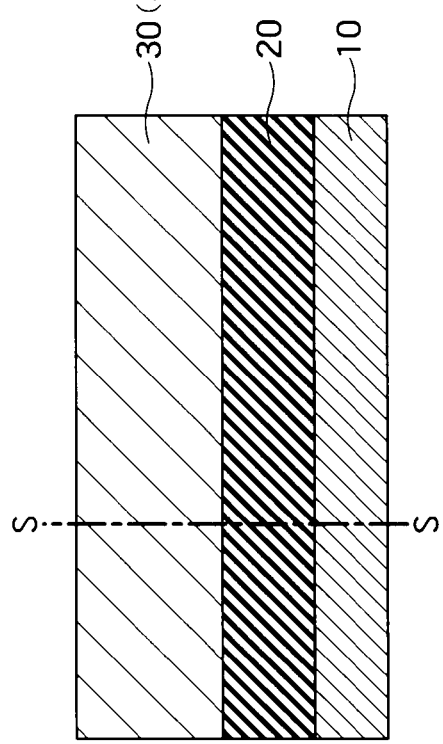

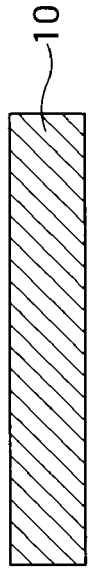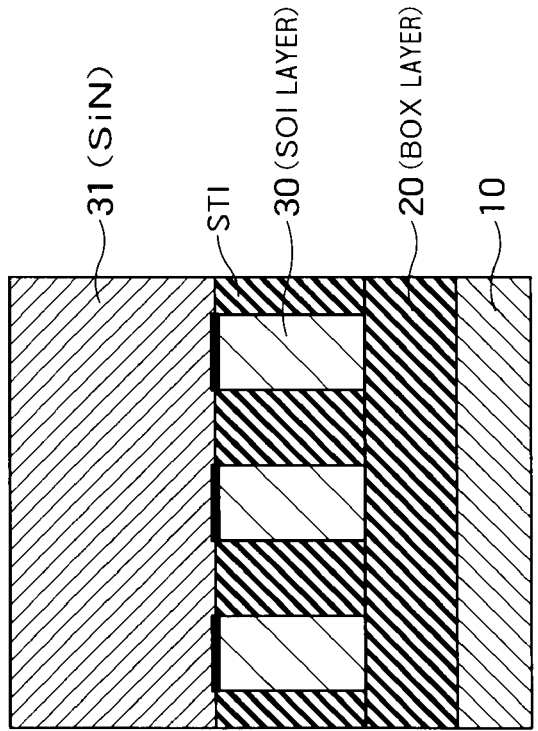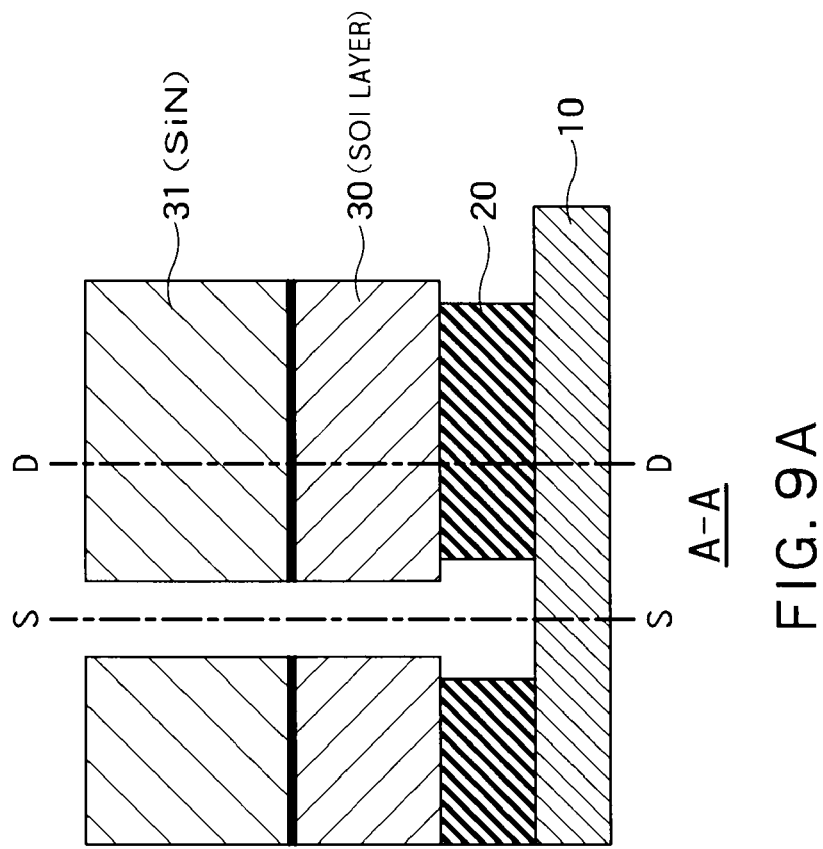

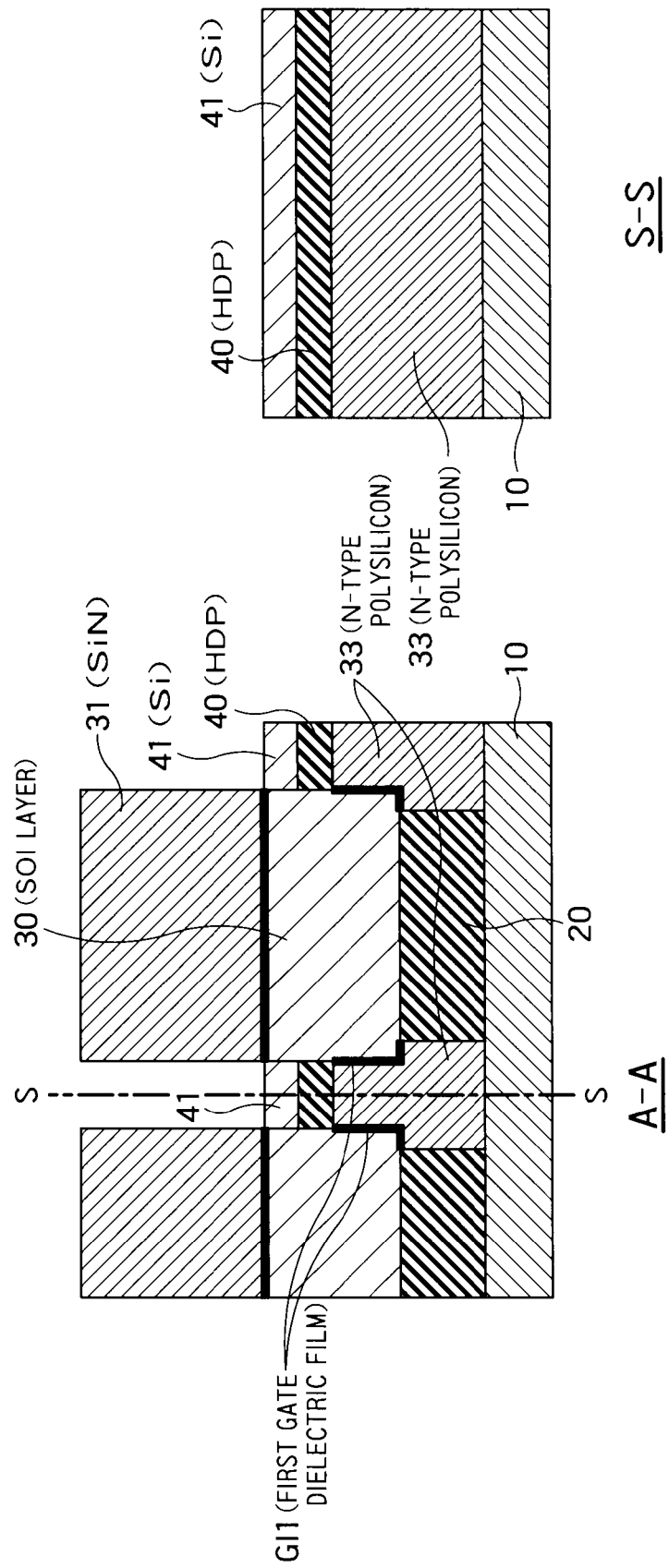

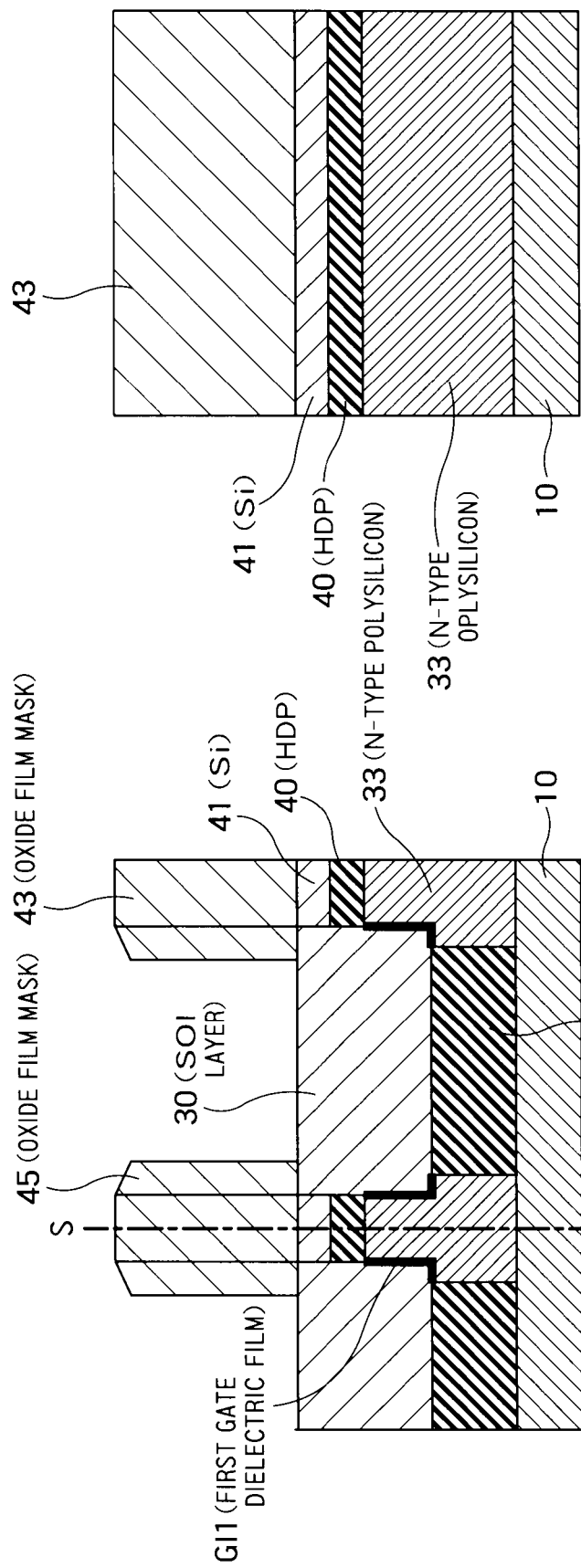

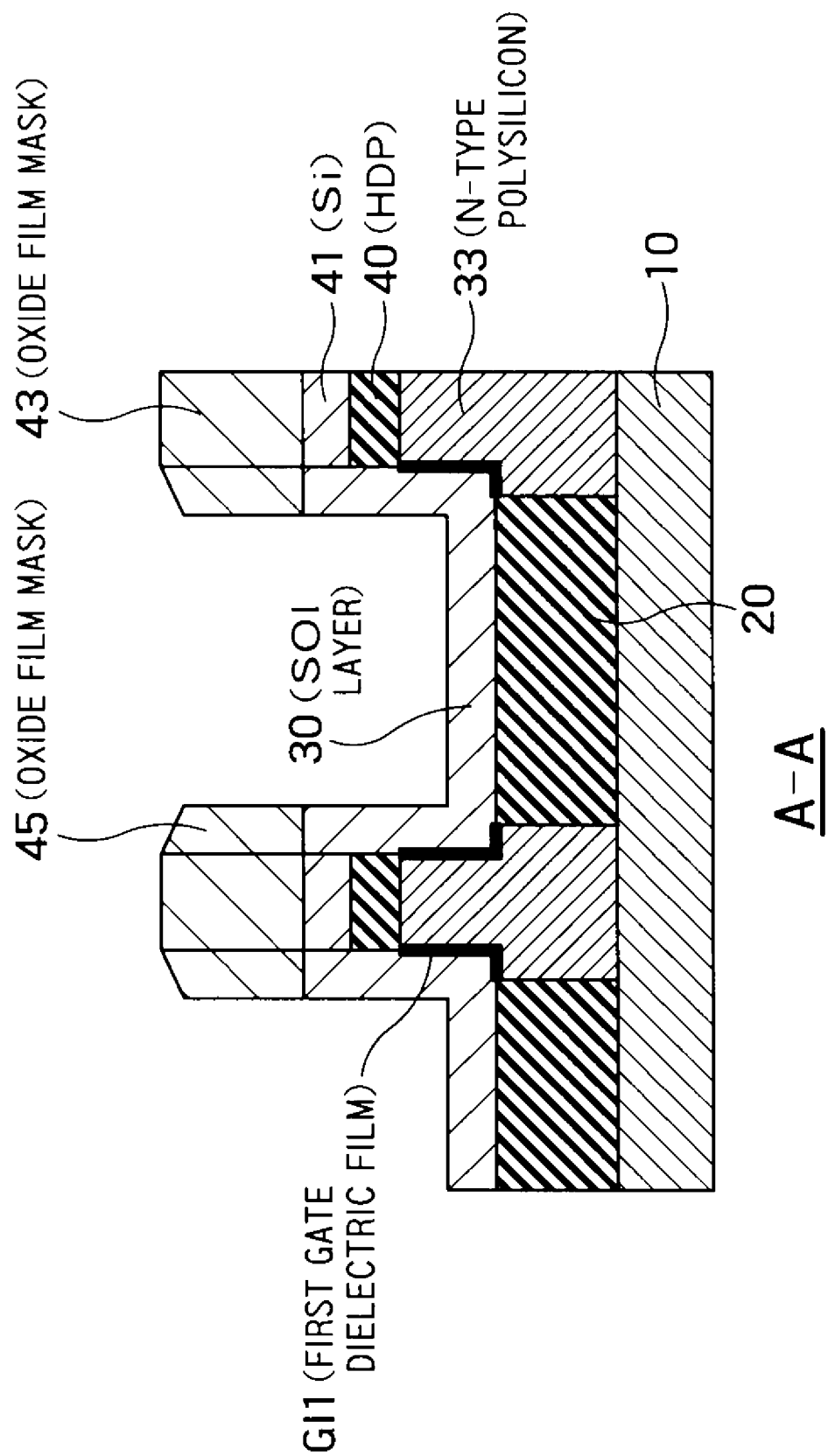

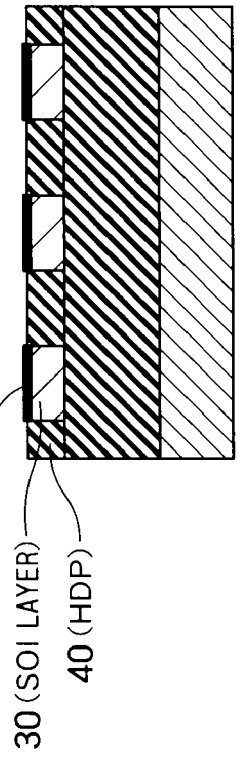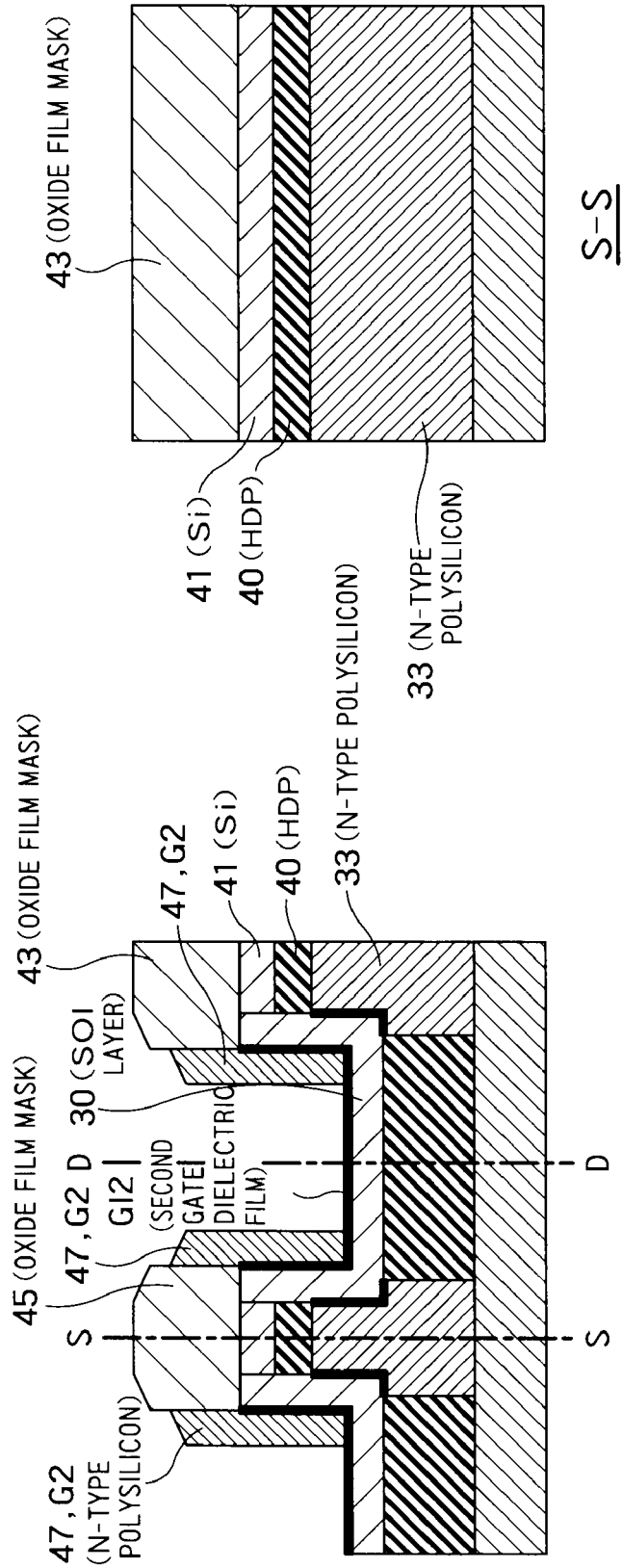

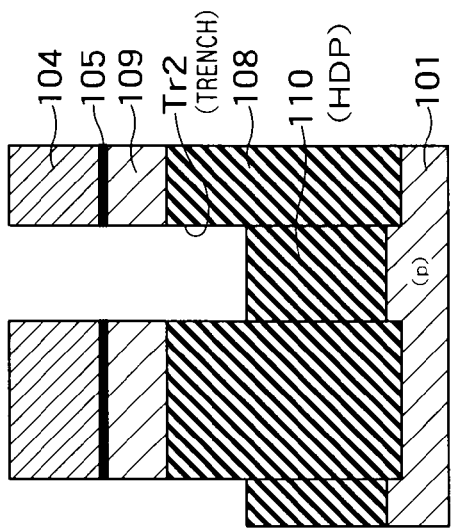
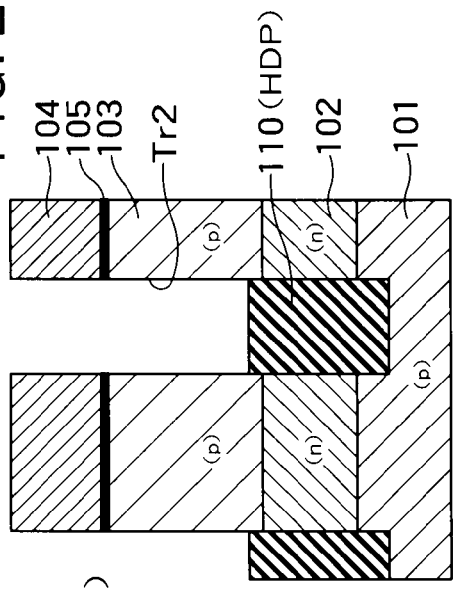
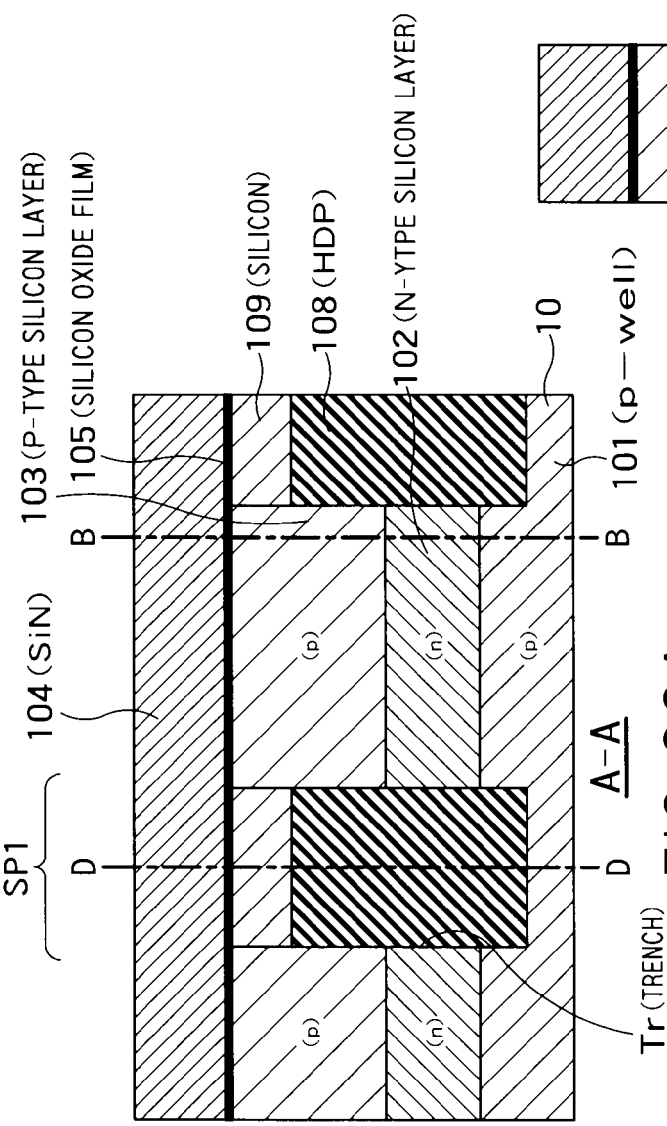

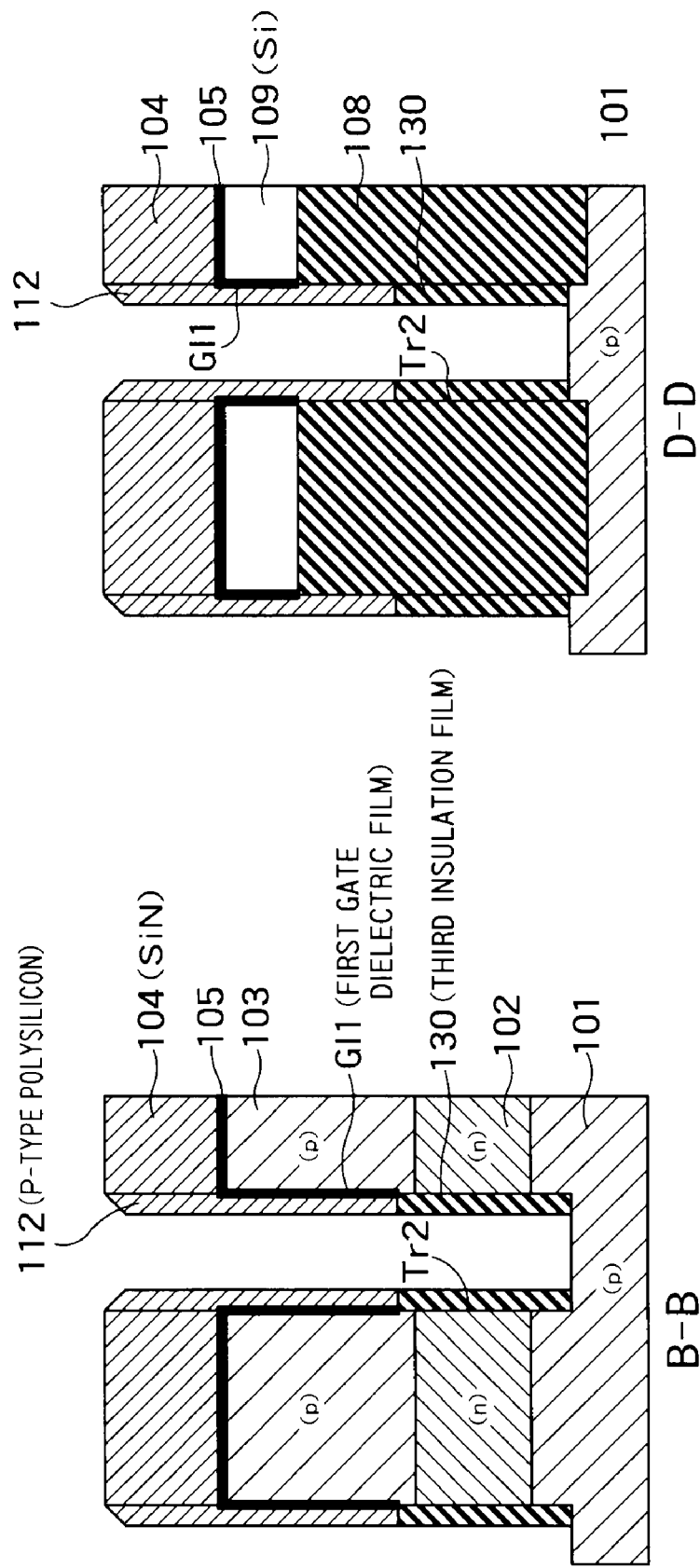

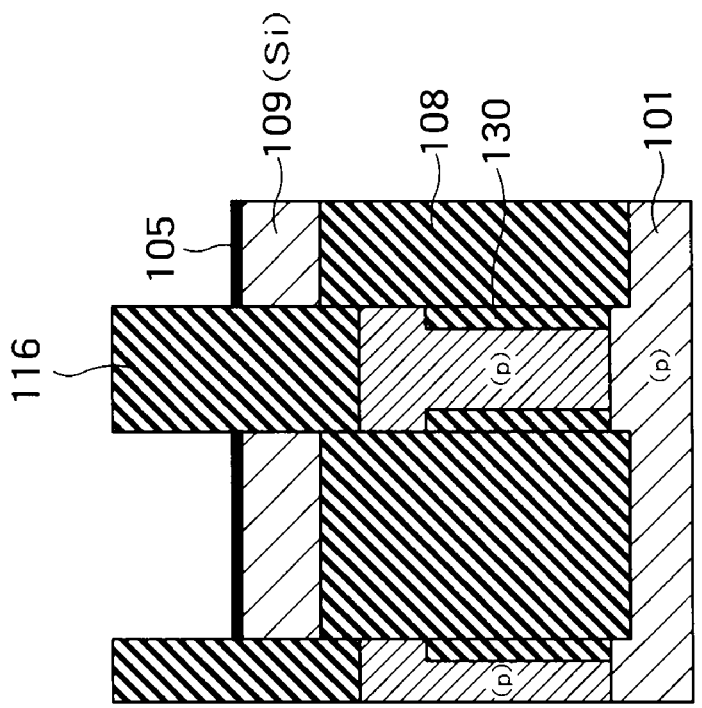
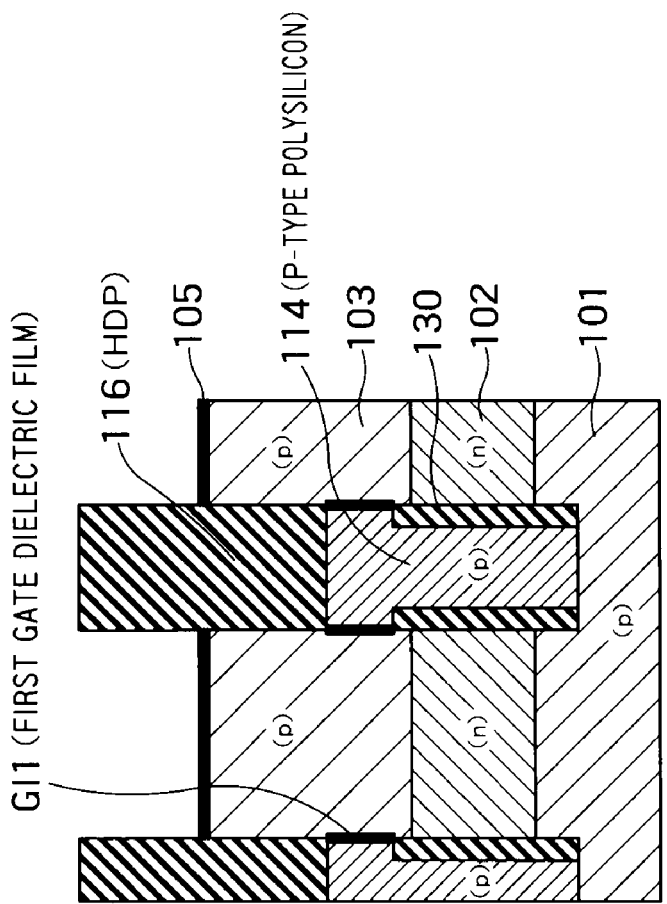
FIG. 25B D-D
FIG. 25A B-B

D-D

B-B

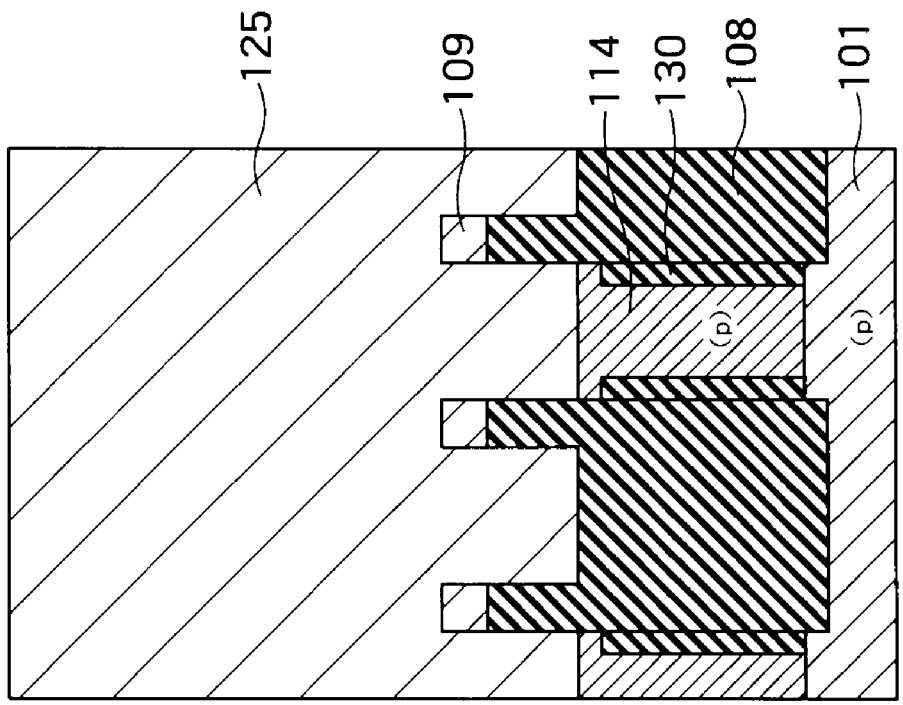
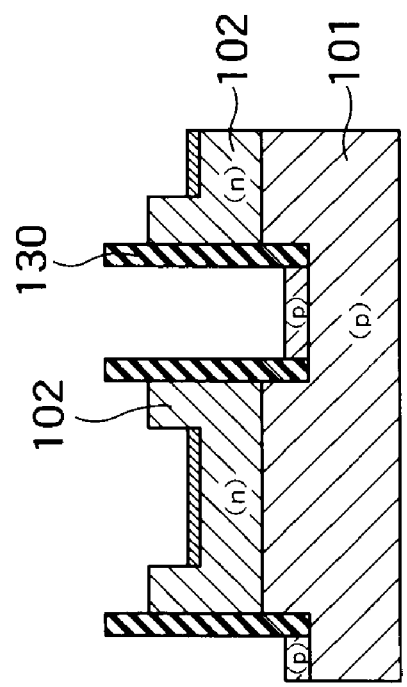

THIRD EMBODIMENT

FIG. 68 FOURTH EMBODIMENT

D-D

S-S

FIFTH EMBODIMENT
A-A

S-S

D-D

SEMICONDUCTOR MEMORY DEVICE

CROSS-REFERENCE TO RELATED APPLICATION

This application is based upon and claims the benefit of priority from the prior Japanese Patent Applications No. 2008-16579, filed on Jan. 28, 2008, the entire contents of which are incorporated herein by reference.

BACKGROUND OF THE INVENTION

1. Field of the Invention

The present invention relates to a semiconductor memory device.

2. Related Art

There has been an FBC memory device as a semiconductor memory device expected as a memory alternative to a 1T (Transistor)-1C (Capacitor) DRAM. The FBC memory device has an FET (Field Effect Transistor) formed to include floating bodies (hereinafter, also "bodies") on an SOI (Silicon On Insulator) substrate. The FBC memory device stores data "1" or data "0" based on the number of majority carriers accumulated in the bodies. For example, in an FBC including N-type FETs, a state of a large number of holes accumulated in the bodies is set as data "1", and a state of a small number of holes accumulated in the bodies is set as data "0". A memory cell storing the data "0" is called a "0" cell, and a memory cell storing the data "1" is called a "1" cell.

In recent years, a fin-FBC suitable for a fully depleted operation has been developed. The fin-FBC is disclosed in Japanese Patent Application Laid-open (JP-A) No. 2007-18588 (see FIG. 12), for example. Along with progress of downscaling the memory device, a gate length of the FBC becomes shorter. Decreasing the gate length brings about reduction of a difference between a threshold voltage (signal amounts) of the "0" cells and that of the "1" cells, and increases the number of fail bits. This is because a body region capable of accumulating a charge decreases. Along with the progress of downscaling the memory device, an operation voltage needs to be decreased. However, when the operation voltage is decreased, a difference between the number of holes in the "0" cells and that in the "1" cells becomes small, and consequently a difference between the threshold voltages becomes small. According to a fin configuration disclosed in JP-A No. 2007-18588, the downscaling cannot be performed while maintaining a signal difference.

Vertical transistors are used as FBCs in JP-A H8-064778 (FIG. 20), JP-A 2002-329795 (FIG. 10), JP-A 2003-86712 (FIG. 45B), and JP-A 2005-26366 (FIG. 3). In these FBCs, a first N-type region is provided above bodies, a second N-type region is provided below the bodies, and gates are provided on a side surface of the bodies. The first N-type region and the second N-type region are arranged in a direction orthogonal with a surface of a semiconductor substrate. Plural memory cells share the second N-type region provided on the semiconductor substrate. In this vertical configuration, parasitic resistance in the second N-type region becomes a problem. The side surface of the bodies on which the gates are provided (the surface of the bodies on which channels are formed) faces a bit line direction. In this configuration, when a width (thickness) of the bodies in a bit line direction becomes small, a short-circuiting occurs between electrodes due to a contact, and this has a problem of increasing a contact resistance.

SUMMARY OF THE INVENTION

A semiconductor memory device according to an embodiment of the present invention comprises: a semiconductor substrate; a plurality of bit lines extending to a first direction; a plurality of word lines extending to a second direction crossing with the first direction; a plurality of source lines extending to the second direction; a semiconductor layer formed in a U-shape on the semiconductor substrate in a cross section along the first direction; a first diffusion layer provided at an upper part of the U-shaped semiconductor layer; a second diffusion layer provided at a lower part of the U-shaped semiconductor layer; a body formed at an intermediate portion of the semiconductor layer between the first diffusion layer and the second diffusion layer, the body being in an electrically floating state, and accumulating or discharging an electric charge to store data; a first gate dielectric film provided on an outer side surface of the U-shaped semiconductor layer, the outer side surface facing the first direction; a first gate electrode provided via the first gate dielectric film on the outer side surface; a second gate dielectric film provided on an inner side surface of the U-shaped semiconductor layer, the inner side surface facing the first direction; a second gate electrode provided on the inner side surface via the second gate dielectric film, and insulated from the first gate electrode; a bit line contact electrically connecting the bit line to one of the first and the second diffusion layers; and a source line contact electrically connecting the source line to the other one of the first and the second diffusion layers, wherein the body, the first diffusion layer, and the second diffusion layer form memory cells, and a plurality of the memory cells adjacent in the first direction alternately share the bit line contact and the source line contact.

A semiconductor memory device according to an embodiment of the present invention comprises a semiconductor substrate; a plurality of bit lines extending to a first direction; a plurality of word lines extending to a second direction crossing with the first direction; a plurality of source lines extending to the second direction; a semiconductor layer formed in a U-shape on the semiconductor substrate in a cross section along the first direction; a first diffusion layer provided at an upper part of the U-shaped semiconductor layer; a second diffusion layer provided at a lower part of the U-shaped semiconductor layer; a body formed at an intermediate portion of the semiconductor layer between the first diffusion layer and the second diffusion layer, the body being in an electrically floating state, and accumulating or discharging an electric charge to store data; a first gate dielectric film provided on a first side surface of the U-shaped semiconductor layer, the first side surface facing the second direction; a first gate electrode provided via the first gate dielectric film on the first side surface; a second gate dielectric film provided on a second side surface of the U-shaped semiconductor layer, the second side surface being provided an opposite side of the first side surface of the U-shaped semiconductor layer; a second gate electrode provided on the second side surface via the second gate dielectric film, and insulated from the first gate electrode; a bit line contact electrically connecting the bit line to one of the first and the second diffusion layers; and a source line contact electrically connecting the source line to the other one of the first and the second diffusion layer, wherein the body, the first diffusion layer, and the second diffusion layer form memory cells, and a plurality of the memory cells adjacent in the first direction alternately share the bit line contact and the source line contact.

BRIEF DESCRIPTION OF THE DRAWINGS

FIG. 8 to FIG. 15 are cross-sections showing a method of manufacturing the FBC memory according to the first embodiment;

FIG. 23 to FIG. 34 are cross-sections showing a method of manufacturing the FBC memory according to the first embodiment;

DETAILED DESCRIPTION OF THE INVENTION

Embodiments of the present invention will be explained below in detail with reference to the accompanying drawings. Note that the invention is not limited thereto.

First Embodiment

Figure 1:
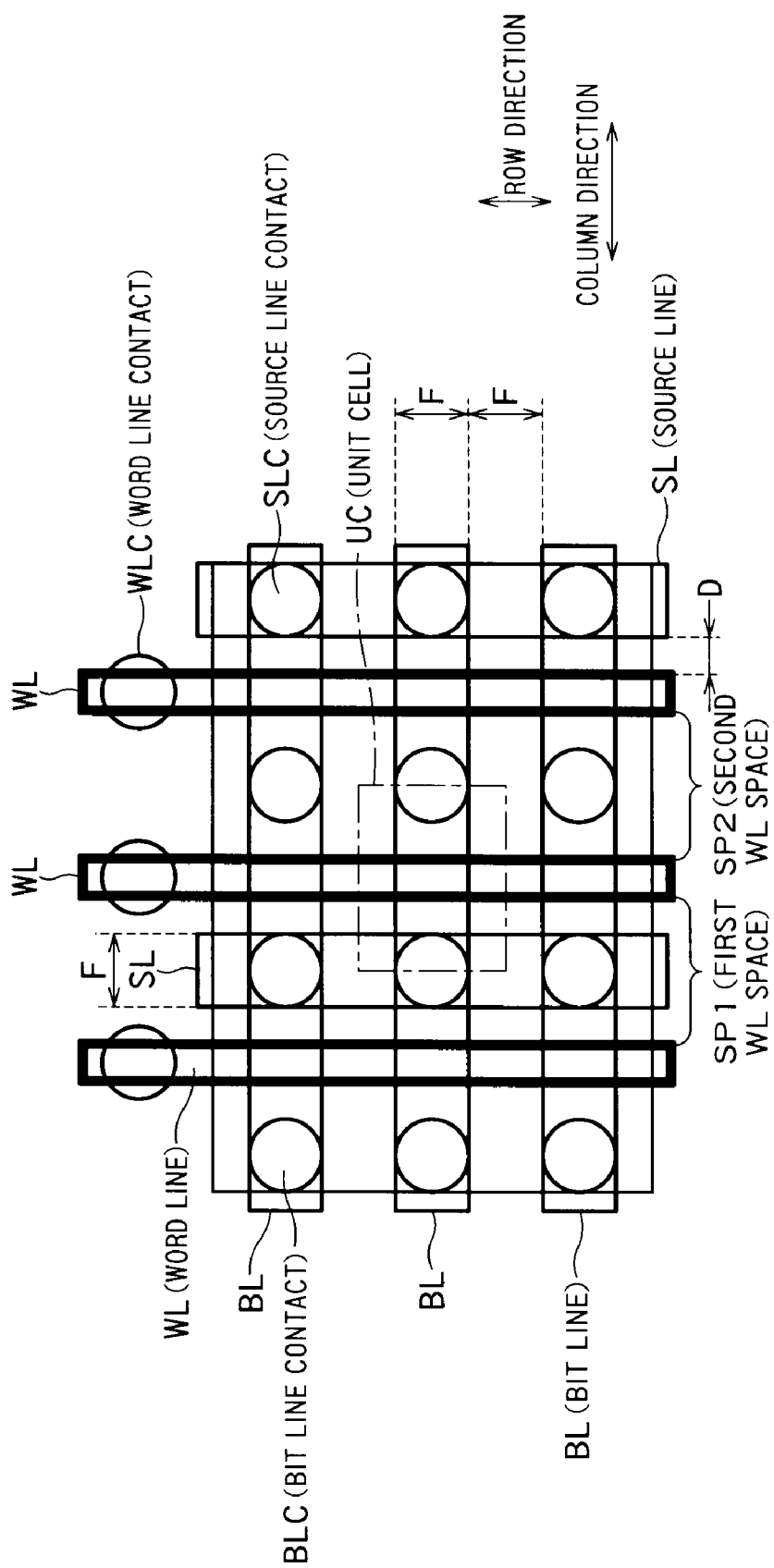
FIG. 1 is a plan view showing a wiring of an FBC memory according to a first embodiment of the present invention.

FIG. 1 is a plan view showing a wiring of an FBC memory according to a first embodiment of the present invention. The FBC memory includes plural bit lines BL extended to a column direction as a first direction, plural word lines WL extended to a row direction as a second direction orthogonal with the column direction, and plural source lines SL extended to the second direction.

The bit lines are connected to drains of memory cells via bit line contacts BLC. The source lines SL are connected to source layers of the memory cells via source line contacts SLC. Wiring widths of the bit lines BL and the source lines SL are F (feature size). F is a minimum size of a resist pattern that can be formed by a lithography technology in a certain generation.

A semiconductor layer (an active area) is extended below the bit lines BL. The memory cells are arranged at cross points between the word lines WL and the bit lines BL.

A first space SP1 or a second space SP2 is present between two adjacent word lines WL. The first spaces SP1 and the second spaces SP2 are alternately present between the adjacent two word lines WL. The source line contacts SLC are formed in the first spaces SP1. The bit line contacts BLC are formed in the second spaces SP2. Widths of the first spaces SP1 and the second spaces SP2 are 2D+F, respectively. The word lines WL are formed using a spacer without using lithography. Therefore, a width of each word line WL can be formed smaller than F. For example, a width of the word line WL is 0.5 F. When D is 0.5 F, and also when an interval between each bit line BL and a next bit line BL is F, the size (area) of a unit cell UC shown in FIG. 1 can be made as small as $5 F^2$.

Figure 2:
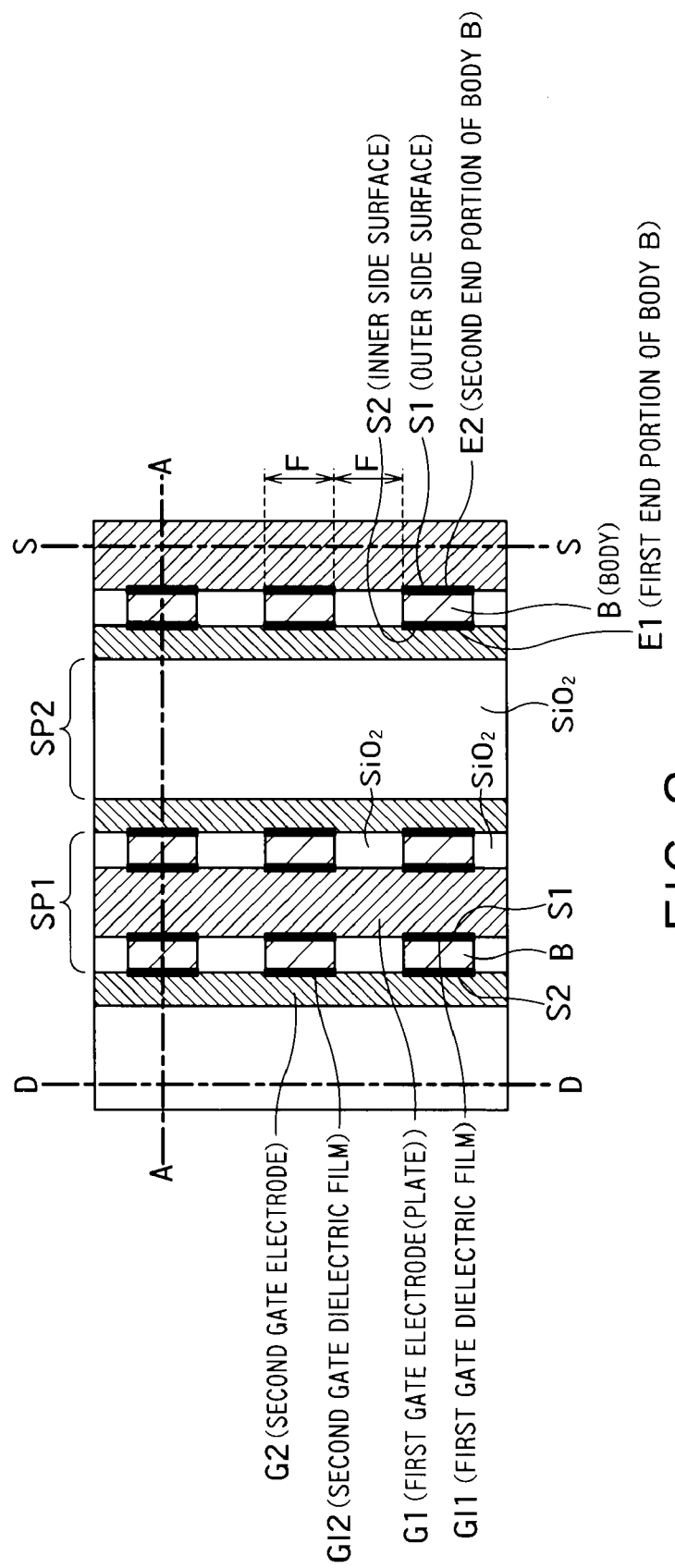
FIG. 2 is a plan view showing a configuration of the bodies and the gates of the FBC memory according to the first embodiment.

FIG. 2 is a plan view showing a configuration of the bodies and the gates of the FBC memory according to the first embodiment. A first gate electrode (plate) G1 is provided to extend to a row direction below the source line SL. The first gate electrode G1 is provided via a first gate dielectric film GI1 on a first side surface S1 facing a column direction of a body B region. A second gate electrode G2 is provided via a second gate dielectric film GI2 on a second side surface S2 of the body B region at the opposite side of the first side surface S1. The body B region provided between the first gate electrode G1 and the second gate electrode G2 is extended to a direction perpendicular to the drawing.

Figure 3:
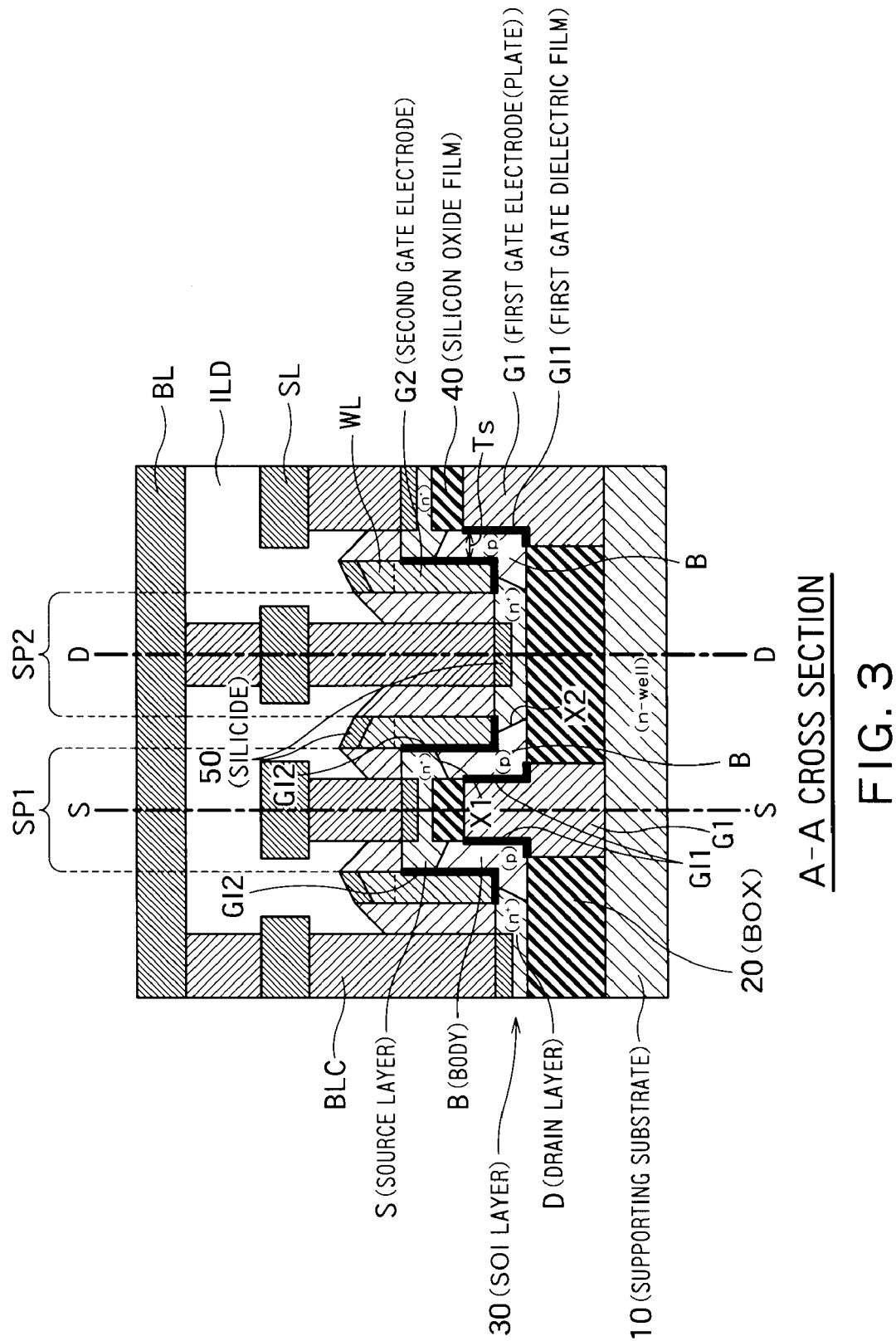
FIG. 3 is an A-A cross section (the bit line) of FIG. 2.
Figure 4:
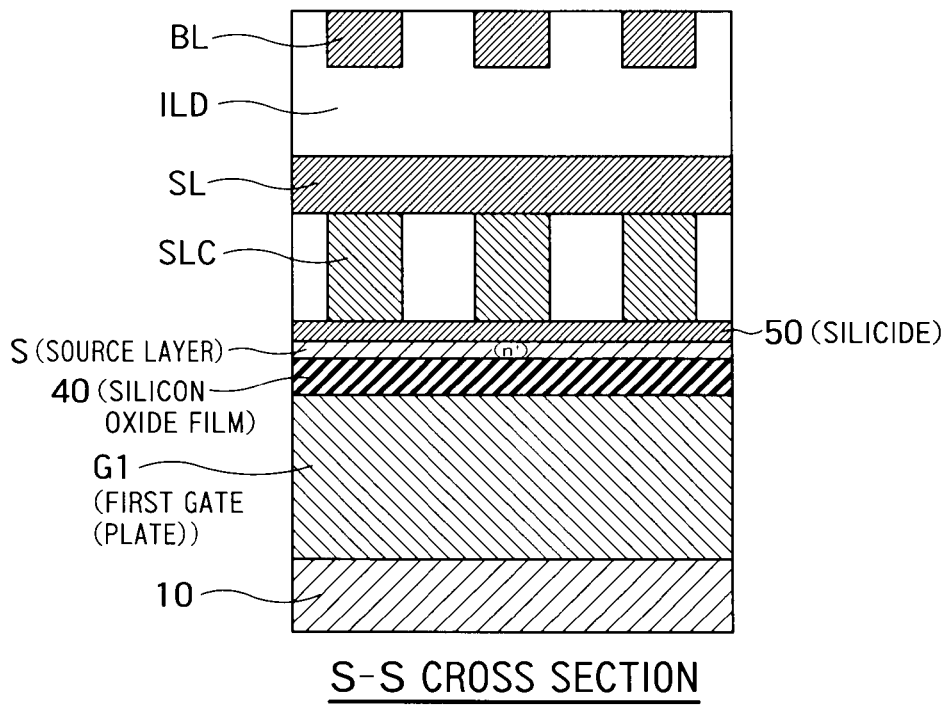
FIG. 4 is an S-S cross section of FIG. 2 or FIG. 3.
Figure 5:
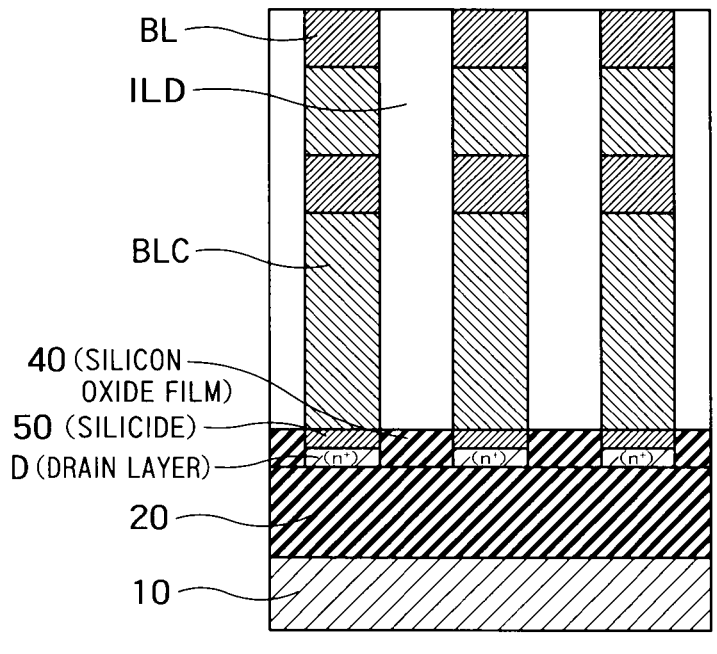
FIG. 5 is a D-D cross section of FIG. 2 or FIG. 3.

FIG. 3 is an A-A cross section (the bit line) of FIG. 2. FIG. 4 is an S-S cross section of FIG. 2 or FIG. 3. FIG. 5 is a D-D cross section of FIG. 2 or FIG. 3. The FBC according to the first embodiment is formed on an SOI substrate including a supporting substrate (hereinafter, simply "substrate") 10, an buried insulation film (a BOX layer) 20 provided on the supporting substrate 10, and an SOI layer 30 provided on the BOX layer 20.

The SOI layer 30 is formed in a U-shape on the surface of the substrate 10 in the cross-sectional view shown in FIG. 3. It can be said that the SOI layer 30 is continuously formed in an uneven shape in up and down directions on the surface of the substrate 10 in the cross-sectional view shown in FIG. 3. A source layer S as a first diffusion layer is provided on an upper part of the SOI layer 30. That is, the source layer S is provided on the U part. It can be said that the source layer S is provided on an upper part of a convex part of the SOI layer 30 stretched upward to the surface of the substrate 10. Drain layers D as second diffusion layers are provided on a lower part of the SOI layer 30 recessed toward the surface of the substrate 10. That is, each drain layer D is provided at a bottom of the U part. It can be also said that the drain layer D is provided at a bottom of a concave part of the SOI layer 30.

As shown in FIG. 4, the source layer S is extended to a row direction on a silicon oxide film 40, and is common to the source line contacts SLC adjacent in a row direction. As shown in FIG. 5, the drain layers D are isolated by each bit line contact BLC in the cross section in a row direction.

As shown in FIG. 3, the bodies B are formed in an intermediate portion of the SOI layer 30 between the source layer S and the drain layer D. X1 is a junction between the body and the source. X2 is a junction between the body and the drain. The first gate dielectric film GI1 is provided on the outer side surface S1 (a side surface to the outside) of the U part of the SOI layer 30. The second gate dielectric film GI2 is provided on the inner side surface S2 (a side surface to the inside) of the U part of the SOI layer 30. The first and second gate dielectric films GI1 and GI2 are provided to cover two side surfaces of the bodies B, and upper surfaces and bottom surfaces of the bodies B. Further, as shown in FIG. 2, a silicon oxide film faces the side surfaces of the bodies B in a row direction. Therefore, the bodies are in an electrically floating state, and can accumulate or discharge an electric charge to store data. One U-shaped semiconductor layer includes two bodies B adjacent in a column direction. The two bodies B are isolated by the drain layer D provided at a lower part of the U-shaped semiconductor layer.

The first gate electrode (plate) G1 is provided via the gate dielectric film GI1 on the outer surface of the U part of the SOI layer 30. The first gate electrode G1 is provided corresponding to each outer surface of the U part of the SOI layer 30, and is shared by the two bodies B positioned at both sides of the first gate electrode G1, in the cross-sectional view shown in FIG. 3. As shown in FIG. 2, the first gate electrode G1 is extended to a row direction (in parallel with the second gate electrode G2). Therefore, the first gate electrode G1 is shared by plural bodies B arranged in a row direction, as shown in FIG. 2. The first gate electrode G1 is connected to an N-type well of the substrate 10 piercing through the BOX layer 20. The N-type well is applied with a voltage at the outside of a cell array.

The first gate electrode G1 can be selectively driven by insulating the first gate electrode G1 from the substrate 10. In this case, the first gate electrode G1 and the substrate 10 can be inversely conductive semiconductors. Alternatively, the BOX layer 20 is left between the first gate electrode G1 and the substrate 10.

The second gate electrode G2 is provided via the second gate dielectric film GI2 on the inner side surface of the SOI layer 30. The second gate electrode G2 is provided corresponding to each inner side surface of the U part of the SOI layer 30. That is, the second gate electrode G2 is provided corresponding to each body B at the cross-sectional view shown in FIG. 3. The second gate electrode G2 is extended to a row direction. Therefore, the second gate electrode G2 is shared by plural bodies B arranged in a row direction as shown in FIG. 2.

The first gate electrode G1 is provided in each first space SP1 between two second gate electrodes G2. The first gate electrode G1 and the second gate electrode G2 are electrically isolated from each other.

The source layer S and the drain layer D are isolated from each other in a direction perpendicular to the surface of the substrate 10. The source layer S and the drain layer D are N-type diffusion layers, for example.

The source line SL is electrically connected to the source layer S via the source line contact SLC and a silicide 50. The bit line BL is electrically connected to the drain layer D via the bit line contact BLC and the silicide 50. Because a height of the source layer S is different from a height of the drain layer D, heights of contact positions of the source line contact SLC and the bit line contact BLC are different, respectively. In this example, the heights are based on the surface of the substrate 10.

A thickness Ts (hereinafter, also "width Ts") of the SOI layer 30 shown in FIG. 2 and FIG. 3 is smaller than F (0.25 F, for example). Ts is a width in a column direction of a body portion sandwiched between the first gate electrode G1 and the second gate electrode G2. The first gate electrode G1 and the second gate electrode G2 are formed on mutually opposite side surfaces of the body B. The FBC in the fully depleted operation has an increased difference of threshold voltages at a reading operation, when a thickness of the body B becomes smaller. The thickness Ts of the SOI layer 30 is not determined by lithography, and is determined by a film thickness of a spacer. Therefore, a high-precision lithography process is not necessary to process the SOI layer 30 to have the thickness Ts.

In the fully depleted operation, a positive voltage is applied to the gate electrode G at a data reading operation to form a channel (an inverted layer) on the surface of the body B, and the body B is fully depleted. The fully depleted operation is performed when impurity concentration of the body B is low. The fully depleted operation has advantages in that a variation of a threshold voltage attributable to a variation of the number and positions of impurities is small and that a junction leak current is small. To hold holes on the surface of the body B at a plate side, a negative voltage is applied to the plate. On the other hand, in a partially depleted operation, when a positive voltage is applied to the gate electrode G at a data reading operation to form a channel, the body is partially depleted. When the impurity concentration of the body B is increased, a neutral region in which holes can be accumulated remains in the body B in operation. Because the holes are held in the neutral region, a negative voltage applied to the plate can be small in the partially depleted operation.

In the first embodiment, the source layer S is formed on the upper part of the U part of the SOI layer 30, and the drain layer D is formed on the lower part of the U part of the SOI layer 30. That is, the source layer S and the drain layer D are isolated from each other in a direction perpendicular to the surface of the substrate 10. With this arrangement, even when a cell size is decreased, a distance between the source layer S and the drain layer D is maintained. Therefore, a reduction of a signal amount following a reduction of a gate length can be prevented.

A current between the source and the drain flows in a vertical direction. The current between the source and the drain flows on the side surface S2 of the body B at the second gate electrode G2 side. The side surface S2 faces a column direction. When a method of writing the data "1" using a GIDL (Gate Induced Drain Leakage) current is employed, the drain layer D (or the source layer S) and the second gate electrode G2 need to be overlapped with each other via the second gate dielectric film GI2. Therefore, in the memory cells using a conventional planar-type FET, an effective gate length (Leff) due to a reduction of the memory size becomes too small, and a signal amount is degraded extremely. In the FBC according to the first embodiment, the effective gate length (Leff) is maintained even when the cell size is downscaled. Therefore, degradation of the signal amount can be suppressed even when the cell size is downscaled while employing the GIDL writing.

According to a conventional vertical FBC, the source line contact or the bit line contact is formed on the N-type diffusion layer formed just above the body. In this case, when a width (thickness) of the body in a column direction becomes small to achieve the fully depleted operation, a contact area also becomes small following this reduced width. This brings about an increase of contact resistance. When a contact having a larger diameter than a width of the body is formed, the contact is short-circuited to the gate electrode.

On the other hand, in the first embodiment, while the body B is formed in a vertical type to extend to a direction substantially perpendicular to the surface of the substrate 10, the source layer S is extended from an end portion of a U-shaped semiconductor layer toward a column direction, and has a plane portion (a first pad portion) of a semiconductor layer substantially parallel with the surface of the substrate 10. The end portion of the U-shaped semiconductor layer is positioned on the outer side surface S1 of the U-shaped semiconductor facing a column direction (a second end portion E2 of the body B) as shown in FIG. 2. A bottom of the U-shaped semiconductor layer functions as a second pad portion. The source line contact SLC and the bit line contact BLC are in contact with the plane portion (the first pad portion and the second pad portion). Accordingly, the contacts BLC and SLC do not need to be formed just above the body region B. The above problem does not occur even when the source line contact SLC and the bit line contact BLC having a larger diameter than the width Ts of the body B are formed. That is, even when the width Ts of the body B is made smaller than contact diameters of the source line contact SLC and the bit line contact BLC, a short-circuiting does not occur between the contact and the gate electrode. Because the source line contact SLC and the bit line contact BLC having a larger diameter than the width Ts of the body B can be formed, a contact resistance becomes small.

In the first embodiment, the SOI layer 30 is extended continuously to a column direction, and N-type semiconductors and P-type semiconductors are alternately arranged in the order of an N-type source layer S, a P-type body B, an N-type drain layer D, a P-type body B, an N-type source layer S, and onwards. Each memory cell includes the body B, the source layer S, and the drain layer D, and is controlled by the first and second gate electrodes G1 and G2. Plural memory cells adjacent in a column direction alternately share the source line contacts SLC and the bit line contacts BLC. Each source layer S and each source line contact SLC are shared by two adjacent memory cells to sandwich the source layer S. Each drain layer D and each bit line contact BLC are shared by two adjacent memory cells to sandwich the drain layer D. Therefore, the cell size becomes smaller.

The first gate electrode G1 is provided via the silicon oxide film 40 below the source layer S. When viewed from above the surface of the substrate 10, the first gate electrode (plate) G1 and the source layer S are overlapped with each other in substantially the same region. Further, the first gate electrode G1 is shared by two memory cells adjacent in a column direction. Accordingly, the cell size can be made much smaller.

The first gate electrode G1 faces not only the side surface of the body B but also a part of the bottom surface of the body B as shown in FIG. 3. Because an area in which the first gate electrode G1 faces the body B becomes large, the number of holes within the body in the state of holding the data "1" increases. Accordingly, a variation of the number of holes between the "1" cells becomes relatively small, and a variation of the current reading the data "1" becomes small.

The first gate electrode G1 is not overlapped with the junction X1 between the body and the source and the junction X2 between the body and the drain. A hole accumulation layer is formed within the body B by applying a relatively large negative voltage (−2.1V, for example) to the first gate electrode G1. As explained above, the first gate electrode G1 is not overlapped with the junctions X1 and X2 even when a large negative voltage is applied to the first gate electrode G1. Therefore, a leak current of the first gate electrode G1 in the junctions X1 and X2 is small. Consequently, the memory cells according to the first embodiment have a long data-retention time.

The silicide 50 is formed on top surfaces of the source layer S, the drain layer D, and the second gate electrode G2, respectively. The source layer S and the drain layer D are connected to the source line SL and the bit line BL made of a metal material via contact plugs SLC and BLC made of a metal material. As a result, parasitic resistance of the source and the drain becomes small. A drain current is used to determine data in the FBC memory. Therefore, when the parasitic resistance of the source and the drain is decreased, a drain current difference (signal difference (signal amount)) between the data "0" and the data "1" becomes large, and the number of fail bits becomes small. When a silicide and a metal wiring are used, a variation of the parasitic resistance becomes small, and the number of fail bits becomes small. At the time of writing the data "0", a pn junction of the memory cell is forward biased, thereby extracting holes. Because the parasitic resistance is small, the data "0" is written faster as the voltage applied to the pn junction is increased.

Figure 6:
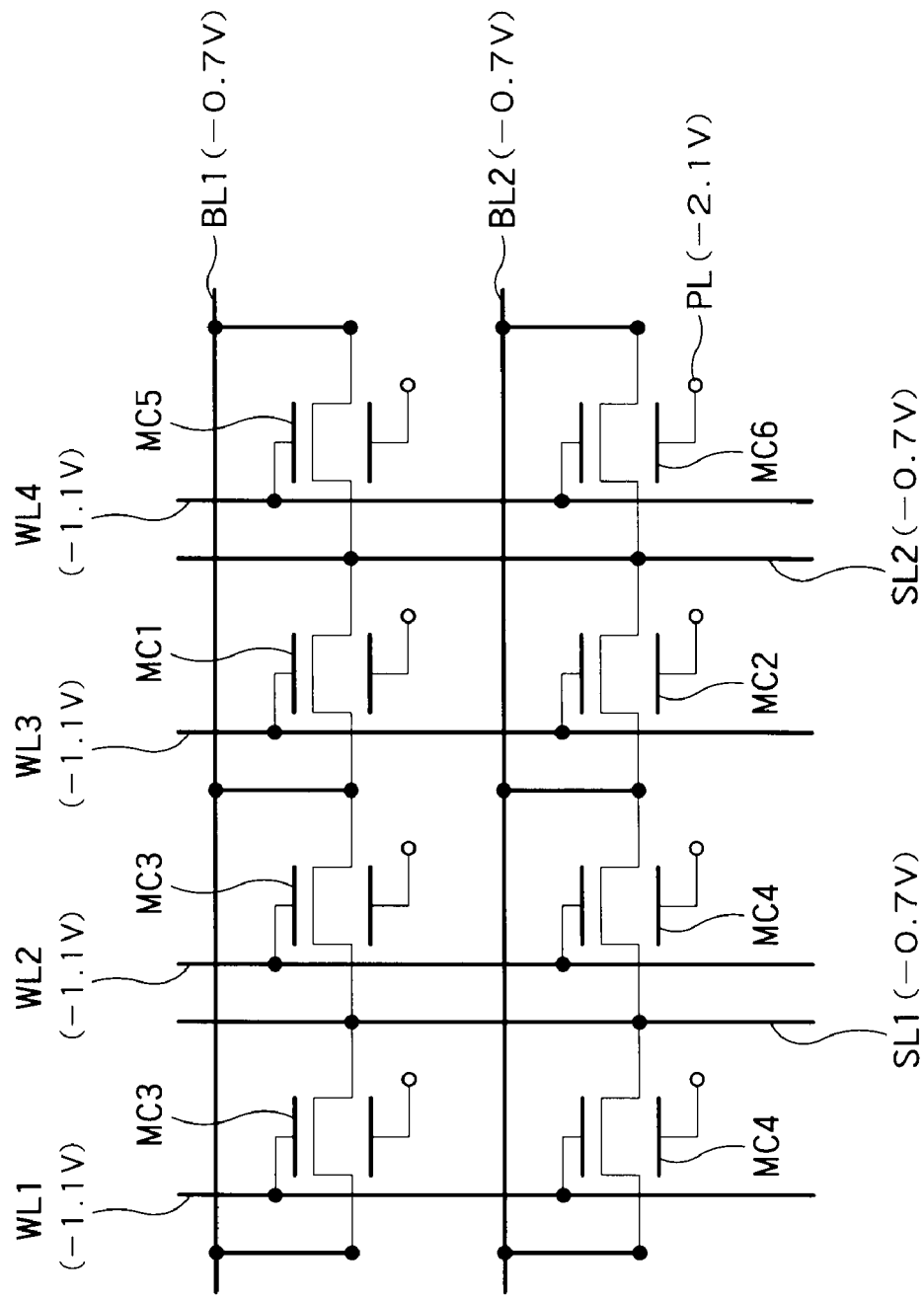
FIG. 6 shows a state of holding the FBC memory according to the first embodiment.
Figure 7:
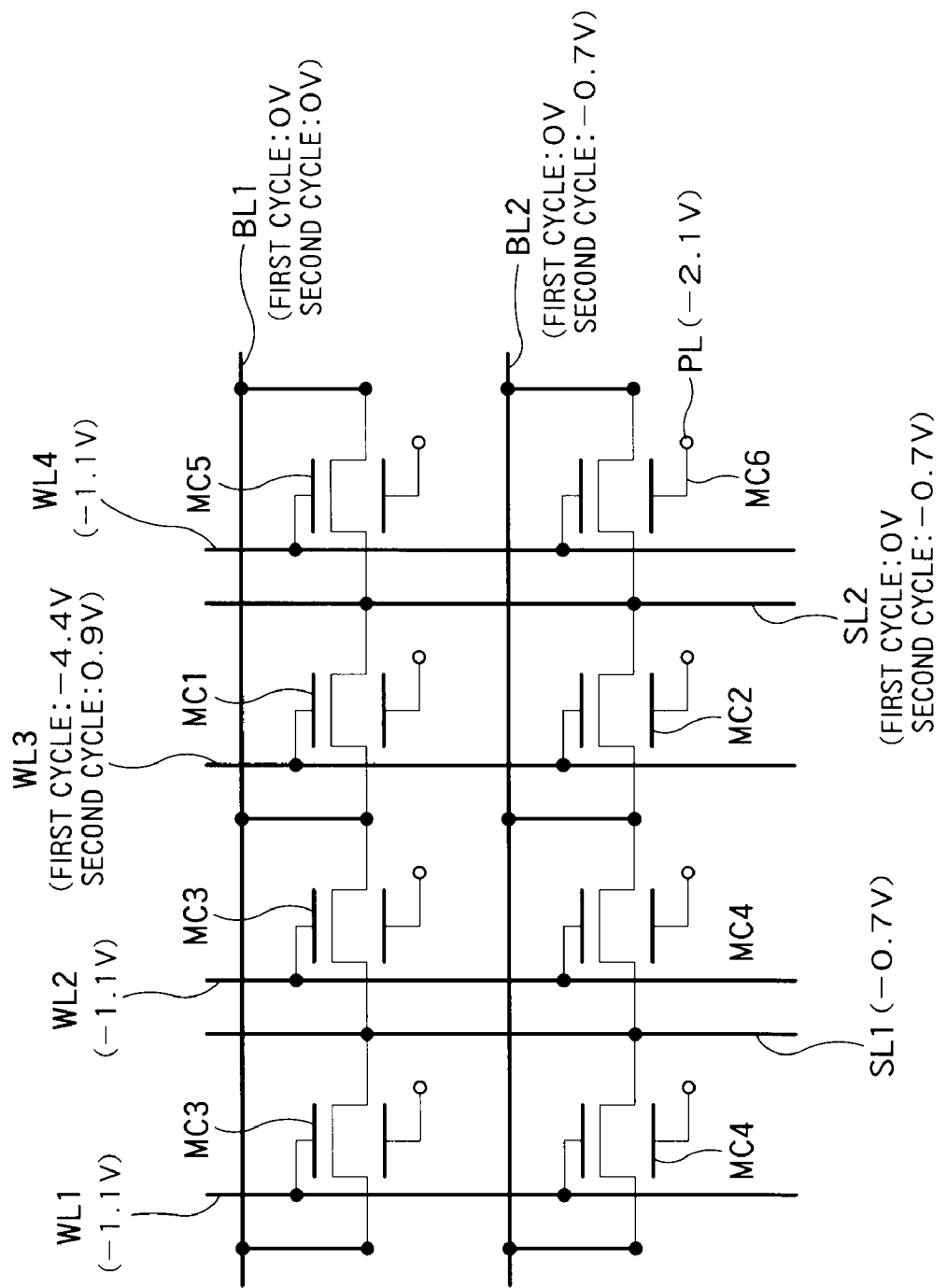
FIG. 7 shows a write operation of the FBC memory according to the first embodiment.

FIG. 6 shows a state of holding the FBC memory according to the first embodiment. FIG. 6 and FIG. 7 show a cell array of 4×2. However, the number of memory cells within the cell array is not limited. A voltage of −1.1 V is applied to word lines (second gate electrodes) WL1 to WL4. A voltage of −2.1 V is applied to a plate (a first gate electrode) PL. A voltage of −0.7 V is applied to source lines SL1 and SL2. A voltage of −0.7 V is applied to bit lines BL1 and BL2.

FIG. 7 shows a write operation of the FBC memory according to the first embodiment. The write operation includes a first cycle of writing the data "1", and a second cycle of writing the data "0". In the first embodiment, as one example, the data "0" is written into the memory cell MC1, and the data "1" is written into the memory cell MC2.

First, in the first cycle, the data "1" is written into all the memory cells MC1 and MC2 connected to the selected word line WL3, by GIDL. The word line WL3 and the source line SL2 corresponding to the word line WL3 are selected. A voltage of −4.4 V is applied to the selected word line WL3, a voltage of 0 V is applied to the selected source line SL2, and a voltage of 0 V is applied to all the bit lines BL1 and BL2. Accordingly, a GIDL current flows through the source layer S and the drain layer D of the memory cell MC1 and MC2, and holes are accumulated in the body B.

Next, in the second cycle, the data "0" is selectively written. A voltage of 0.9 V is applied to the selected word line WL3, −0.7 V is applied to the selected source line SL2, 0 V is applied to the bit line BL1, and −0.7 V is applied to the bit line BL2. As a result, a pn junction between the source and the body of the memory cell MC1 connected to the bit line BL1 is forward biased. Accordingly, holes are extracted from the body B, and the data "0" is written into the memory cell MC1. On the other hand, the memory cell MC2 connected to the bit line BL2 maintains the state of the data "1".

Although not shown, a sense amplifier is provided for each bit line. Prior to a data write operation or a refresh operation, the sense amplifier reads data of each memory cell, and temporarily stores this data into a latch circuit. Thereafter, the sense amplifier writes the data "0" into the memory cells in the second cycle based on the data temporarily held in the latch circuit.

In the above operation, a source voltage and a drain voltage (−0.7 V) in the data holding state are lower than a voltage (0 V) of the selected source line SL2 and a drain voltage (0 V) in the first cycle. Accordingly, the source voltage and the drain voltage in the data holding state become close to a plate voltage, and consequently, an electric field applied to a pn junction between the body and the source and between the body and the drain becomes small. As a result, the amount of holes accumulated in the "0" cells in the data holding state decreases, and the data retention time becomes long.

On the other hand, in the first cycle of writing the data "1", a difference between a plate voltage (−2.1 V) and a voltage (0 V) of the selected source line SL2 and a difference between the plate voltage and the drain voltage (0 V) are increased. Accordingly, holes are easily accumulated on the surface of the body B at which the body B faces the plate (the first gate electrode G1), in the memory cells MC1 and MC2. A voltage of the unselected source line SL1 is the same as a source line potential (−0.7 V) in the holding state.

In the read operation (not shown), a selected word line and a selected source line corresponding to this selected word line are activated. A potential of an unselected source line is the same as a source line potential in the holding state. As explained above, in the first embodiment, because only the selected source line for performing the data read operation and the data write operation can be selectively driven, the data retention time becomes long and a signal difference at the data reading time becomes large.

According to the conventional vertical transistor, because a source is common to all memory cells, the source cannot be selectively driven. Further, because parasitic resistance of the source is high, the source cannot be easily selectively driven.

In the FBC memory according to the first embodiment, the source layer S is shared by only adjacent memory cells, and is extended to a direction of word line, as shown in FIG. 2 and FIG. 3. Further, the source layer S is in contact with the source line contact SLC in a sufficiently large area, and is connected to the source line SL made of a metal material. Accordingly, because parasitic resistance of the source becomes small, the first embodiment is suitable to selectively drive the source.

Because the source layer S is formed on a plane portion of the semiconductor layer extended from the end portion (the outer side surface S1) of the U part along a column direction, the silicide 50 having a large width can be formed. As shown in FIG. 3, a width of a contact part between the source layer S and the silicide 50 is F in a cross section along a column direction, and is larger than the width Ts of the body B. Because specific resistance (resistance per unit area) between the silicide 50 and the semiconductor layer is relatively large, increasing a contact area between the silicide 50 and the semiconductor layer greatly contributes to decrease the parasitic resistance. As shown in FIG. 4, because the source layer S is extended along a row direction, a contact area between the source layer S and the silicide 50 is large. Accordingly, parasitic resistance of the source can be decreased. When the resistance of the source layer S is sufficiently small, either the source line SL or the silicide 50 can be omitted. Of course, when the source line SL is omitted, the source line contact SLC is not necessary either.

The drain layer D is in contact with the bit line contact BLC in sufficiently a large area, and is connected to the bit line BL made of a metal material. Accordingly, parasitic resistance of the drain also becomes small. Because the drain layer D is also formed on a plane portion of the semiconductor layer, the silicide 50 having a large width can be formed.

As explained above, according to the first embodiment, a gate length can be secured even when a cell size is downscaled, and parasitic resistance of the source and the drain can be decreased. Further, the source line SL can be selectively driven.

A method of manufacturing the FBC memory according to the first embodiment is explained with reference to FIG. 8 to FIG. 15. First, an SOI substrate including the BOX layer 20 having a thickness 150 nm, and the SOI layer 30 having a thickness 300 nm is prepared. A mask material (not shown) made of a silicon oxide film or a silicon nitride film, for example is deposited on the SOI layer 30. The mask material on an element isolation region is removed using lithography and RIE (Reactive Ion Etching). Further, the SOI layer 30 on the element isolation region is removed by anisotropic etching using the mask material as a mask. A silicon oxide film based on HDP (High Density Plasma) is embedded into the removed element isolation region, thereby forming an STI (Shallow Trench Isolation), as shown in FIG. 8A (cross section A-A) and FIG. 8B (cross section S-S).

Next, as shown in FIG. 9A (cross section A-A), a mask material 31 made of a silicon nitride film is deposited. The mask material 31 in the region of the first gate electrode G1 is removed using lithography and RIE. As shown in FIGS. 9A to 9C, the SOI layer 30 and the BOX layer 20 are removed by anisotropic etching using the mask material 31 as a mask. The BOX layer 20 is etched back in a lateral direction by isotropic etching.

Next, the side surface (the outer side surface S1) of the SOI layer 30 is thermally oxidized, thereby forming the first gate dielectric film GI1 on the outer side surface S1, as shown in FIG. 10A (cross section A-A) and FIG. 10B (cross section S-S). An N-type polysilicon 33 having a film thickness not filling a trench formed by etching is deposited, and the N-type polysilicon 33 is anisotropically etched. As a result, the first gate dielectric film GI1 formed on the surface of the supporting substrate 10 is exposed. This first gate dielectric film GI1 is wet etched, an N-type polysilicon is deposited again, and this is etched back. The silicon oxide film 40 is deposited on the N-type polysilicon 33 by HDP, and it is etched back. Further, a monocrystalline silicon layer 109 is formed on the silicon oxide film 40.

An oxide film mask 43 is embedded into a trench on the first gate electrode G1. As shown in FIG. 11A and FIG. 11B, the silicon nitride film 31 as a mask material is removed, and an oxide film mask 45 is formed on a side wall of the oxide film mask 43. A thickness of the oxide film mask 45 determines the thickness Ts of the body B (the SOI layer 30).

Next, as shown in FIG. 12, the SOI layer 30 and the silicon oxide film 40 are anisotropically etched using the oxide film masks 43 and 45 as masks.

The second gate dielectric film GI2 is formed on the surface (the inner side surface S2) of the SOI layer 30. Thereafter, as shown in FIG. 13A (cross section A-A), an N-type polysilicon 47 is deposited on the SOI layer 30 and the oxide film masks 43 and 45, and the polysilicon 47 is anisotropically etched. Accordingly, the polysilicon 47 is left on only the side surfaces of the SOI layer 30 and the oxide film mask 45. The polysilicon 47 becomes the second gate electrode G2 and the word line WL. Widths of the second gate electrode G2 and the word line WL are determined by a film thickness of the polysilicon 47. Therefore, the width of the word line WL can be made smaller than F without using a lithography process. FIG. 13B and FIG. 13C are an S-S cross section and a D-D cross section of FIG. 13A, respectively. In general, a thickness of a deposited film of polysilicon and the like can be controlled in high precision. Therefore, in the first embodiment, the word line WL having a width smaller than F can be formed accurately without using a lithography process.

Figure 14:
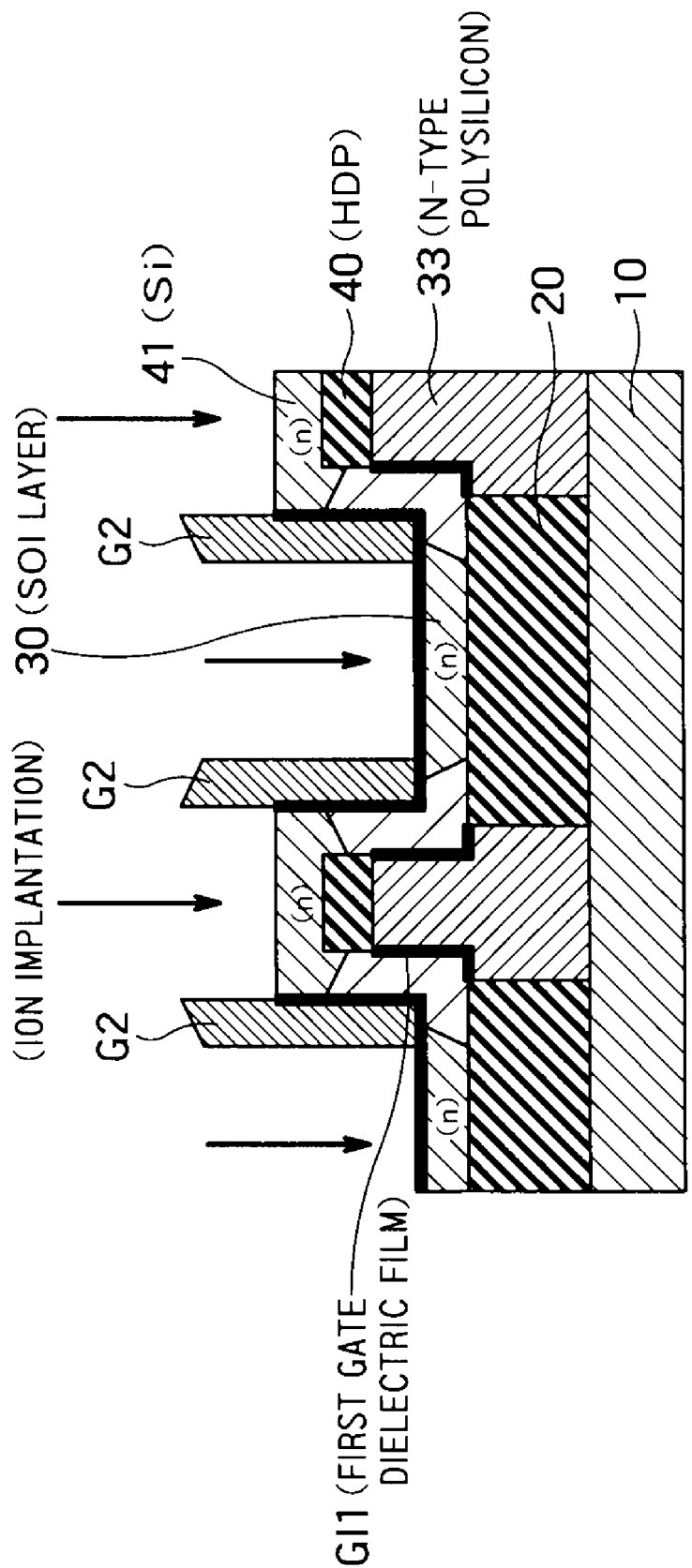

Next, as shown in FIG. 14 (A-A cross section), the oxide film mask 43 and the oxide film mask 45 are removed. To form an extension layer, an N-type impurity is ion-implanted into the SOI layer 30, using the second gate electrode G2 as a mask.

Figure 15:
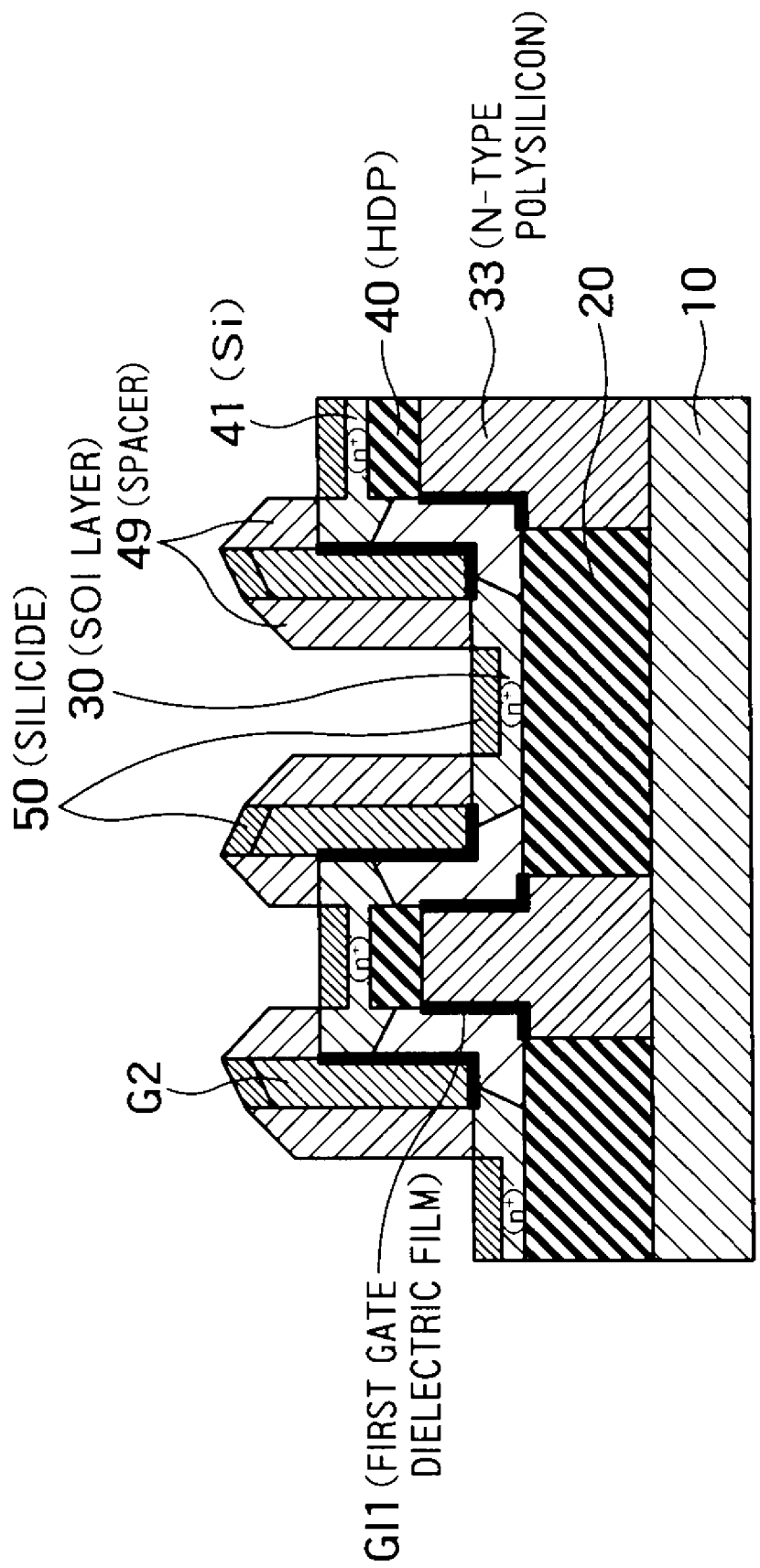

Next, as shown in FIG. 15 (A-A cross section), a spacer 49 made of a silicon nitride film is formed on a side surface of the second gate electrode G2. A high-concentration N-type impurity is ion-implanted into the source layer S and the drain layer D, using the spacer 49 and the second gate electrode G2 as masks. Further, the suicide 50 is formed on the surfaces of the word line WL, the source layer S, and the drain layer D.

Thereafter, an interlayer dielectric film ILD is deposited, the source line contact SLC and the bit line contact BLC are formed, and the source line SL and the bit line BL are formed. As a result, the configurations of the FBC memory shown in FIG. 3 to FIG. 5 are obtained.

Second Embodiment

Figure 16:
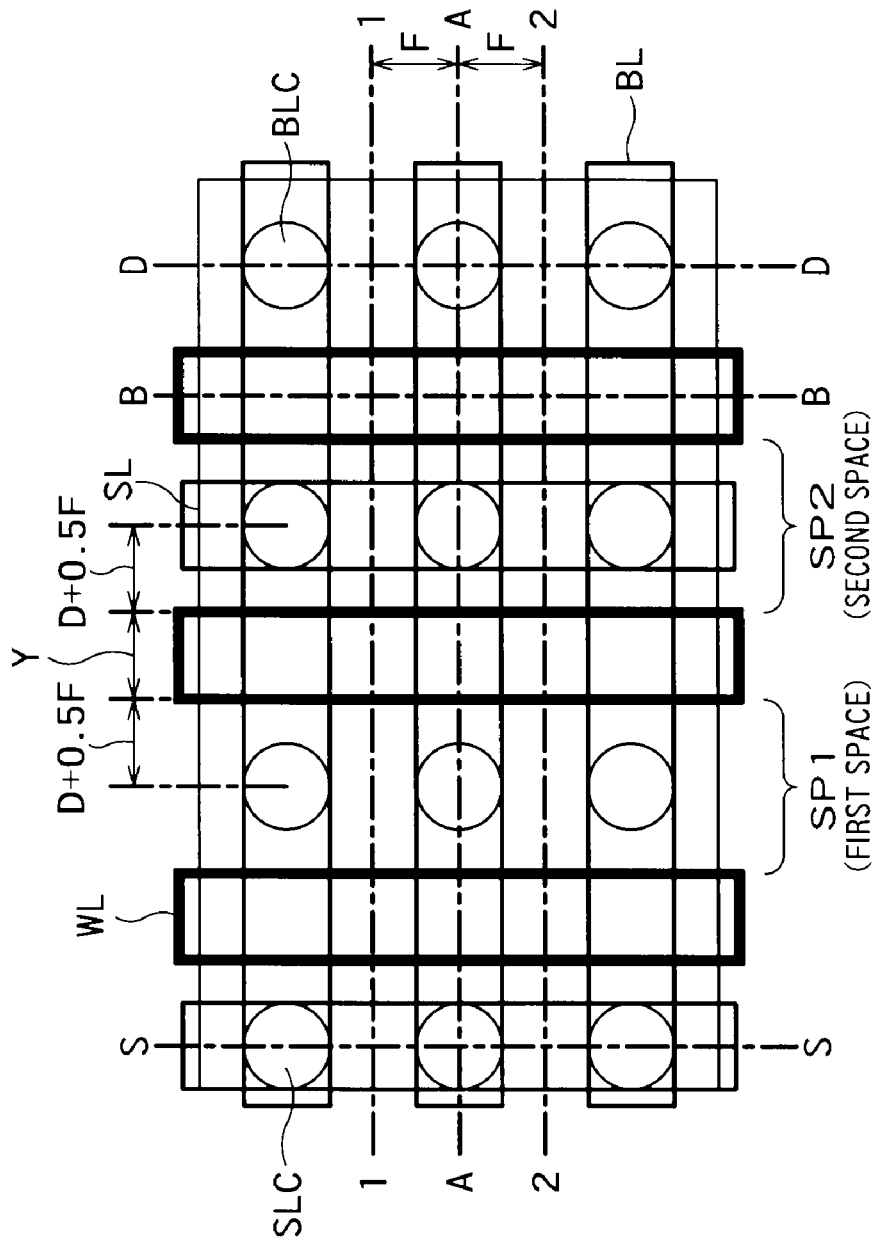
FIG. 16 is a plan view showing a wiring of an FBC memory according to a second embodiment of the present invention.
Figure 17:
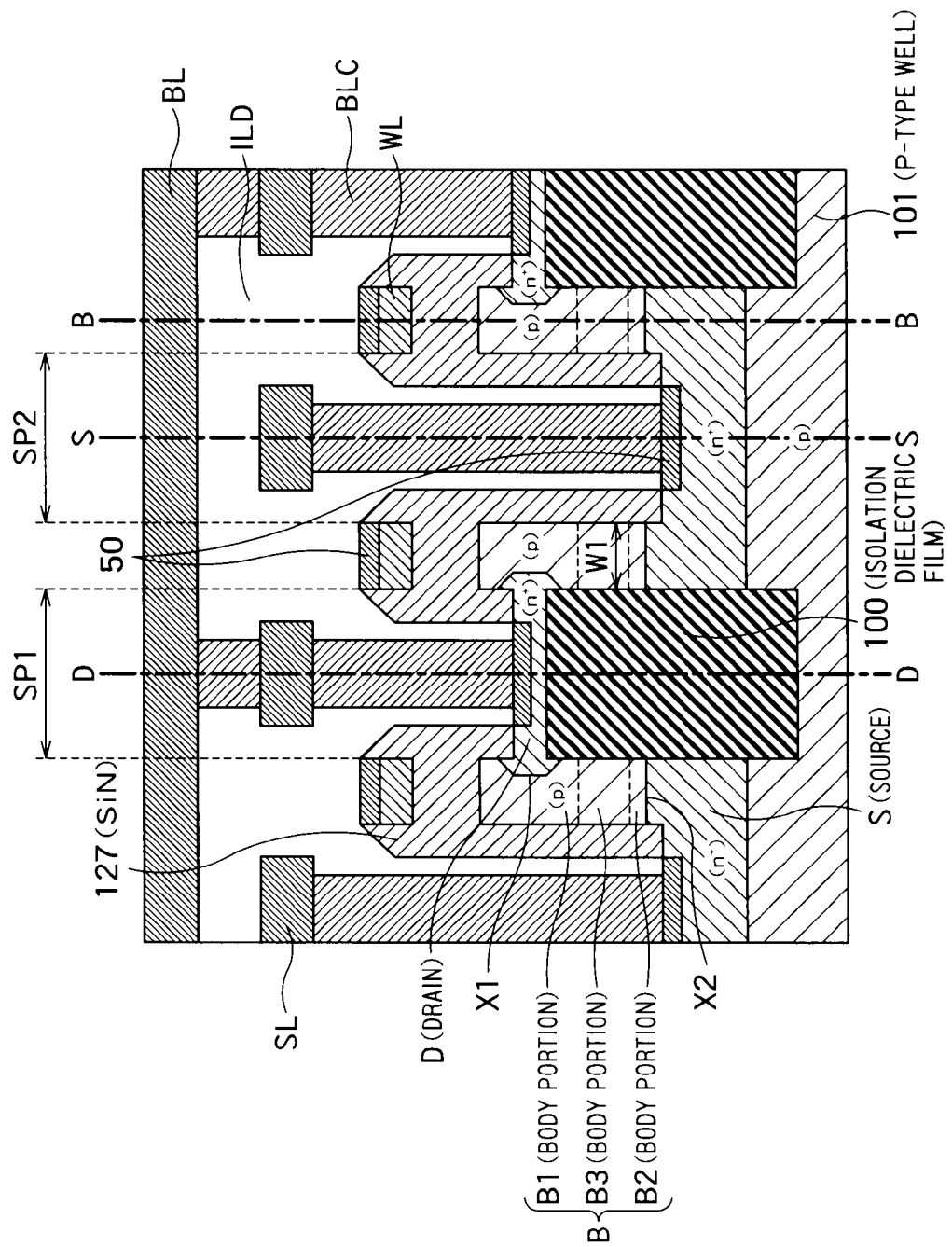
FIG. 17 is an A-A cross section of FIG. 16.
Figure 18:
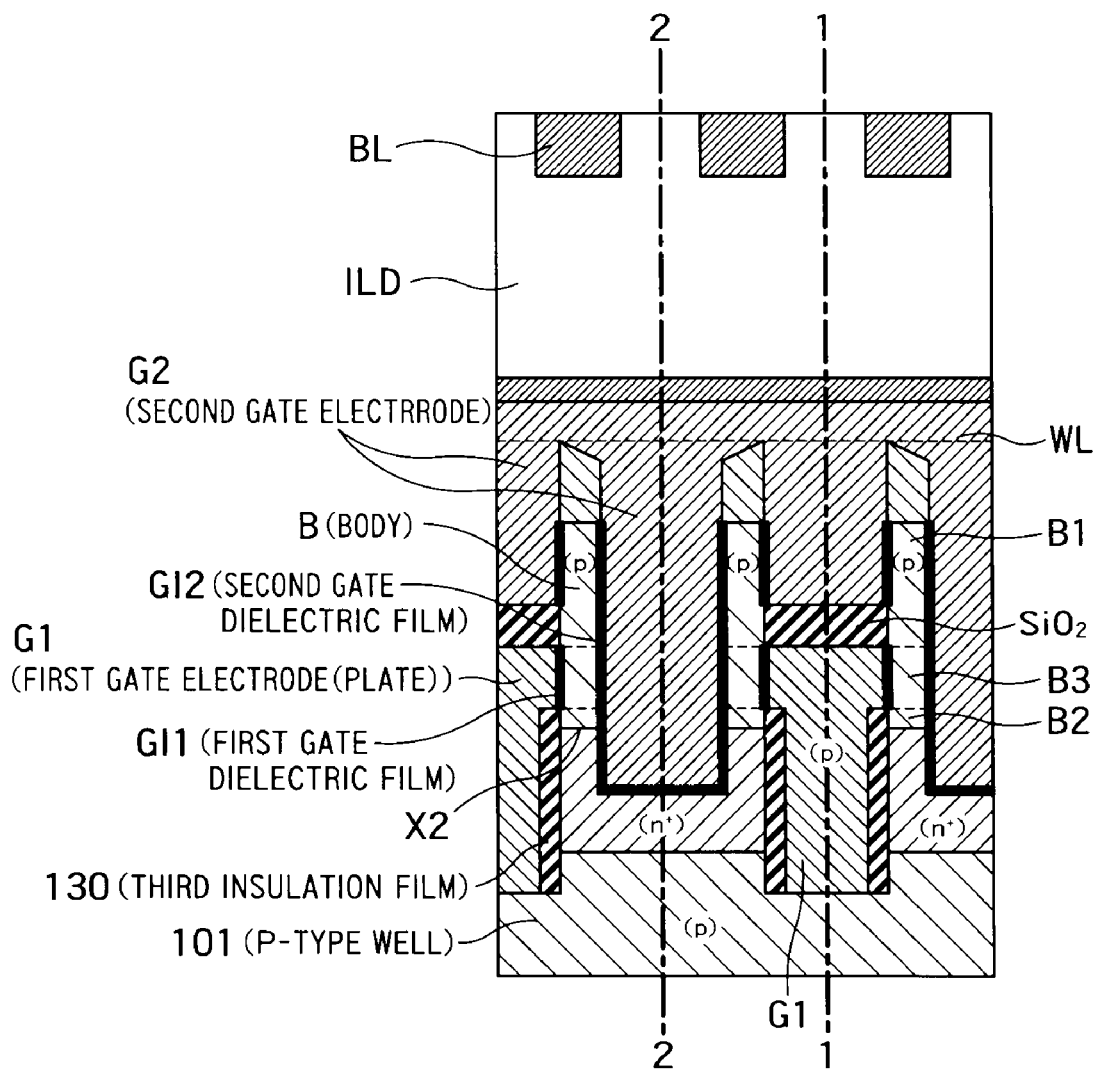
FIG. 18 is a B-B cross section of FIG. 16 and FIG. 17.
Figure 19:
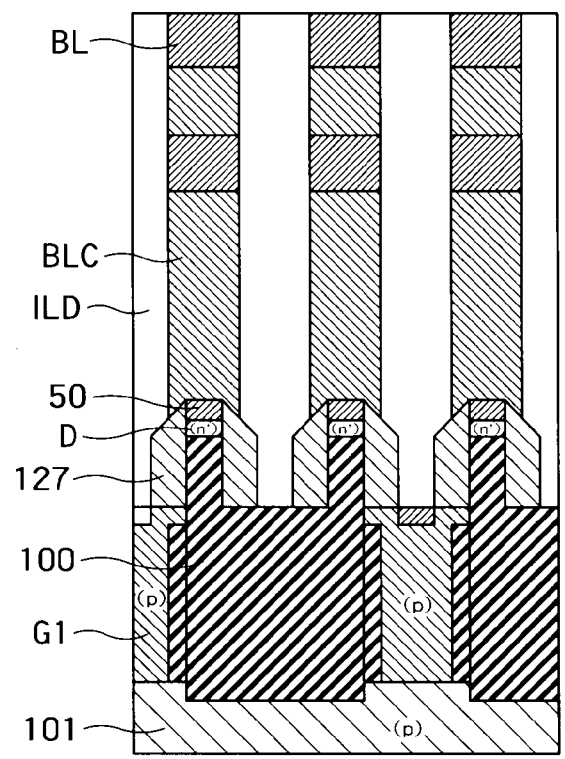
FIG. 19 is a D-D cross section of FIG. 16 and FIG. 17.
Figure 20:
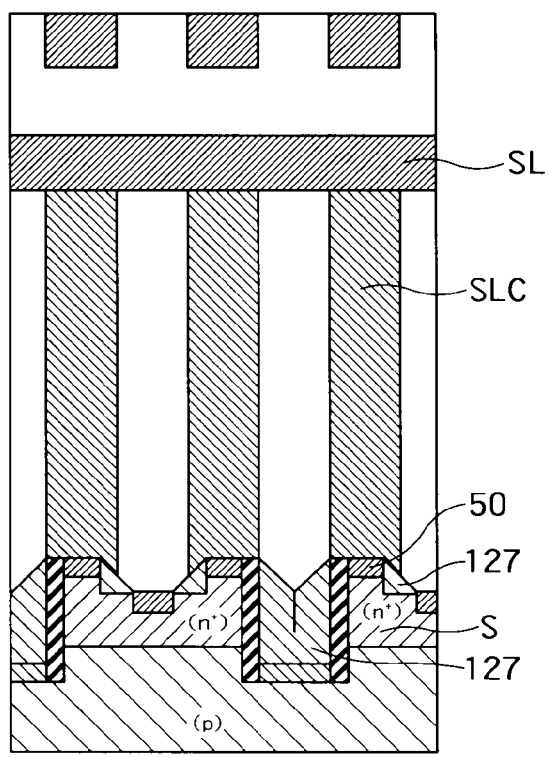
FIG. 20 is an S-S cross section of FIG. 16 and FIG. 17.
Figure 21:
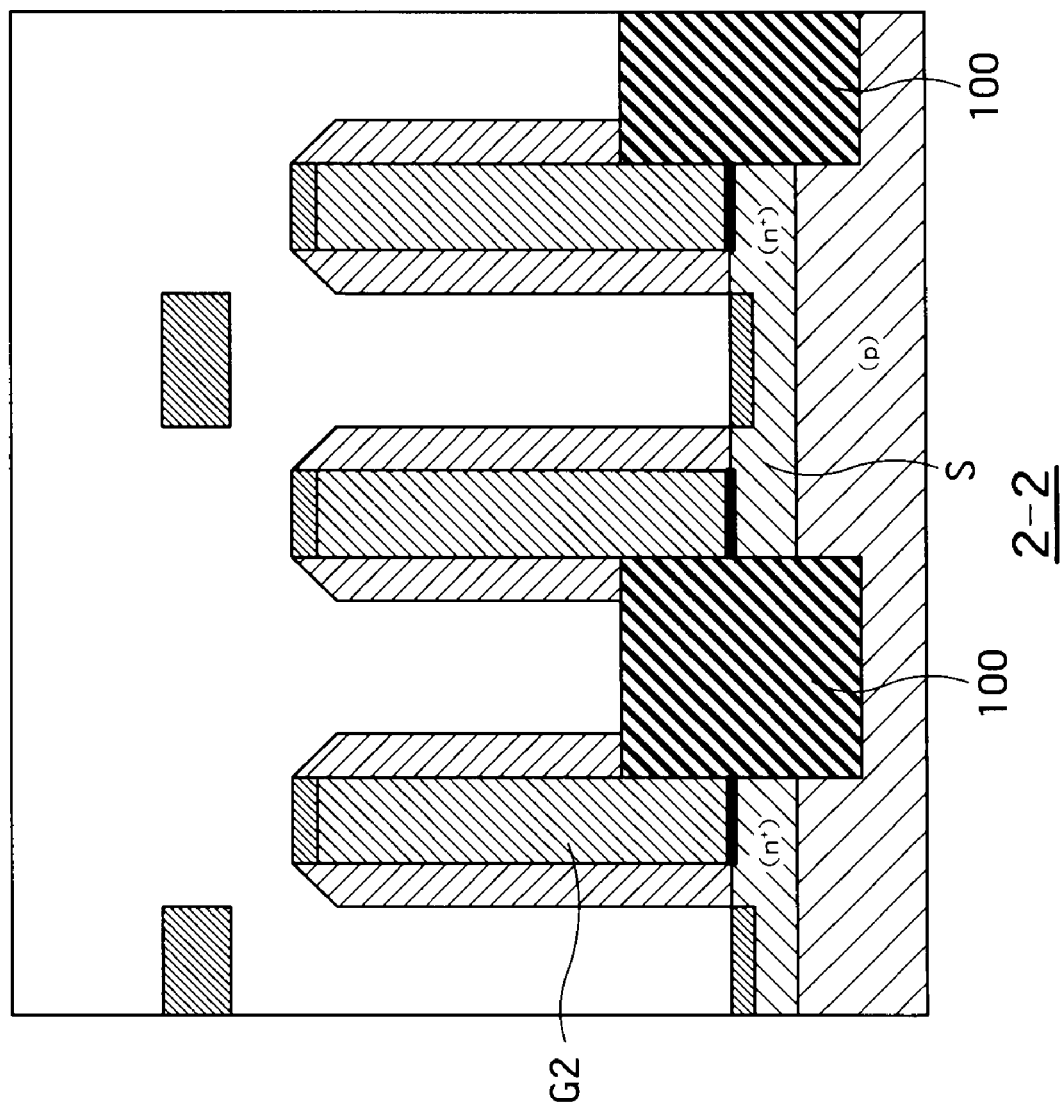
FIG. 21 is a 1-1 cross section of FIG. 16.
Figure 22:
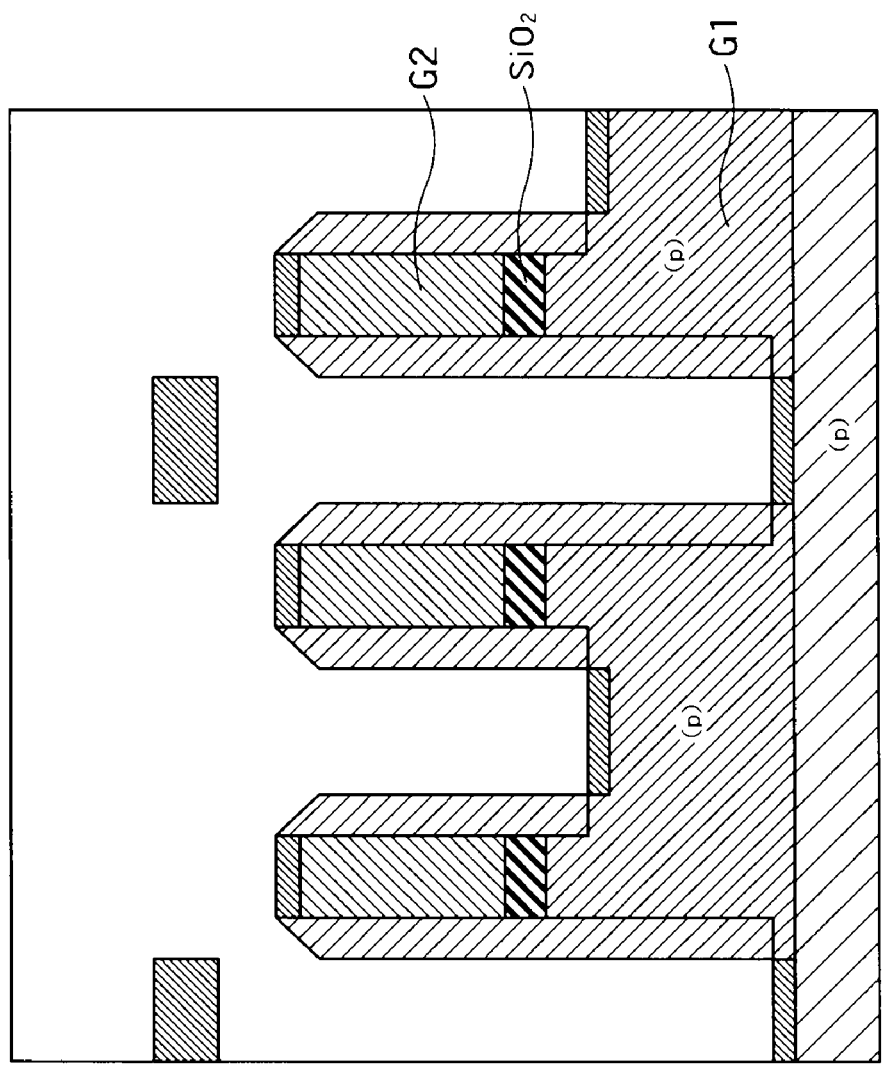
FIG. 22 is a 2-2 cross section of FIG. 16.
Figure 26B:
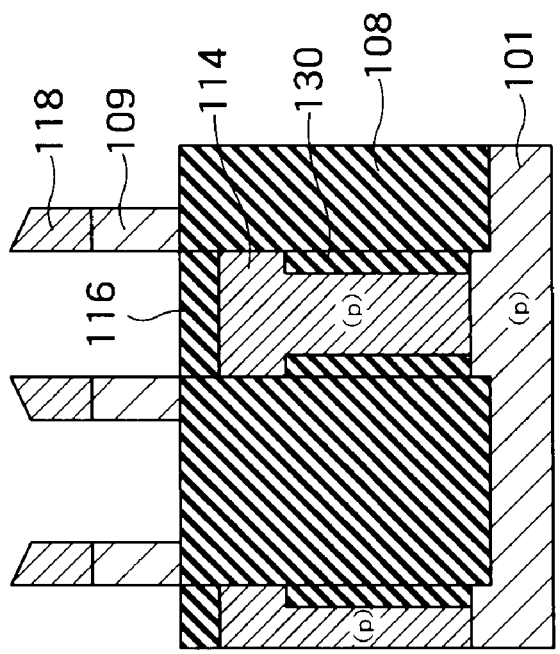
Figure 26A:
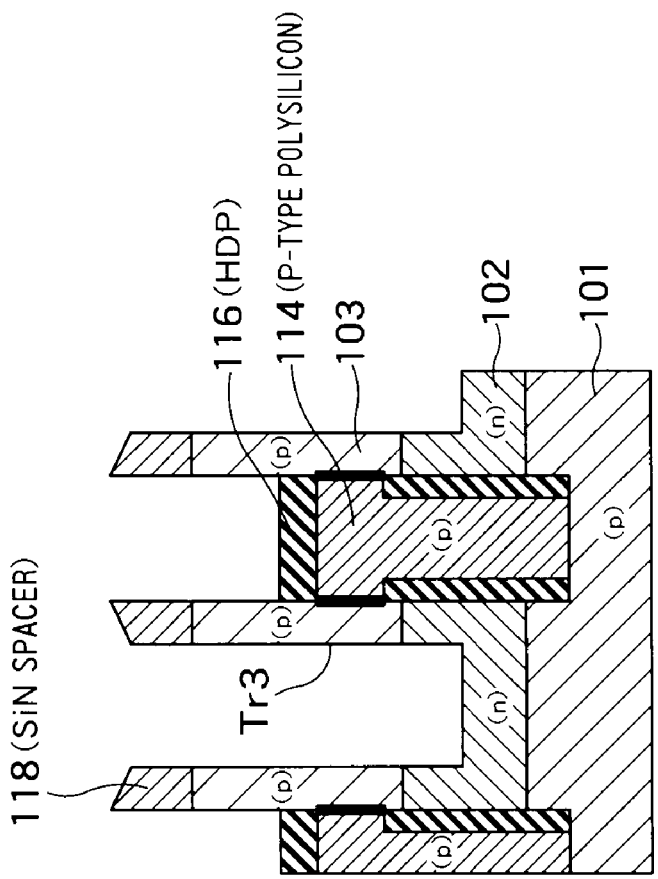

FIG. 16 is a plan view showing a wiring of an FBC memory according to a second embodiment of the present invention. FIG. 17 is an A-A cross section of FIG. 16. FIG. 18 is a B-B cross section of FIG. 16 and FIG. 17. FIG. 19 is a D-D cross section of FIG. 16 and FIG. 17. FIG. 20 is an S-S cross section of FIG. 16 and FIG. 17. FIG. 21 is a 2-2 cross section of FIG. 16. FIG. 22 is a 1-1 cross section of FIG. 16. In the second embodiment, the FBC memory is formed on a bulk substrate. Accordingly, manufacturing cost can be reduced in the second embodiment.

As shown in FIG. 16, the FBC memory according to the second embodiment includes plural bit lines BL extended to a column direction, plural word lines WL extended to a row direction, and plural source lines SL extended to a row direction. As shown in FIG. 17, in a cross section along a column direction, each semiconductor layer including the source layer S, the body B, and the drain layer D is formed in a U-shape on the substrate 10. It can be said that the semiconductor layer is continuously formed in an uneven shape in up and down directions on the surface of the substrate 10.

Each drain layer D as a first diffusion layer is provided at an upper part of the U-shaped semiconductor layer in a cross section along a column direction. Each source layer S as a second diffusion layer is provided at a lower part of the U-shaped semiconductor layer in the cross section along a column direction. Each body B is formed at an intermediate part between the source layer S and the drain layer D, is in an electrically floating state, and accumulates or discharges an electric charge to store data.

As shown in FIG. 18, the first gate dielectric film GI1 is provided on a side surface (a first side surface) facing a row direction of the U-shaped semiconductor layer. The first gate electrode G1 is provided on a first side surface via the first gate dielectric film GI1. The first gate electrode G1 includes a P-type semiconductor connected to a P-type well 101 formed on the substrate 10, and functions as a plate. The second gate dielectric film GI2 is provided on a side surface (a second side surface) facing a row direction of the U-shaped semiconductor layer. The second gate electrode G2 is provided on this second side surface via the second gate dielectric film GI2. The second gate electrode G2 is also provided between adjacent U-shaped semiconductor layers on the cross section in a row direction. The second gate electrode G2 is formed integratedly with the same material as that of the word line WL at an upper part of the second gate electrode G2. With this arrangement, because a gate contact does not need to be formed on the gate electrode like the conventional fin-FBC, a cell size becomes small. The second gate electrode G2 is insulated from the first gate electrode G1. The P-type well 101 is extended to the outside of a cell array, and a voltage is applied to the P-type well at an outside of the cell array. That is, a potential different from that of the second gate electrode G2 can be applied to the first gate electrode G1.

As shown in FIG. 17, in the second embodiment, the P-type well 101 is formed below the source layer S. An isolation dielectric film 100 is formed on a side surface of each source layer S. The source layer S is shared by two adjacent memory cells. On the other hand, the adjacent source layers S are electrically isolated from each other by the P-type well 101 and the isolation dielectric film 100. Accordingly, the source layer S can be selectively driven. A source voltage is applied to the source layer S through the source line SL and the source line contact SLC made of a metal material. Accordingly, parasitic resistance of the source contact becomes small. Plural memory cells adjacent in a column direction alternately share the bit line contacts BL and the source line contacts SLC. As a result, the cell size can be reduced.

The drain layers D are provided on the isolation dielectric films 100. Each drain layer D has a plane portion (a pad portion) extended from an end portion of the U-shaped semiconductor layer along a column direction. The pad portion is shared by two adjacent memory cells. On the other hand, the drain layers D adjacent in a direction of word line are electrically isolated from each other. A bit line voltage is applied to the drain layers D through the bit lines BL and the bit line contacts BLC made of a metal material. Accordingly, parasitic resistance of a bit contact becomes small.

Although the conventional fin-FBC has an advantage of a fully depleted operation, it cannot be downscaled while maintaining a signal amount. In the second embodiment, the source layer S is formed at a lower part of the U-shaped semiconductor layer, and the drain layer D is formed at an upper part of the U-shaped semiconductor layer. That is, the source layer S and the drain layer D are isolated from each other in up and down directions. Therefore, even when the cell size is reduced, a distance between the source layer S and the drain layer D is maintained. Accordingly, a reduction of the signal amount following a reduction of a gate length can be prevented. Each memory cell has the bit line contact BLC and the source line contact SLC made of a metal material and shared by adjacent memory cells in a column direction. Therefore, parasitic resistance of the source and the drain, and cell sizes of the source and the drain are small.

The body B can be divided into body portions B1 to B3. As shown in FIG. 18, the body portion B3 faces the first gate electrode (plate) G1 via the first gate dielectric film GI1. A width W1 of the body portion B3 shown in FIG. 17 corresponds to a channel width of the memory cell MC. In the second embodiment, a channel width is substantially equal to a width along a column direction of the word line WL. While the body portion B1 faces the second gate electrode G2, the body portion B1 does not face the first gate electrode G1. While the body portion B2 faces the first gate electrode G1, a third insulation film 130 having a larger EOT (Equivalent Oxide Thickness) than that of the first gate dielectric film GI1 is formed between the body portion B2 and the first gate electrode G1. Therefore, the body portion B2 substantially faces only the second gate electrode G2.

On the side surface of the first gate electrode G1 shown in FIG. 18, a boundary between the first gate dielectric film GI1 and the third insulation film 130 is positioned higher than the PN junction X2 between the body B and the source layer S. The junction X1 between the drain layer D and the body B shown in FIG. 17 is positioned higher than the top surface of the first gate electrode G1 shown in FIG. 18. Accordingly, a leak current at the data retention time can be decreased, and the data retention time becomes long.

As shown in FIG. 17, the top surface of the body B is positioned higher than the top surface of the drain layer D. That is, the body B is stretched upward. As shown in FIG. 18, the second gate electrode G2 faces both side surfaces of the stretched part of the body B facing a direction of the word line WL. The stretched part of the body B plays a role of increasing a capacitance coupling between the second gate electrode G2 and the body B. When the capacitance coupling between the word line WL and the body B is large, a word line voltage at the data retention time does not need to be a deep negative voltage. Therefore, a GIDL current at the data retention time becomes small, and the data retention time of the "0" cells becomes long. When the capacitance coupling between the word line WL and the body B is large, the number of holes accumulated in the body B increases. Therefore, variations of signals read from the "1" cells can be suppressed.

The drain layer D is connected to the bit line contact BLC via the silicide 50 as shown in FIG. 19. The bit line contact BLC is in contact with the drain layer D and an SiN spacer 127 so as to be superimposed with the drain layer D and the SiN spacer 127. The source layer S is connected to the source line contact SLC via the suicide 50 as shown in FIG. 20. The source line contact SLC is in contact with the source layer S and the SiN spacer 127 so as to be superimposed with the source layer S and the SiN spacer 127. While widths of the drain layer D and the source layer S are smaller than F, diameters of contact holes of the bit line contact BLC and the source line contact SLC can be equal to or larger than F.

As shown in FIG. 21, the isolation dielectric films 100 isolate the second gate electrodes G2 adjacent in a column direction and the source layers S adjacent in a column direction. As shown in FIG. 22, silicon oxide films isolate the first gate electrodes G1 and the second gate electrodes G2.

A method of manufacturing the FBC memory according to the second embodiment is explained with reference to FIG. 23 to FIG. 34. First, the bulk silicon substrate 10 is prepared. As shown in an A-A cross section of FIG. 23A, an impurity is ion-implanted into the substrate 10, and the P-type well 101, a N-type diffusion layer 102, and a P-type diffusion layer 103 are formed from the bottom in this order. The N-type diffusion layer 102 later becomes the source layer S. The P-type diffusion layer 103 later becomes the body B.

Next, a trench Tr is formed in the first space SP1 (see FIG. 16). The trench Tr is formed to reach the P-type well 101 piercing through the regions of the P-type diffusion layer 103 and the N-type diffusion layer 102. A silicon oxide film 108 is embedded into a lower part within the trench Tr by HDP, and the amorphous silicon layer 109 is embedded into the trench Tr on the silicon oxide film 108. The amorphous silicon layer 109 is transformed into the monocrystalline silicon layer 109 by solid-phase epitaxial growth.

A silicon oxide film 105 is formed by thermal oxidation on the P-type diffusion layer 103 and the monocrystalline silicon layer 109, and thereafter a silicon nitride film 104 is deposited on the silicon oxide film 105. The silicon nitride film 104 in a region of forming the first gate electrode G1 is removed. As shown in a D-D cross section of FIG. 23C and in a B-B cross section of FIG. 23B, a trench Tr2 reaching the P-type well 101 is formed by RIE piercing through the monocrystalline silicon layer 109, the silicon oxide film 108, the P-type diffusion layer 103, and the N-type diffusion layer 102, using the silicon nitride film 104 as a mask. A silicon oxide film 110 by HDP is embedded into a lower part of the trench Tr2. As shown in FIG. 23B, a top surface of the silicon oxide film 110 is positioned higher than a top surface of the N-type diffusion layer 102. The silicon oxide film 110 later becomes the third insulation film 130.

Next, as shown in a B-B cross section of FIG. 24A and in a D-D cross section of FIG. 24B, the first gate dielectric film GI1 is formed by thermal oxidation on an inner surface within the trench Tr (a first side surface of the P-type diffusion layer 103). A P-type polysilicon 112 is deposited on an inner surface of the trench Tr2. The P-type polysilicon 112 has a film thickness not filling the trench Tr. The P-type polysilicon 112 is anisotropically etched. Accordingly, the P-type polysilicon 112 deposited on a top surface of the silicon oxide film 110 is removed while leaving the P-type polysilicon 112 deposited on the side surface within the trench Tr. The silicon oxide film 110 is anisotropically etched using the P-type polysilicon 112 and the silicon nitride film 104 as masks. Accordingly, the third insulation film 130 is formed as shown in FIG. 24A and FIG. 24B. A film thickness of the third insulation film 130 is substantially determined by a film thickness of the P-type polysilicon 112.

As shown in a B-B cross section of FIG. 25A and in a D-D cross section of FIG. 25B, a P-type polysilicon 114 is deposited. The P-type polysilicon 114 is deposited to fill (embed) the inside of the trench Tr2. The P-type polysilicon 114 is etched back until when a top surface of the P-type polysilicon 114 reaches a position lower than a top surface of the P-type diffusion layer 103. The P-type polysilicon 114 later becomes the first gate electrode G1. A silicon oxide film 116 is deposited by HDP to fill the trench Tr2, and the silicon oxide film 116 is flattened by CMP. The silicon nitride film 104 is removed by hot phosphoric acid solution. Accordingly, the configuration shown in FIG. 25A and FIG. 25B is obtained.

The silicon oxide film 105 is removed, and thereafter a spacer 118 including a silicon nitride film is formed on a side surface of the silicon oxide film 116. Next, as shown in a B-B cross section of FIG. 26A, upper parts of the P-type diffusion layer (silicon) 103 and the N-type diffusion layer (silicon) 102 are anisotropically etched using the spacer 118 and the silicon oxide film 116 as masks. Accordingly, a trench Tr3 is formed to reach the N-type diffusion layer (silicon) 102 piercing through the P-type diffusion layer (silicon) 103. A thickness of the body B in a row direction is substantially determined by a film thickness of the spacer 118. In this case, in a D-D cross section of FIG. 26B, the silicon layer 119 is anisotropically etched using the spacer 118 as a mask.

Figure 27B:
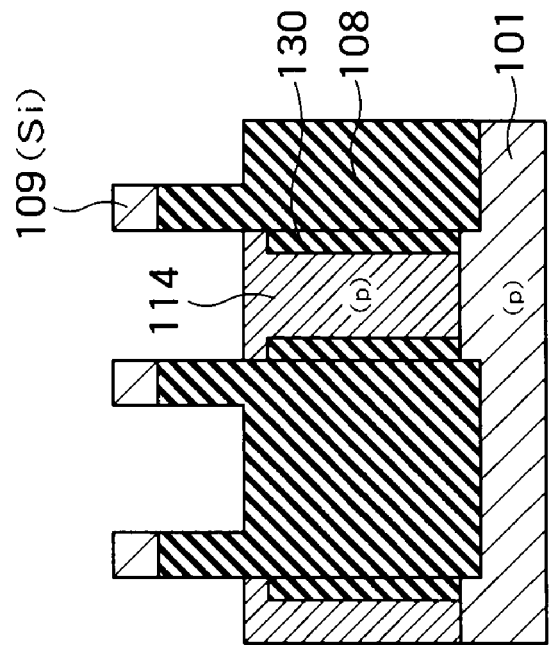
Figure 27A:
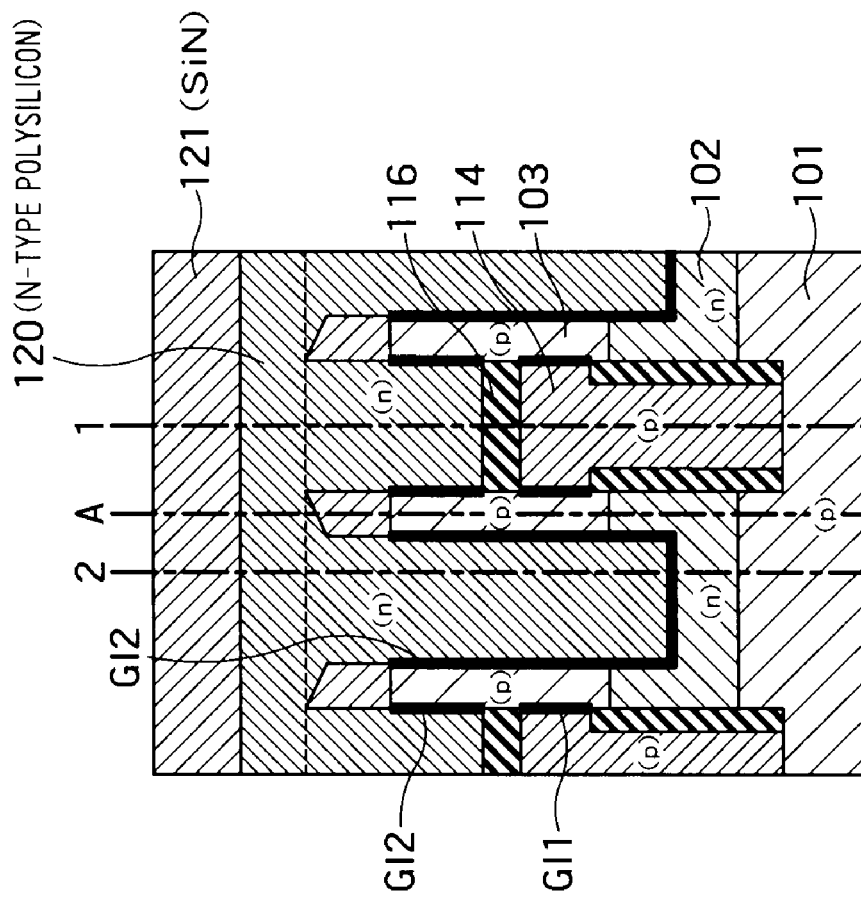
Figure 28:
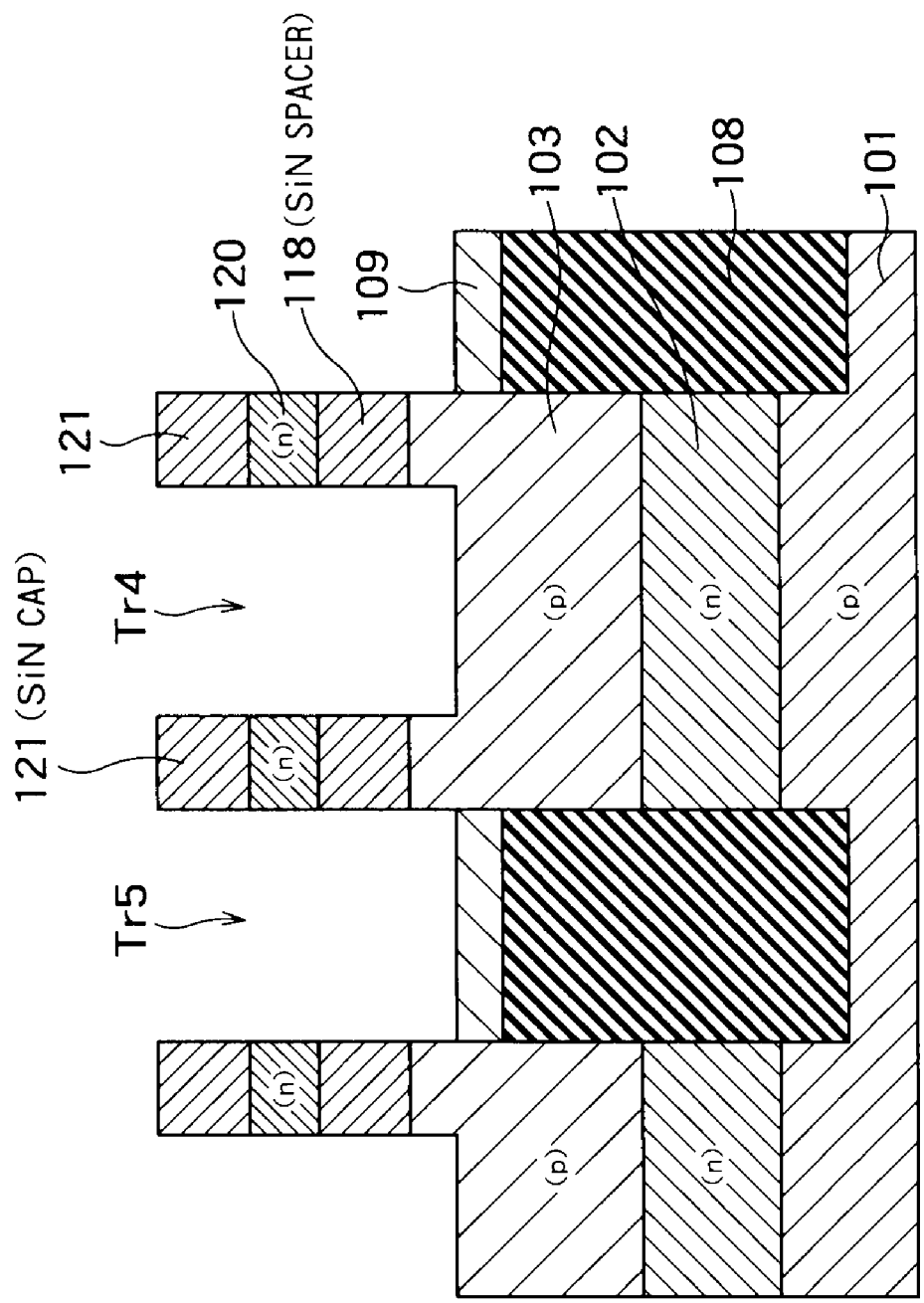
Figure 29:
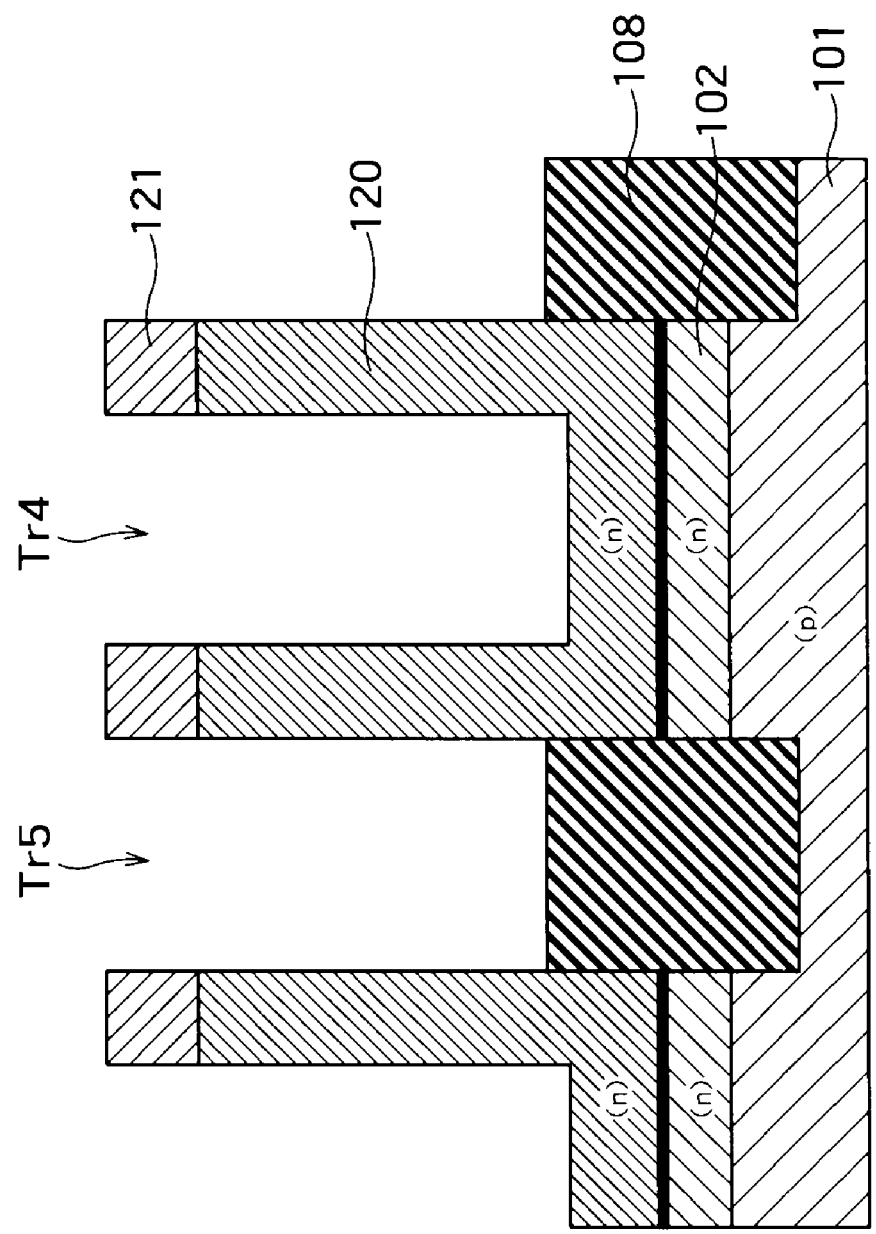
Figure 30:
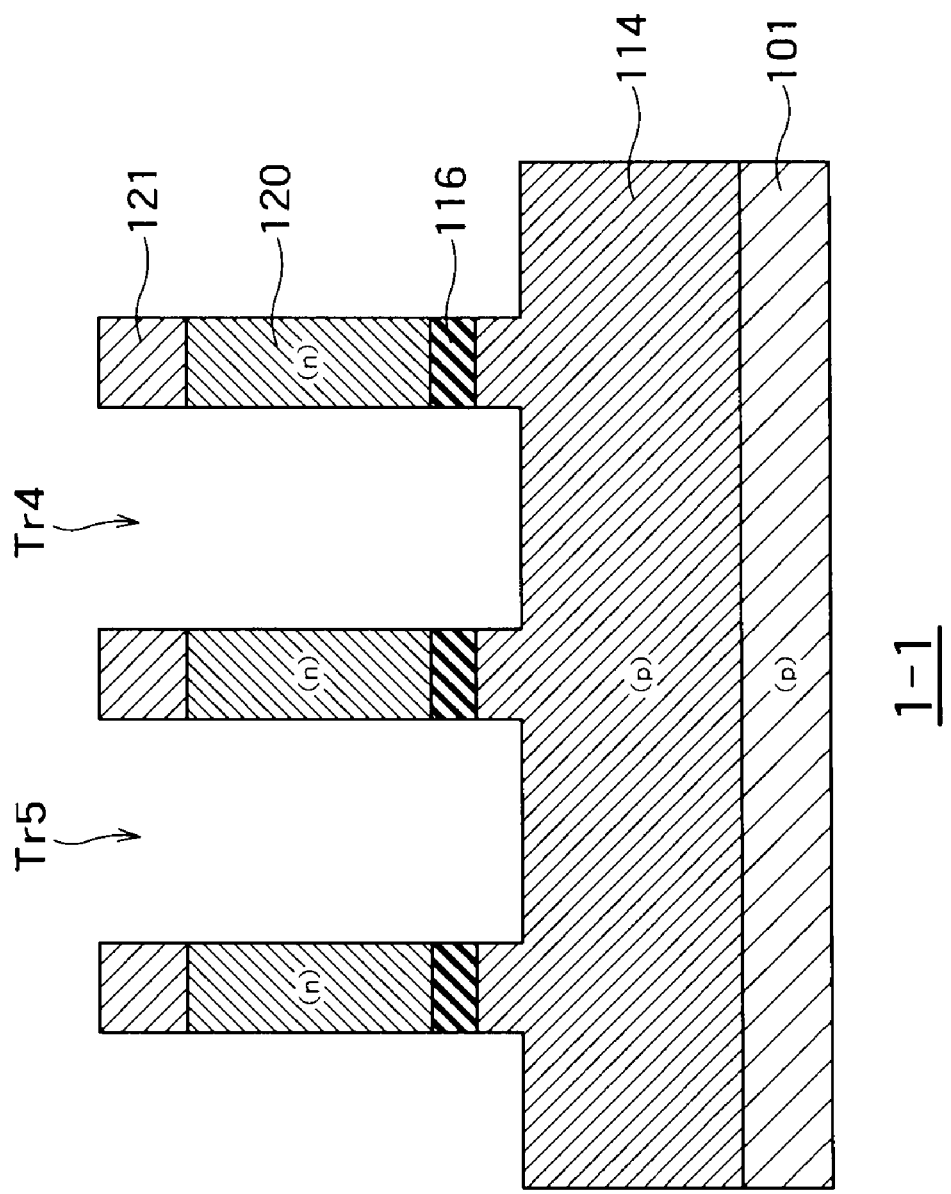
Figure 32:
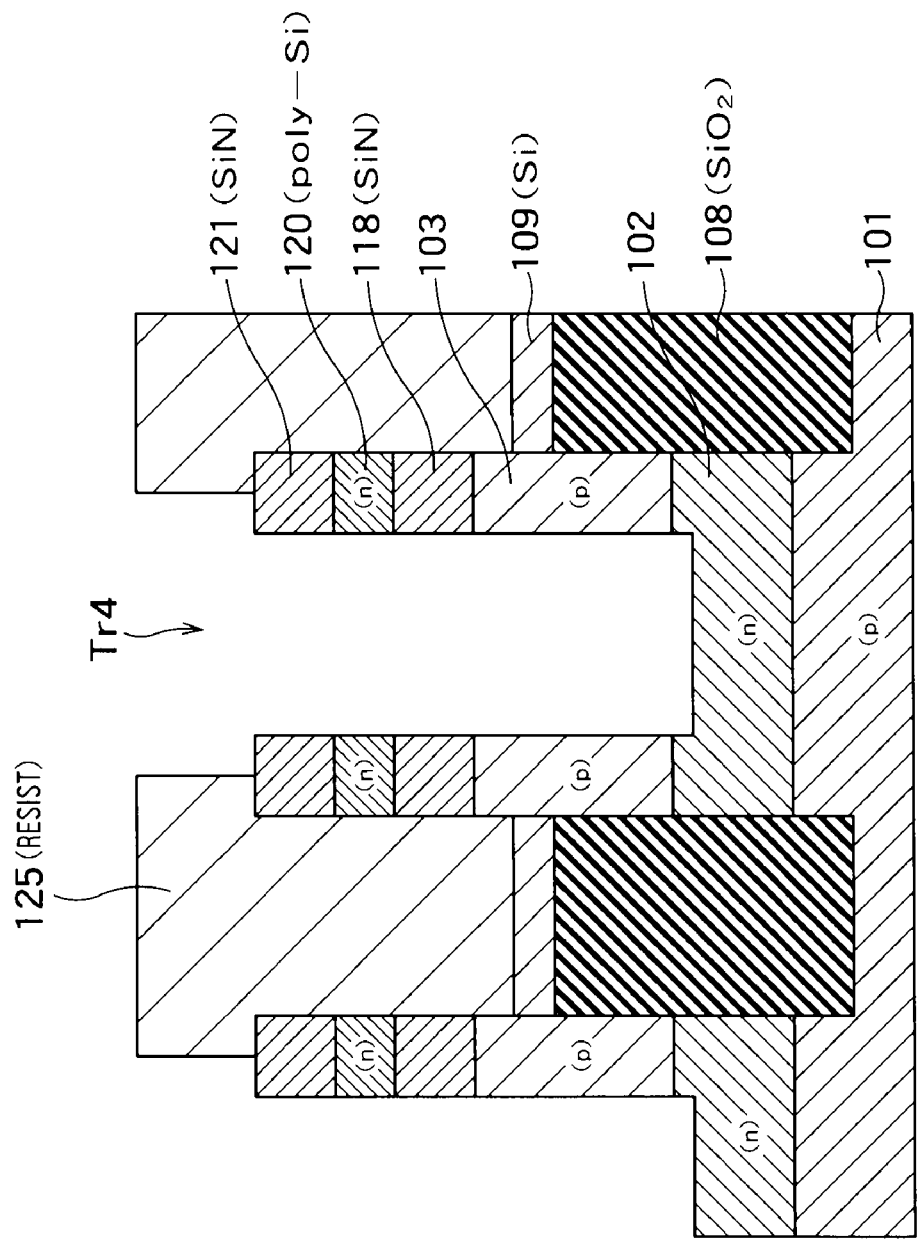
Figure 33:
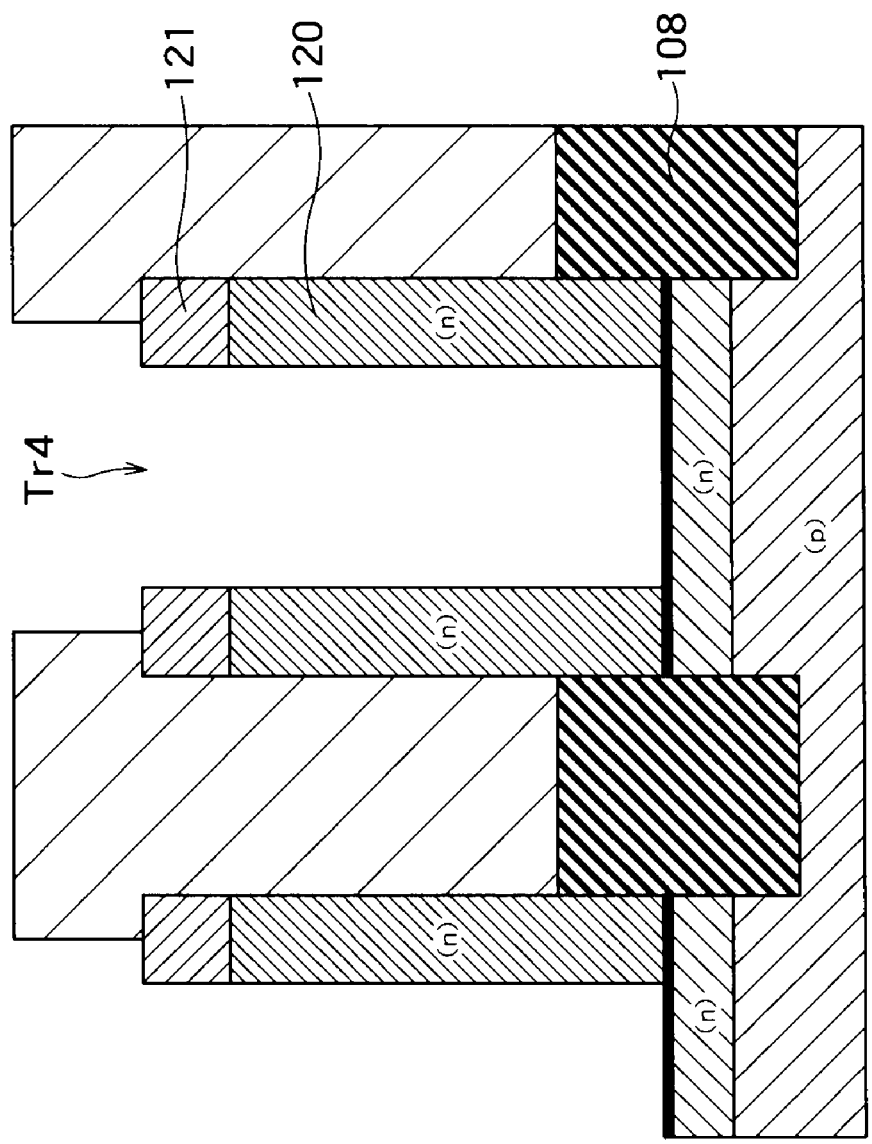
Figure 34:
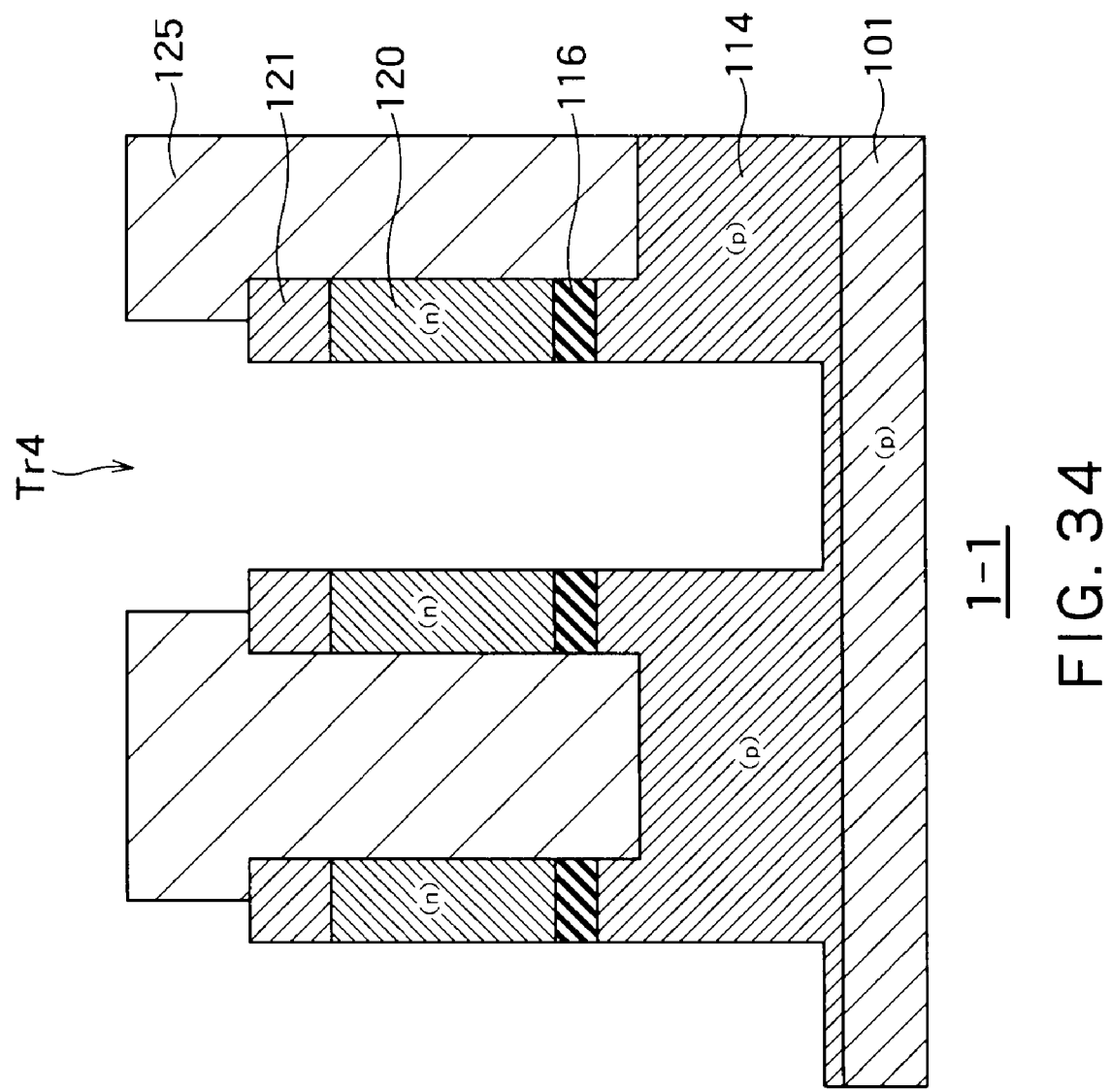

Next, as shown in a B-B cross section of FIG. 27A, the second gate dielectric film GI2 is formed by thermal oxidation on an inner surface (and an outer surface) of the trench Tr3. An N-type polysilicon 120 is deposited to fill the inside of the trench Tr3 and to cover the spacer 118. A SiN cap 121 as a mask material is deposited on the N-type polysilicon 120. The SiN cap 121 is processed into a pattern of the word line WL, using lithography and RIE. The N-type polysilicon 120 is anisotropically etched using the SiN cap 121 as a mask. FIG. 27B is a D-D cross section. As a result, as shown in FIG. 28 to FIG. 30, trenches Tr4 and Tr5 are formed in an A-A cross section, a 1-1 cross section, and a 2-2 cross section. As shown in FIG. 28, the trench Tr4 reaches an upper part of the P-type diffusion layer 103 piercing through the N-type polysilicon 120, and the spacer 118. The trench Tr5 reaches an upper part of the monocrystalline silicon layer 109 piercing through the N-type polysilicon 120, and the spacer 118. As shown in FIG. 29, in a cross section along a line 2-2, the trench Tr4 is removed up to a middle of the N-type polysilicon 120, and a lower part of the N-type polysilicon 120 is left. The trench Tr5 is extended to a middle of the silicon oxide film 108. As shown in a 1-1 cross section of FIG. 30, the trenches Tr4 and Tr5 reach an upper part of the P-type polysilicon 114 piercing through the N-type polysilicon 120 and the silicon oxide film 116.

As shown in FIG. 31 to FIG. 34, a resist 125 is formed to cover a formation region of the drain layer D and to expose a formation region of the source layer S. The silicon at a bottom of the trench Tr4 is further etched using the resist 125 as a mask. As a result, as shown in an A-A cross section of FIG. 32, the trench Tr4 reaches an upper part of the N-type diffusion layer 102, piercing through the P-type diffusion layer 103. In a 2-2 cross section of FIG. 33, the trench Tr4 reaches a silicon oxide film on the N-type diffusion layer 102. In a 1-1 cross section of FIG. 34, a bottom of the trench Tr4 becomes deeper than a bottom of the trench Tr5.

Thereafter, the resist 125, the silicon nitride film (SiN cap) 121, and the silicon nitride film (spacer) 118 are removed. LDD is formed on the monocrystalline silicon layer 109 (the drain layer D), and the SiN spacer 127 shown in FIG. 17 is formed. Further, a high-concentration N-type impurity is ion-implanted into the N-type diffusion layer 102. The silicide 50 is formed on the word line WL, the source line S, and the drain layer D. The source line contact SLC and the bit line contact BLC are formed on the source layer S and the drain layer D. The source line SL and the bit line BL are formed, thereby obtaining the configuration shown in FIG. 17 to FIG. 22.

The P-type polysilicon 114 corresponds to the first gate electrode G1. The N-type polysilicon 120 corresponds to the word line WL and the second gate electrode G2. The P-type diffusion layer 103 corresponds to the body B. The N-type diffusion layer 102 corresponds to the source layer S. The monocrystalline silicon layer 109 corresponds to the drain layer D.

Third Embodiment

Figure 35:
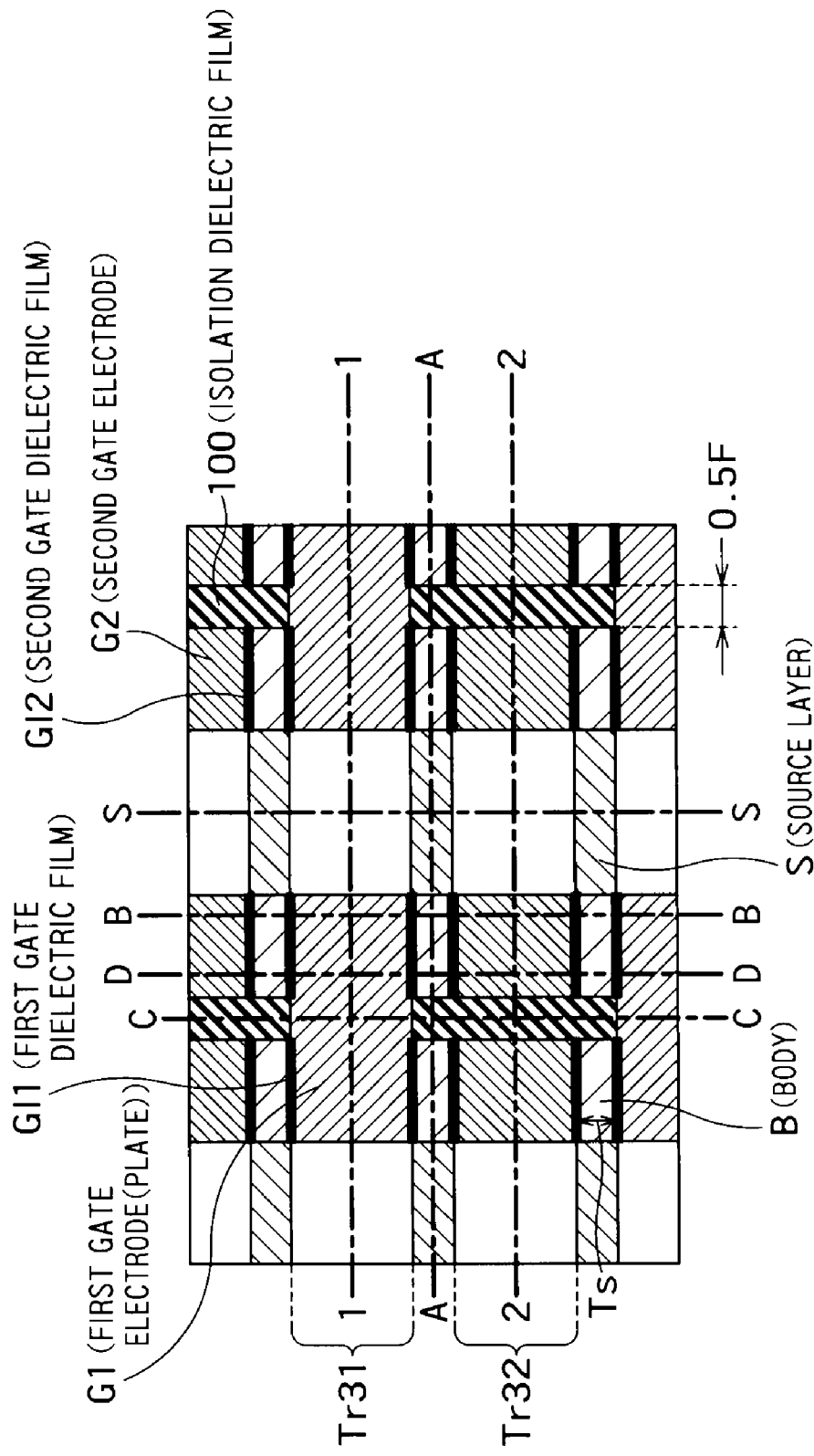
FIG. 35 is a plan view showing a configuration of the bodies and the gates of the FBC memory according to a third embodiment.
Figure 36:
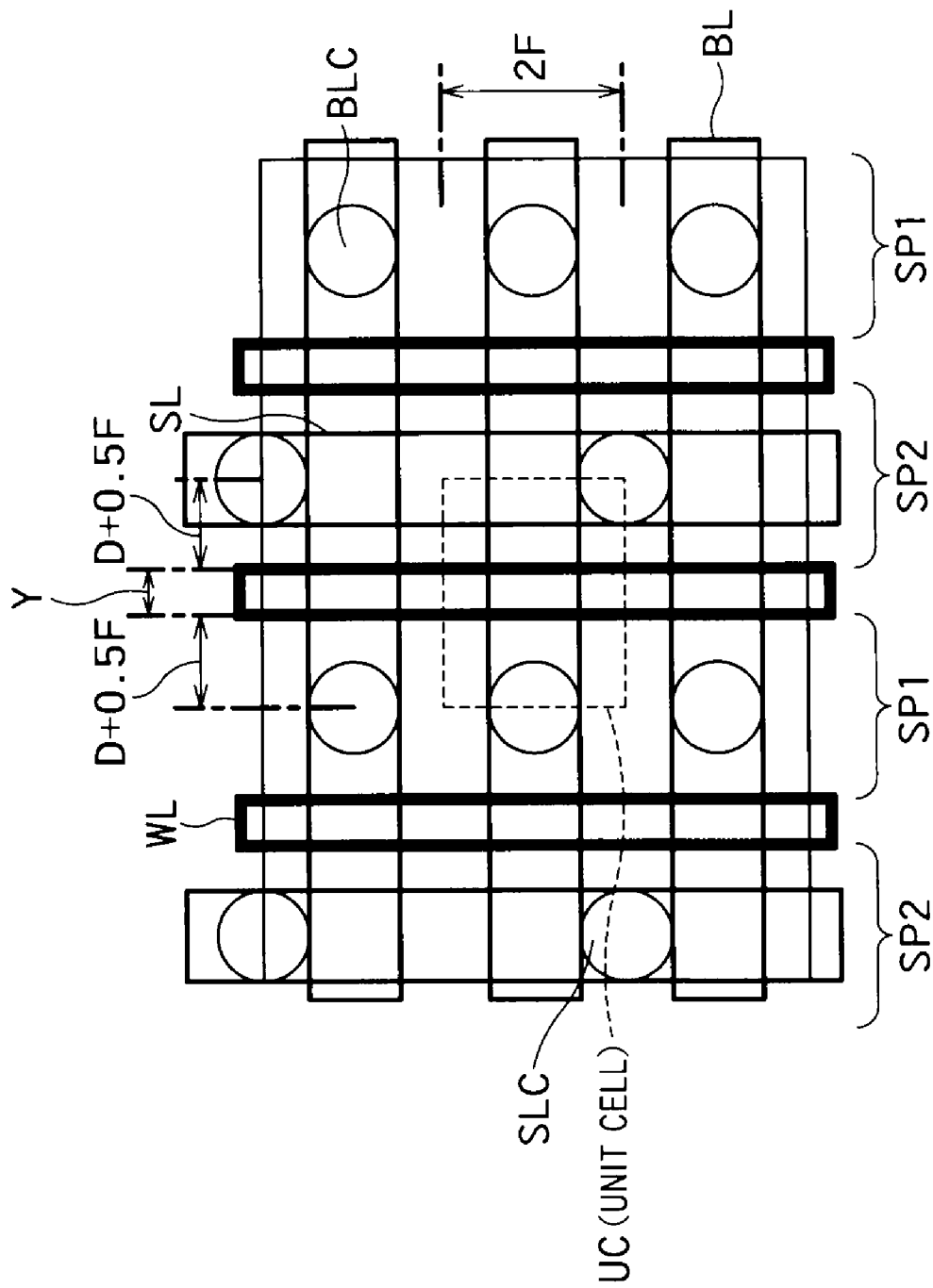
FIG. 36 is a plan view showing a wiring of the FBC memory according to the third embodiment of the present invention.
Figure 37:
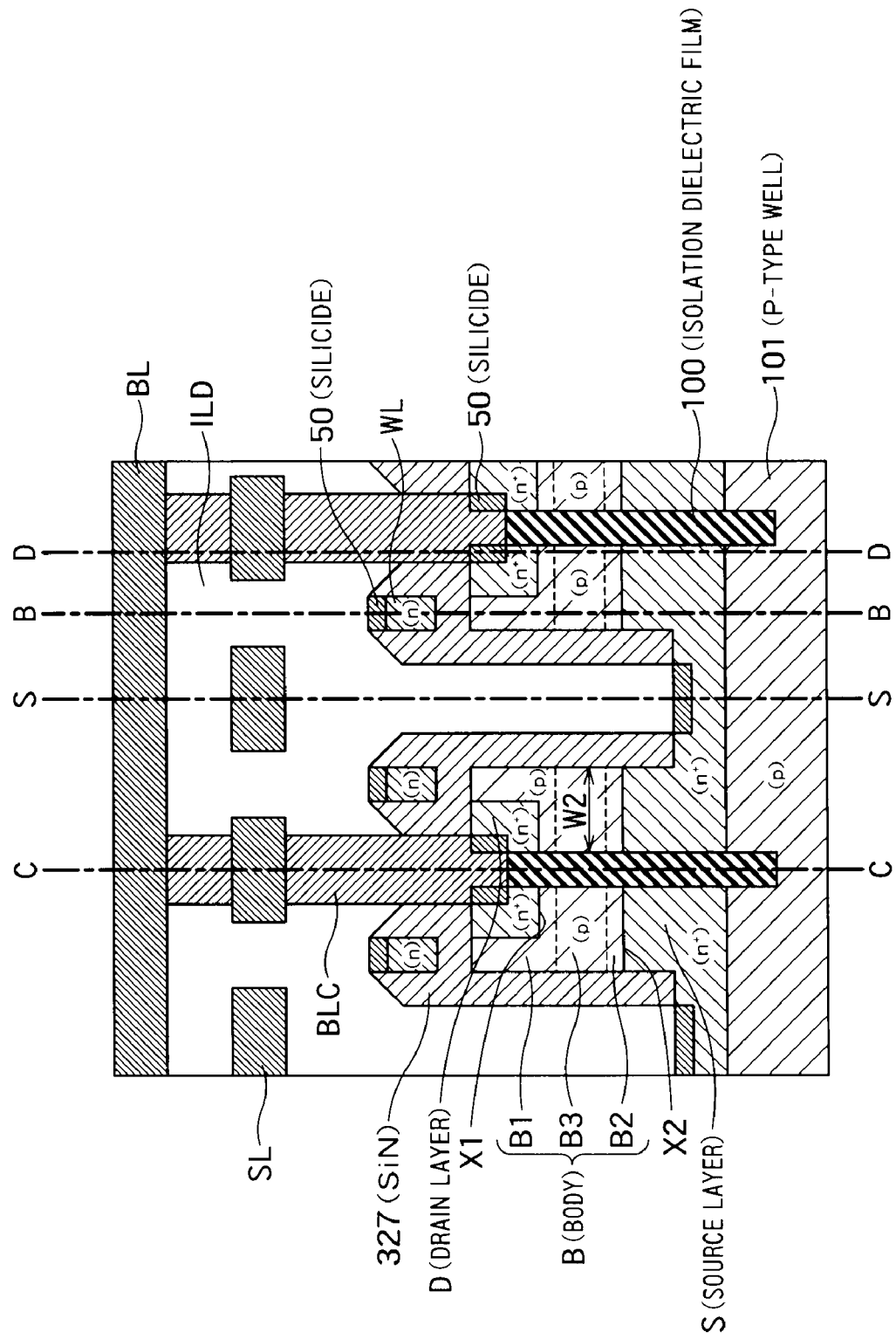
FIG. 37 is an A-A cross section of FIG. 35.
Figure 38:
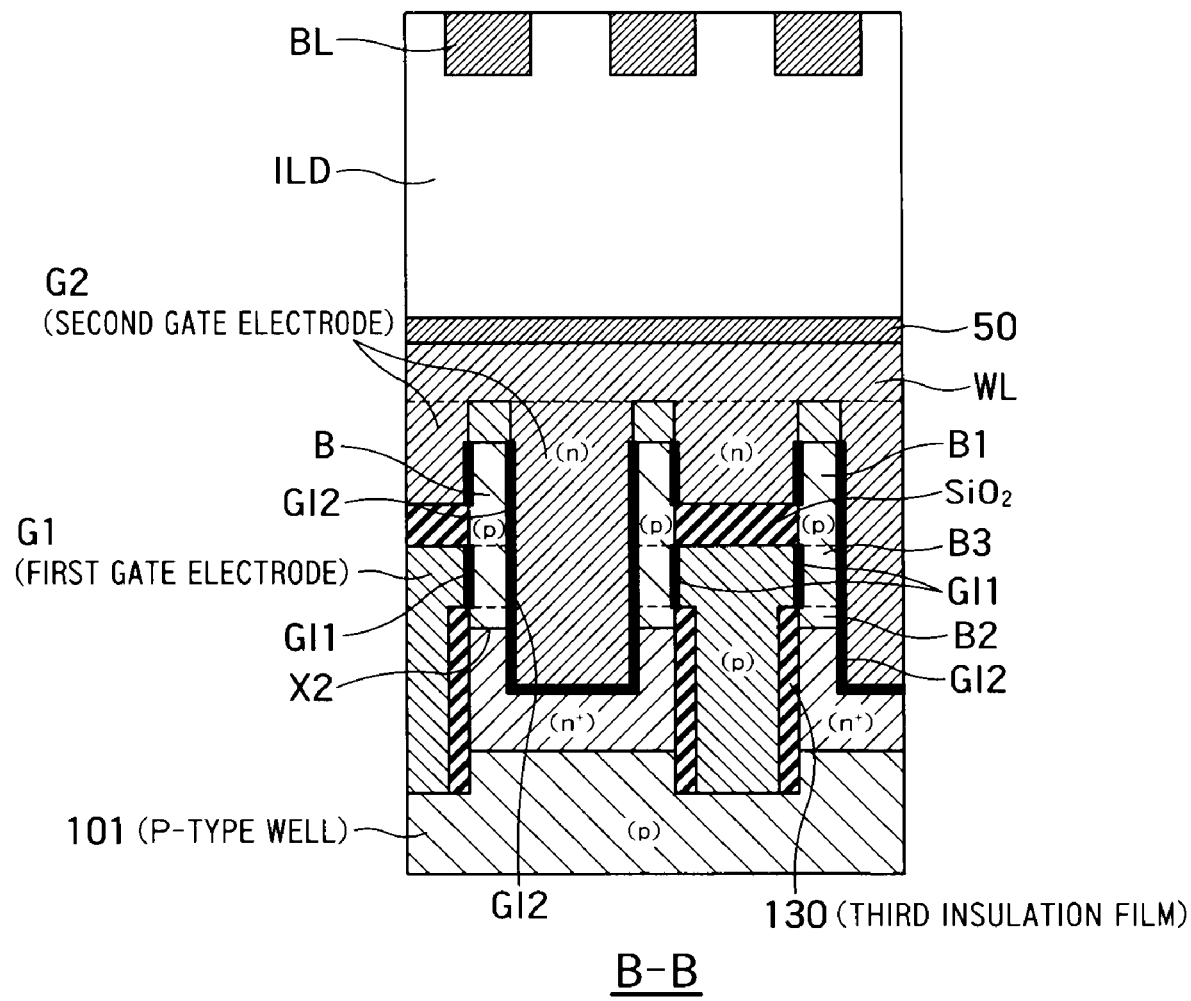
FIG. 38 is a B-B cross section of FIG. 35 and FIG. 37.
Figure 39:
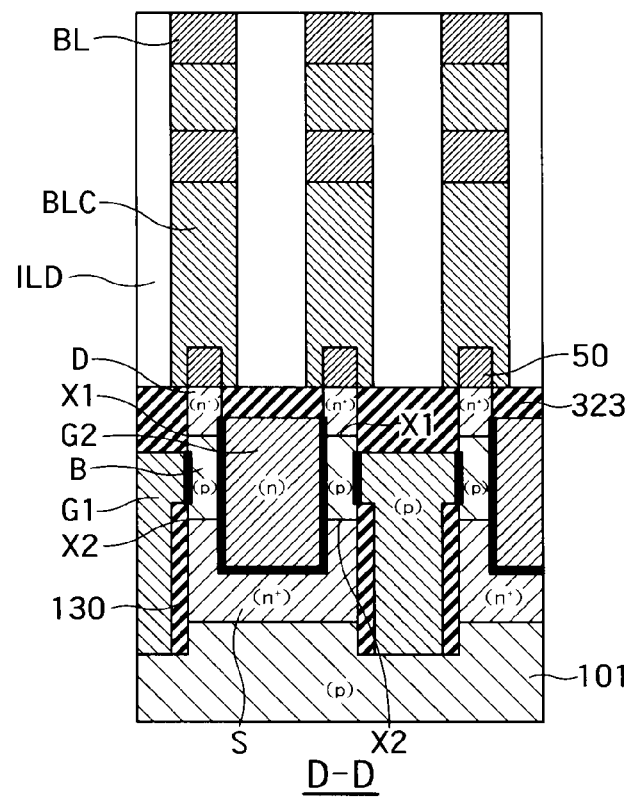
FIG. 39 is a D-D cross section of FIG. 35 and FIG. 37.
Figure 40:
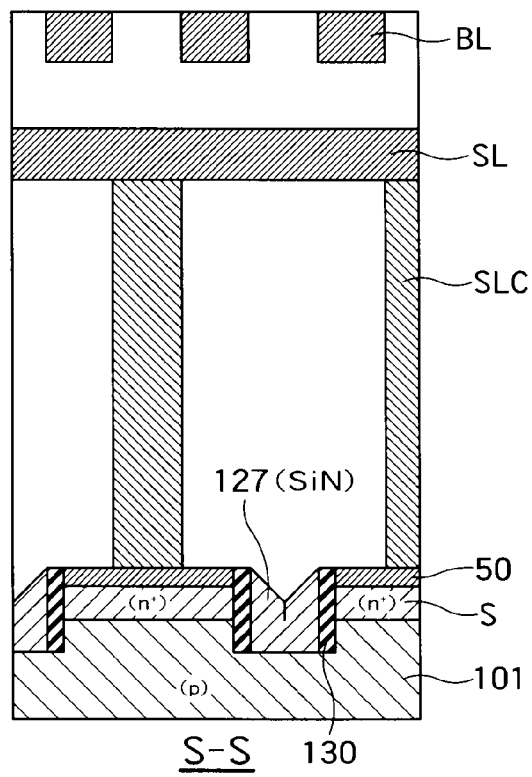
FIG. 40 is an S-S cross section of FIG. 35 and FIG. 37.
Figure 41:
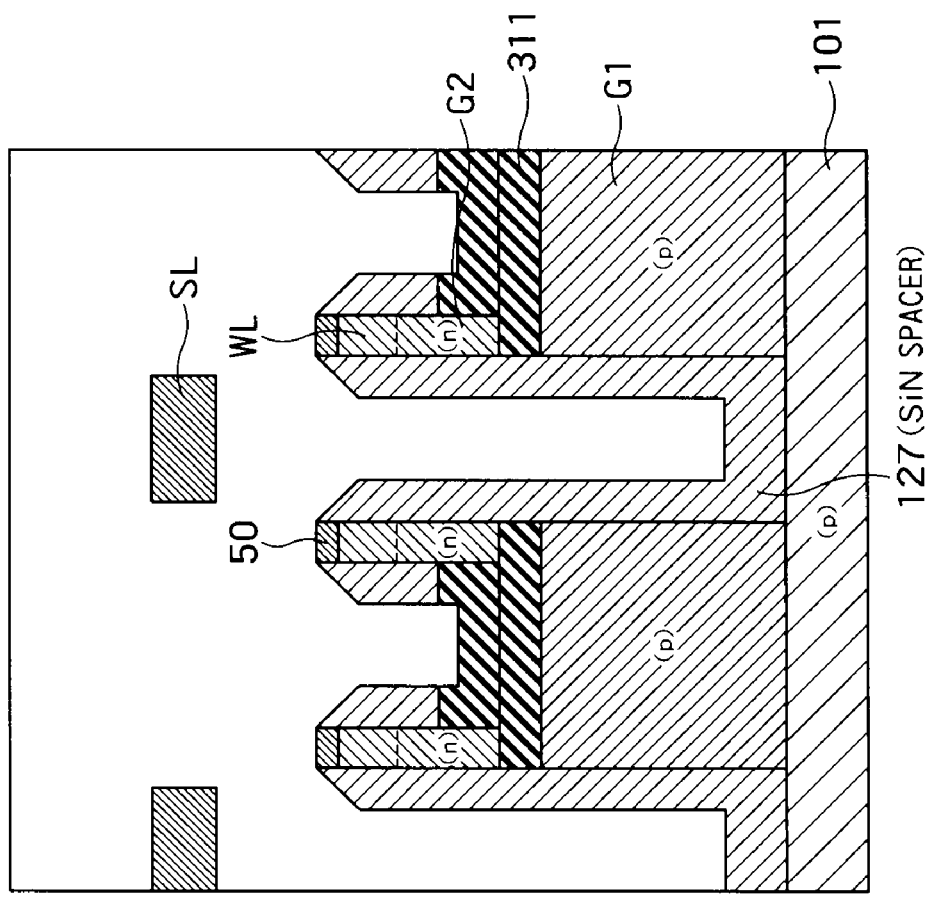
FIG. 41 is a 1-1 cross section of FIG. 35.
Figure 42:
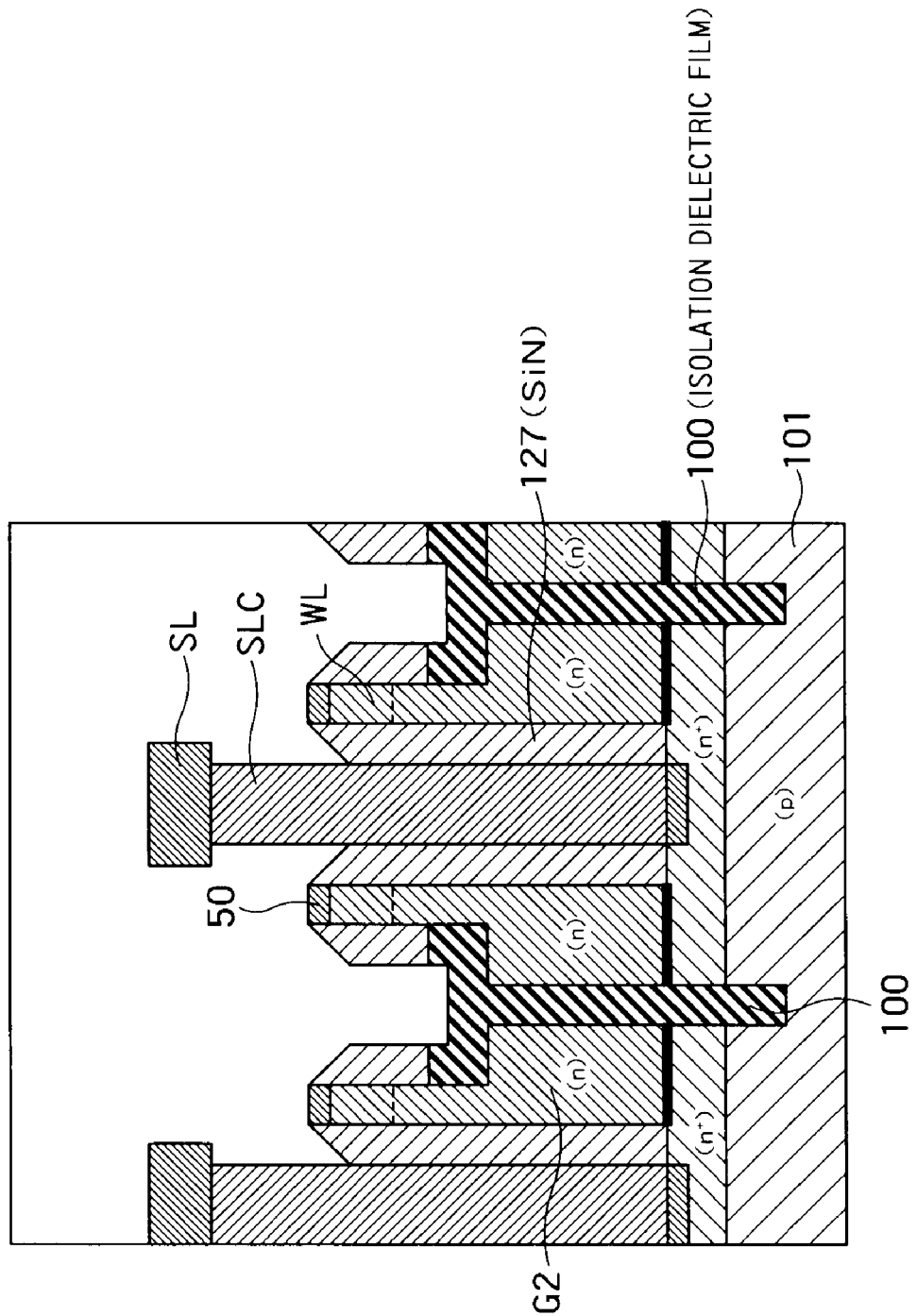
FIG. 42 is a 2-2 cross section of FIG. 35.

FIG. 35 and FIG. 36 are plan views of an FBC memory according to a third embodiment of the present invention. FIG. 37 is an A-A cross section of FIG. 35. FIG. 38 is a B-B cross section of FIG. 35 and FIG. 37. FIG. 39 is a D-D cross section of FIG. 35 and FIG. 38. FIG. 40 is an S-S cross section of FIG. 35 and FIG. 37. FIG. 41 is a 1-1 cross section of FIG. 35. FIG. 42 is a 2-2 cross section of FIG. 35. In the third embodiment, the FBC memory is formed on a bulk substrate. Accordingly, in the third embodiment, manufacturing cost can be reduced.

As shown in FIG. 36, the FBC memory according to the third embodiment includes plural bit lines BL extended to a column direction, plural word lines WL extended to a row direction, and plural source lines SL extended to a row direction. As shown in FIG. 37, each semiconductor layer including the source layer S, the body B, and the drain layer D is formed in a U-shape on the surface of the substrate 10.

Each drain layer D as a first diffusion layer is provided at an upper part of the U-shaped semiconductor layer in a cross section along a column direction. Each source layer S as a second diffusion layer is provided at a lower part of the U-shaped semiconductor layer in the cross section along a column direction. Each body B is formed at an intermediate part between the source layer S and the drain layer D, is in an electrically floating state, and accumulates or discharges an electric charge to store data.

As shown in FIG. 38, the first gate dielectric film GI1 is provided on a side surface (a first side surface) facing a row direction of the U-shaped semiconductor layer. The first gate electrode G1 is provided on a first side surface via the first gate dielectric film GI1. The first gate electrode G1 includes a P-type semiconductor connected to the P-type well 101, and functions as a plate. The second gate dielectric film GI2 is provided on a side surface (a second side surface) facing a row direction of the U-shaped semiconductor layer. The second gate electrode G2 is provided on this second side surface via the second gate dielectric film GI2. The second gate electrode G2 is also provided between adjacent U-shaped semiconductor layers on the cross section in a row direction. The second gate electrode G2 is formed integrally with the same material as that of the word line WL at an upper part of the second gate electrode G2. With this arrangement, because a gate contact does not need to be formed on the gate electrode, a cell size becomes small. The second gate electrode G2 is insulated from the first gate electrode G1. The P-type well 101 is extended to the outside of a cell array, and a voltage is applied to the P-type well at the outside of the cell array. That is, a potential different from that of the second gate electrode G2 can be applied to the first gate electrode G1.

As shown in FIG. 37, the P-type well 101 is formed below the source layer S. The isolation dielectric film 100 is formed between adjacent U-shaped semiconductor layers, on the cross section in a column direction. The isolation dielectric film 100 isolates the adjacent U-shaped semiconductors. The source layer S is shared by two adjacent memory cells. On the other hand, the adjacent source layers S are electrically isolated from each other by the P-type well 101 and the isolation dielectric film 100. Accordingly, the source layer S can be selectively driven. A source voltage is applied to the source layer S through the source line SL and the source line contact SLC made of a metal material. Accordingly, parasitic resistance of the source contact becomes small. Plural memory cells adjacent in a column direction alternately share the bit line contacts BL and the source line contacts SLC. As a result, the cell size can be reduced.

The drain layers D are provided on upper parts of the U-shaped semiconductor layers. The drain layers D of adjacent two memory cells are isolated by the isolation dielectric films 100, and are connected in common to one bit line contact BLC. A bit line voltage is applied to the drain layers D through the bit lines BL and the bit line contacts BLC made of a metal material. Accordingly, parasitic resistance of a bit contact becomes small.

As shown in FIG. 37, the body B can be divided into the body portions of B1 to B3. As shown in FIG. 38, the body portion B3 faces the first gate electrode (plate) G1 via the first gate dielectric film GI1. The width W1 of the body portion B3 shown in FIG. 37 corresponds to a channel width of the memory cell MC. In the third embodiment, a channel width is substantially equal to a width along a column direction of the word line WL. While the body portion B1 faces the second gate electrode G2, the body portion B1 does not face the first gate electrode G1. While the body portion B2 faces the first gate electrode G1, the third insulation film 130 having a larger EOT than that of the first gate dielectric film GI1 is formed between the body portion B2 and the first gate electrode G1. Therefore, the body portion B2 substantially faces only the second gate electrode G2.

On the side surface of the first gate electrode G1 shown in FIG. 38, a boundary between the first gate dielectric film GI1 and the third insulation film 130 is positioned higher than the PN junction X2 between the body B and the source layer S. The junction X1 between the drain layer D and the body B shown in FIG. 37 and FIG. 39 is positioned higher than the top surface of the first gate electrode G1 shown in FIG. 38 and FIG. 39. Accordingly, a leak current at the data retention time can be decreased, and the data retention time becomes long.

As shown in FIG. 37, the top surface of the body B is stretched to a height level of the top surface of the drain layer D. Accordingly, as shown in FIG. 38, the second gate electrode G2 faces both side surfaces of the stretched part of the body B facing a direction of the word line WL. The stretched part of the body B plays a role of increasing a capacitance coupling between the second gate electrode G2 and the body B. When the capacitance coupling between the word line WL and the body B is large, a word line voltage at the data retention time does not need to be a deep negative voltage. Therefore, a GIDL current at the data retention time becomes small, and the data retention time of the "0" cells becomes long. When the capacitance coupling between the word line WL and the body B is large, the number of holes accumulated in the body B increases. Therefore, variations of signals read from the "1" cells can be suppressed.

A width Y of the word line WL is formed using a spacer without depending on lithography. Therefore, the width Y can be set smaller than F. In the third embodiment, the width Y of the word line WL is 0.5 F, and a distance D between the word line and the contact is 0.5 F. An area of the unit cell UC is 5 $F^2$.

Because the source layer S and the drain layer D are formed in different heights, a distance between the source and the drain can be held even when the cell size is reduced. Accordingly, a reduction of a signal amount following a reduction of a gate length can be prevented.

The first gate electrode (plate) G1 faces the body portion B3. The body portion B3 plays a role of accumulating holes at the data holding time. In the third embodiment, because the channel width W2 does not depend on mis-alignment of resist, the variation of the channel width is small. That is, because a variation of a drain current between the memory cells is small, its yield rate is improved.

The drain layer D is connected to the bit line contact BLC via the silicide 50 as shown in FIG. 39. The bit line contact BLC is in contact with the drain layer D and the isolation dielectric film 100 so as to be superimposed with the drain layer D and the isolation dielectric film 100. In the cross section in FIG. 39, a width (a row direction) of a contact part between the silicide 50 and the drain layer D is equal to the width Ts in a row direction of the body B. On the other hand, as shown in FIG. 37, the silicide 50 can be formed on the outer side surface of the U-shaped semiconductor layer. That is, the silicide 50 is formed vertically long. When a vertical length of the drain layer D is large, a length in a vertical direction of the contact part between the suicide 50 and the drain layer D can be large. Therefore, even when the width Ts in a row direction of the body B is small to achieve a fully depleted operation, parasitic resistance of the drain layer D can be made sufficiently small.

As shown in FIG. 38 and FIG. 40, the source layer S is extended from the second side surface of the U-shaped semiconductor layer to a row direction, and has a plane portion (a pad portion) of the semiconductor layer substantially parallel with the surface of the substrate 10. This plane portion is shared by two adjacent memory cells in a row direction. The source line contact SLC is formed on this plane portion, and is connected to the source layer S via the silicide 50, as shown in FIG. 40. The source layer S is shared by four adjacent memory cells. An area of the source layer S is larger than an area of contact holes of the source line contact SLC. Even when the width Ts in a row direction of the body B is made small, a contact area between the silicide 50 and the source layer S can be enlarged.

As shown in FIG. 41, an oxide film 311 isolates the first gate electrode G1 from the second gate electrode G2. As shown in FIG. 42, the isolation dielectric film 100 isolates the two adjacent second gate electrodes G2 in a column direction.

Figure 43:
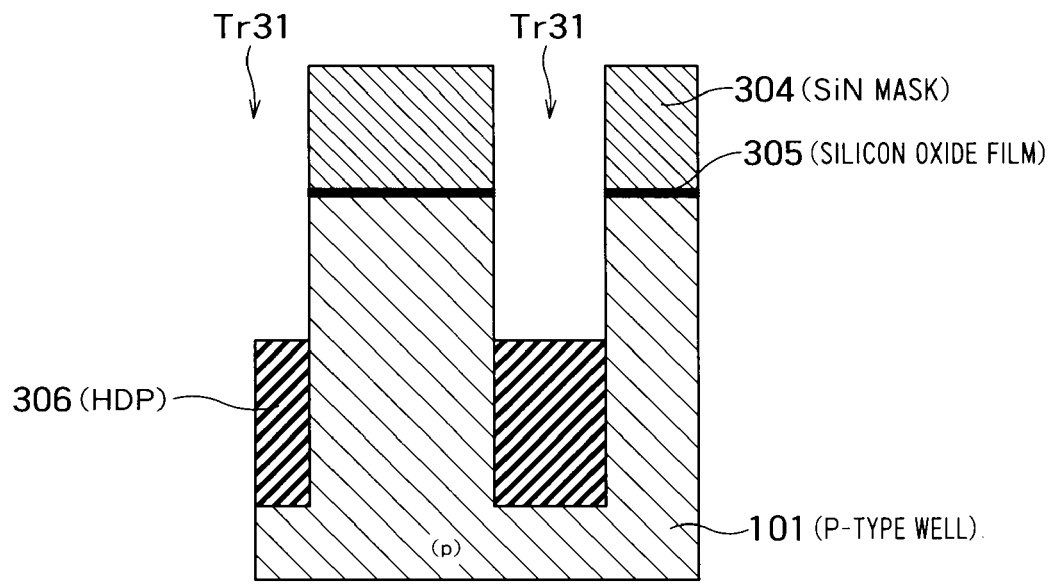
FIG. 43 to FIG. 67 are cross-sections showing a method of manufacturing the FBC memory according to the third embodiment.

A method of manufacturing the FBC memory according to the third embodiment is explained with reference to FIG. 43 to FIG. 67. First, the bulk silicon substrate 10 is prepared. The P-type well 101 is formed on the substrate 10. A silicon oxide film 305 is formed on the P-type well 101, and a silicon nitride film 304 as a mask material is deposited on the silicon oxide film 305. The silicon nitride film 304 is etched using lithography or RIE. The P-type well 101 (the substrate 10) is anisotropically etched using the silicon nitride film as a mask. Accordingly, trenches Tr31 are formed as shown in FIG. 43. The first gate electrode G1 is provided later in each trench Tr31. A silicon oxide film 306 is embedded into the trench Tr31 by HDP.

Figure 44:
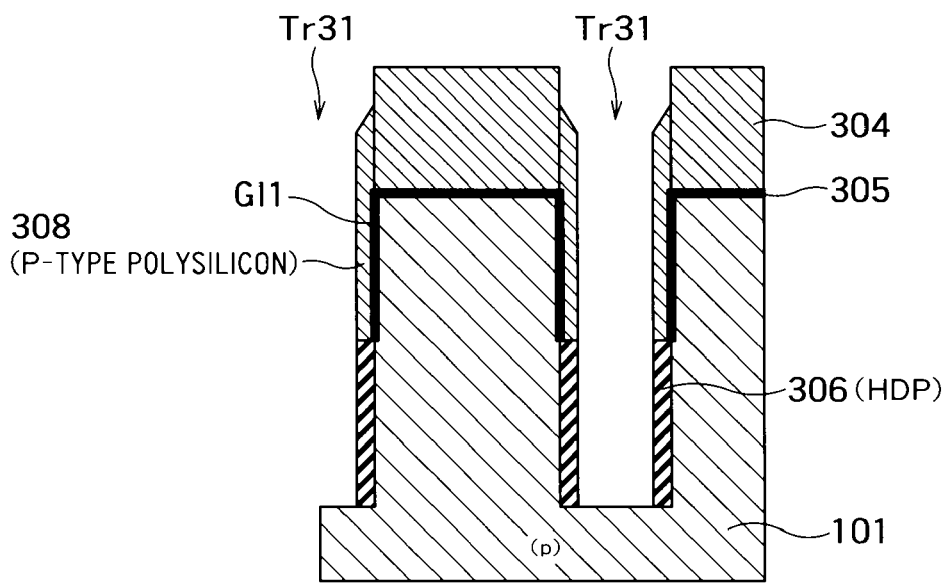

As shown in FIG. 44, the first gate dielectric film GI1 is formed on an inner surface (a first side surface) of the trench Tr31 by thermal oxidation. The first gate dielectric film GI1 is formed on an inner surface of the trench Tr31 above the silicon oxide film 306. A P-type polysilicon 308 having a film thickness not filling the trench Tr31 is deposited. The P-type polysilicon 308 is anisotropically etched to expose a top surface of the silicon oxide film 306 while leaving the P-type polysilicon 308 deposited on a side surface of the trench Tr31. The silicon oxide film 306 is anisotropically etched using the P-type polysilicon 308 as a mask. Accordingly, the configuration shown in FIG. 44 is obtained.

Figure 45:
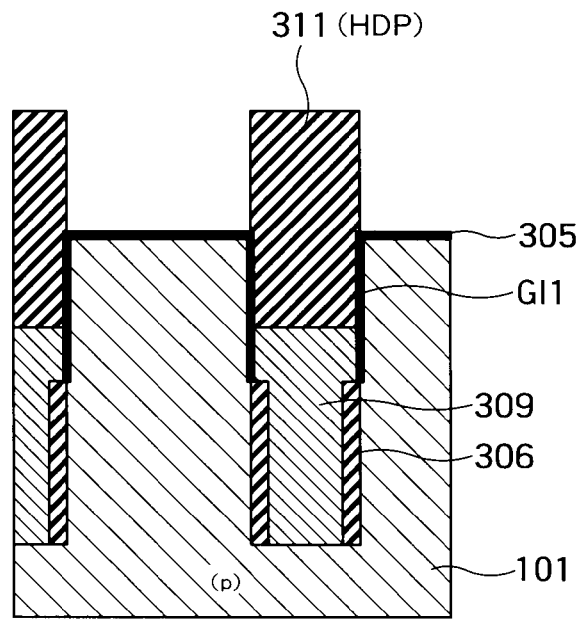

Next, a P-type polysilicon is deposited again, and P-type polysilicon 309 is etched back. Accordingly, as shown in FIG. 45, the P-type polysilicon 309 is filled into a lower part of the trench Tr31. Further, a silicon oxide film 311 is deposited by HDP, and the silicon oxide film 311 is flattened by CMP. Accordingly, the silicon oxide film 311 is filled into an upper part of the trench Tr31. The silicon nitride film 304 is removed by hot phosphoric acid. The P-type polysilicon 309 is the first gate electrode G1.

Figure 46:
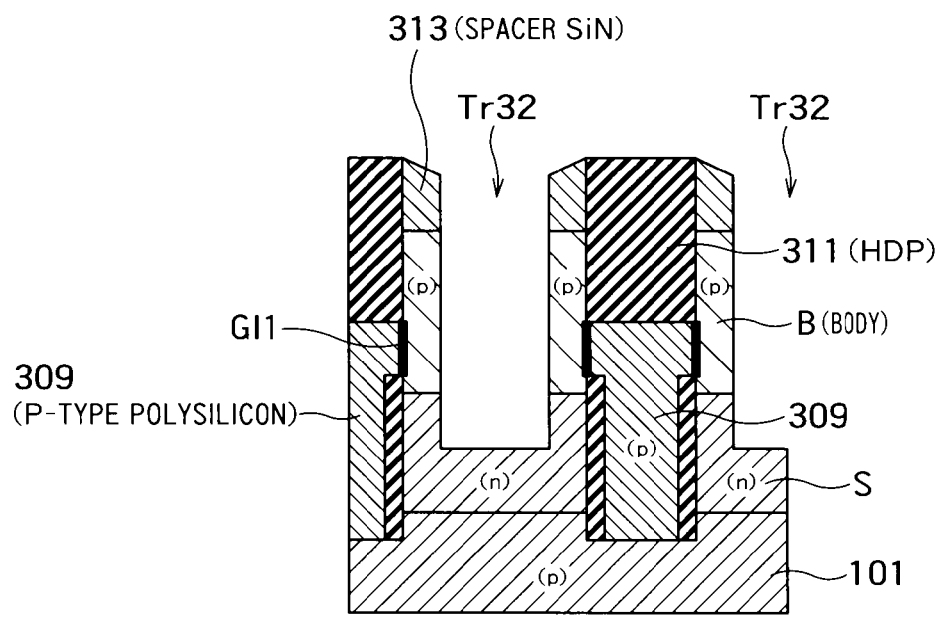
Figure 47:
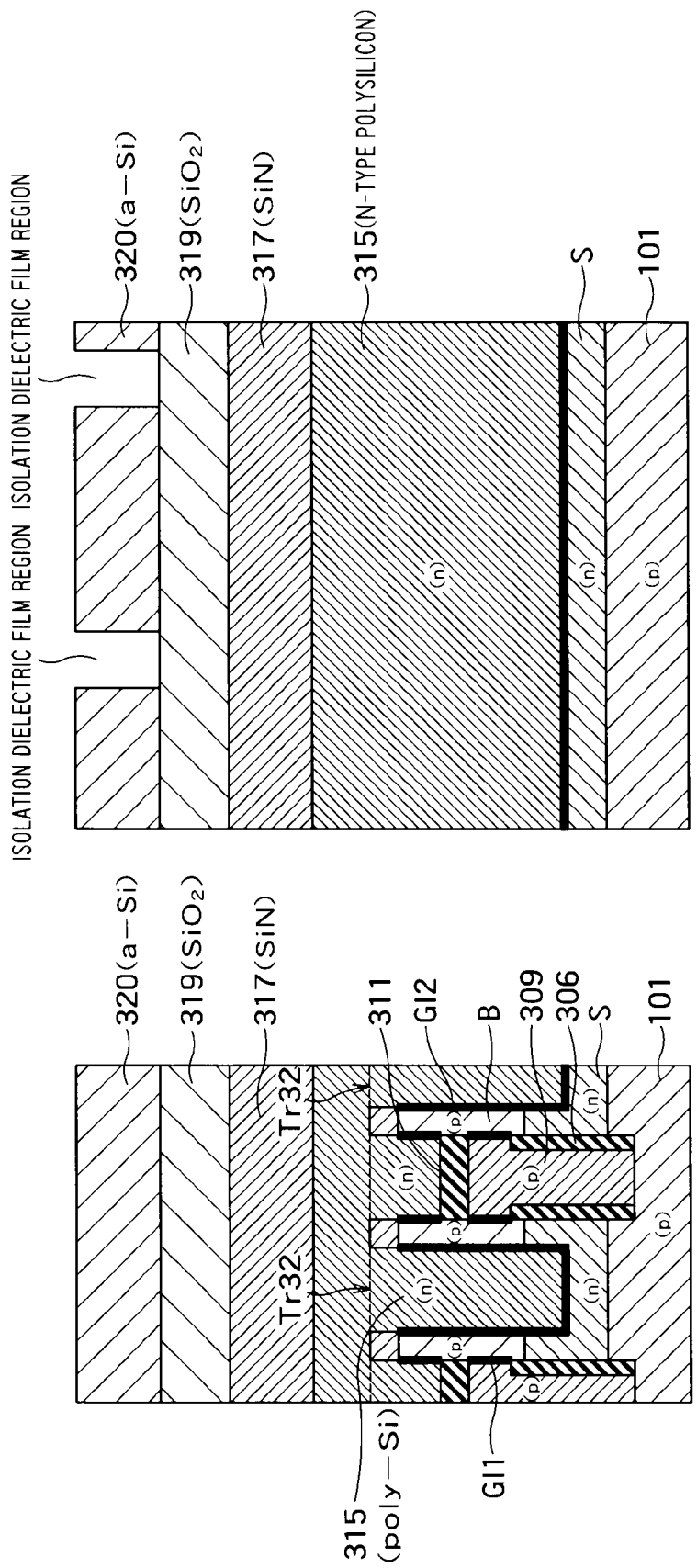

Next, an SiN spacer 313 is formed on a side surface of the silicon oxide film 311 exposed by removing the silicon nitride film 304. The P-type well 101 (the substrate 10) is anisotropically etched using the spacer 313 and the silicon oxide film 311 as masks. Accordingly, trenches Tr32 are formed as shown in FIG. 46. Each trench Tr32 is a region in which the second gate electrode G2 is formed. A thickness of the body B is substantially determined by a film thickness of the spacer 313. Because lithography is not used, a thickness of the body B in a row direction can be formed smaller than F. A P-type impurity is ion implanted at an angle into the body B. In this case, concentration of the P-type impurity is about $1 \times 10^{17}$ $cm^3$. Further, an N-type impurity is ion implanted perpendicularly into the P-type well 101. The N-type impurity is diffused upward and downward by heat treatment. Accordingly, regions of the body B and the source layer S are formed.

The silicon oxide film 311 is etched. In this case, the silicon oxide film 311 is etched until a top surface of the silicon oxide film 311 becomes lower than a top surface of the body B.

As shown in a B-B cross section of FIG. 47A, the second gate dielectric film GI2 is formed on an inner surface (a second surface) of the trench Tr32 by thermal oxidation. Next, an N-type polysilicon 315 as a material of the word line and the second gate electrode is deposited in the trench Tr32. A silicon nitride film 317, a silicon oxide film 319, and an amorphous silicon 320 as mask materials are sequentially deposited on the N-type polysilicon 315.

Figure 48:
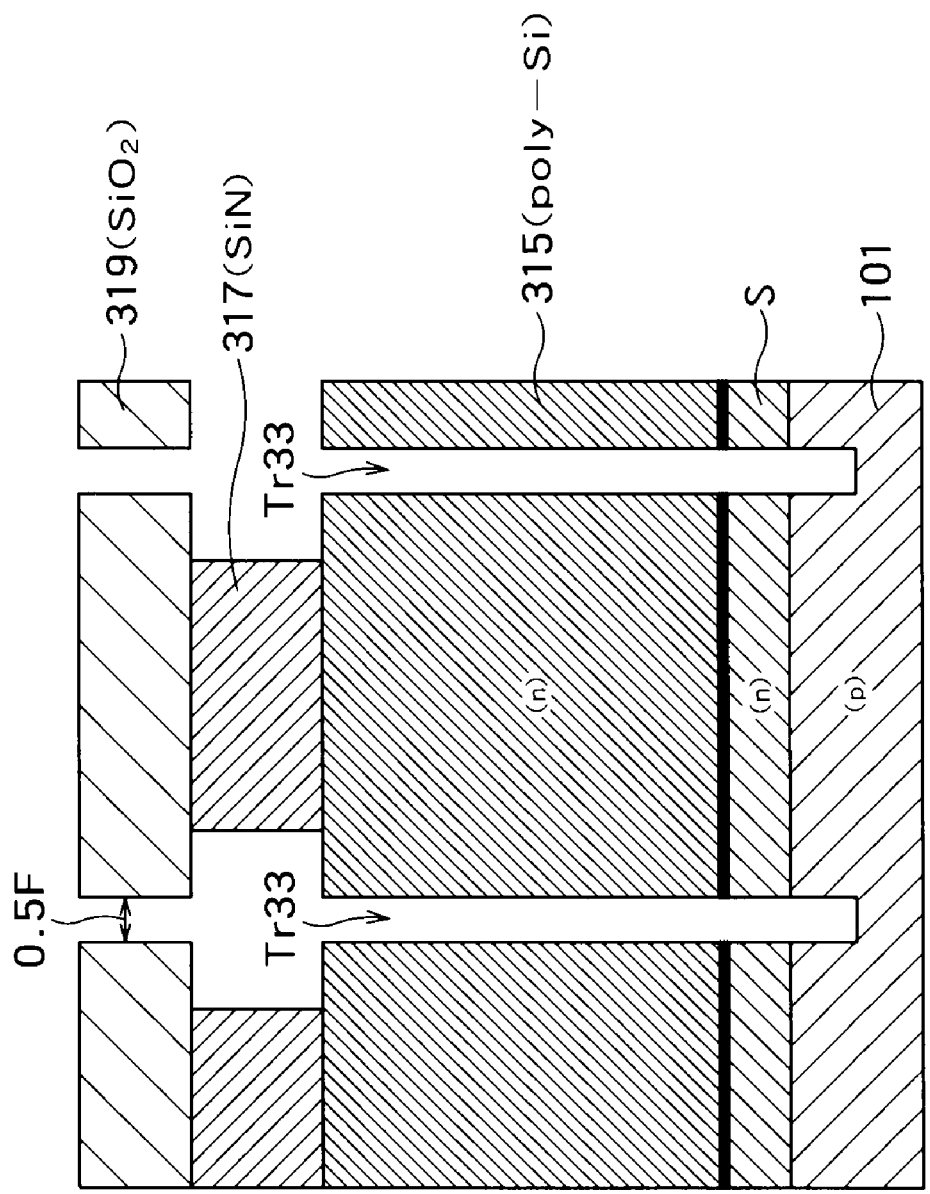
Figure 49:
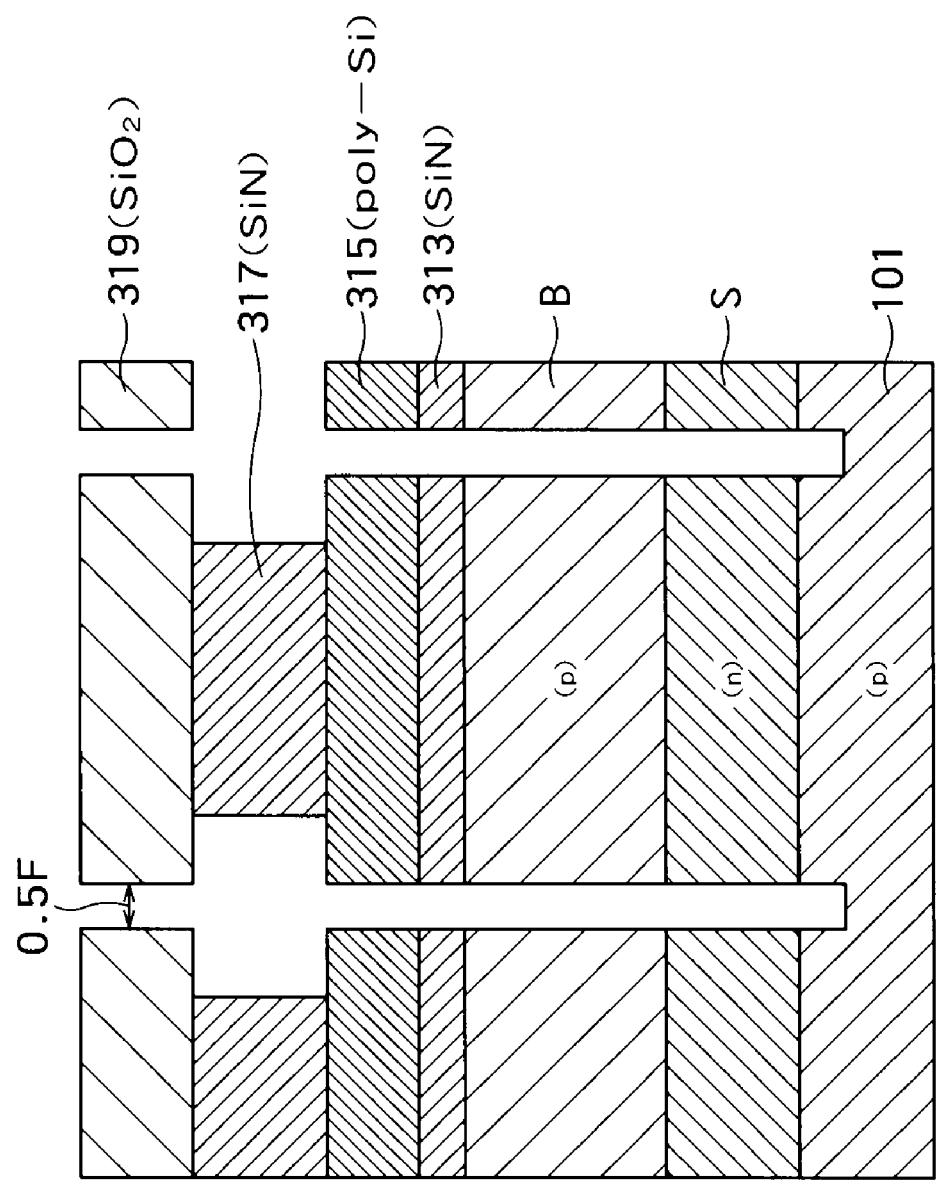
Figure 50:
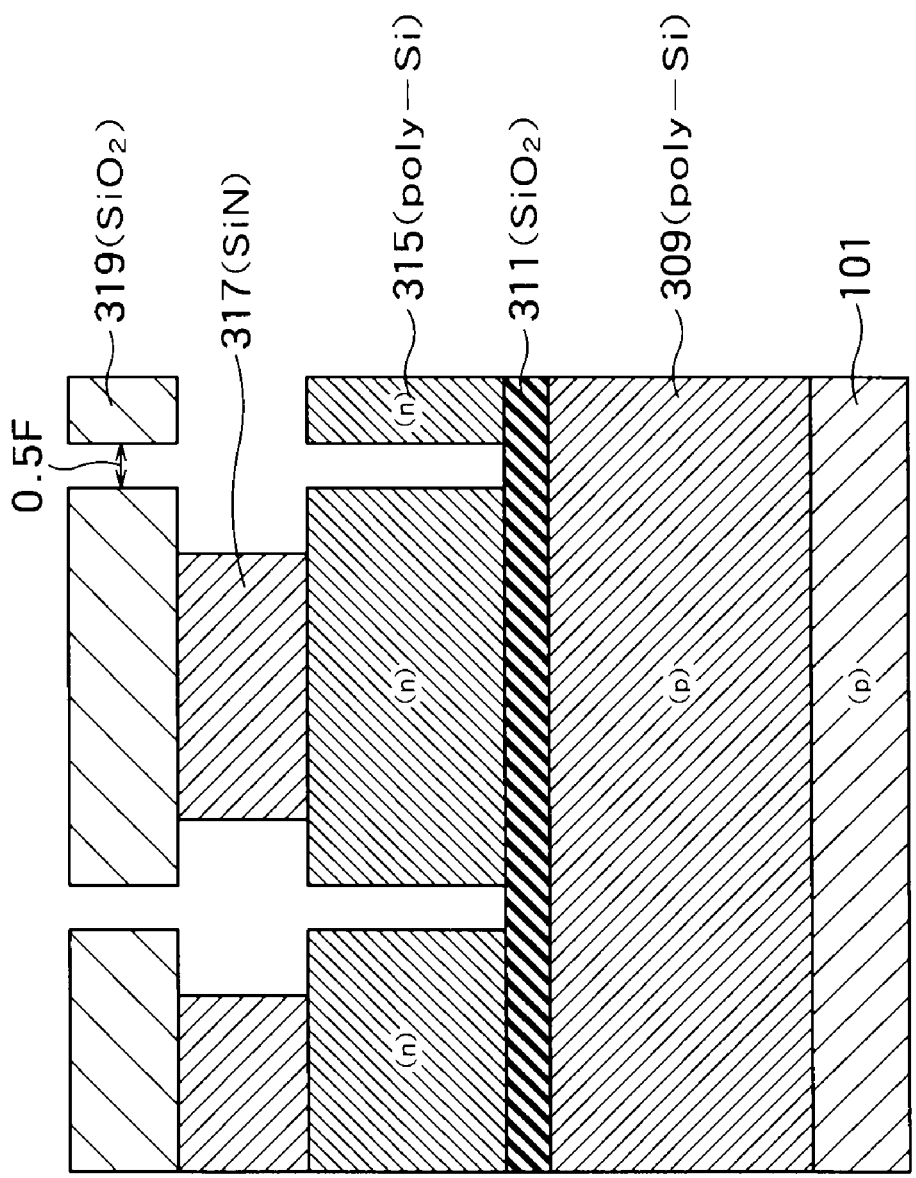
Figure 51:
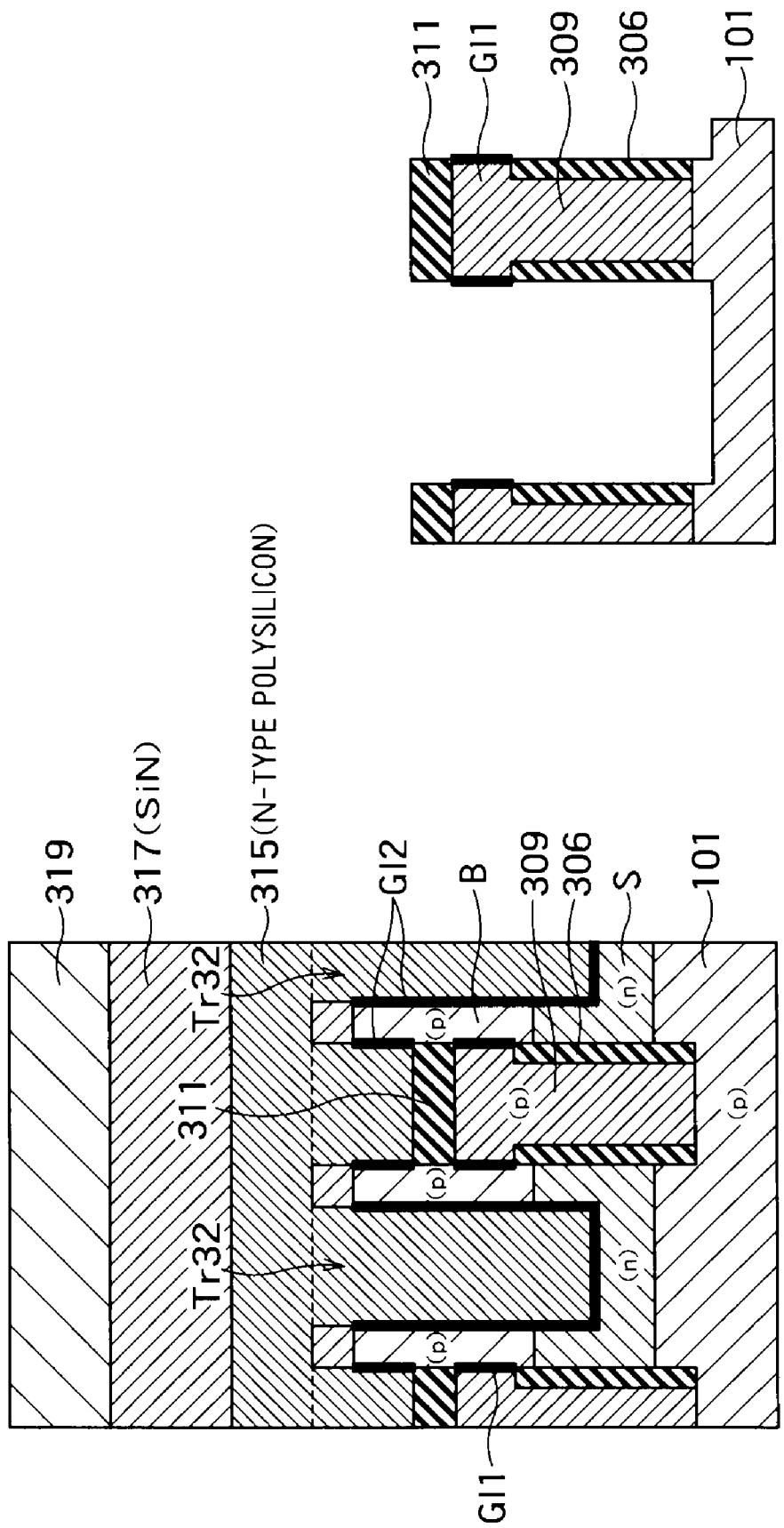

Next, as shown in a 2-2 cross section of FIG. 47B, the amorphous silicon 320 in an isolation dielectric film region is removed using lithography and RIE. At this stage, a space width of the amorphous silicon 320 is F. Amorphous silicon having a film thickness 0.25 F is deposited again, and this amorphous silicon is etched back, thereby forming an amorphous silicon spacer. With this arrangement, a space width (a width of the isolation dielectric film region) of the amorphous silicon 320 is set 0.5 F. The silicon oxide film 319 and the silicon nitride film 317 are anisotropically etched using the amorphous silicon 320 as a mask. As shown in FIG. 48 to FIG. 50, the silicon nitride film 317 is etched in a lateral direction by hot phosphoric acid solution. Accordingly, a space width of the silicon nitride film 317 becomes substantially equal to a width of the first space SP1. Next, as shown in FIG. 48, a trench Tr33 reaching the substrate 10 piercing through the N-type polysilicon 315 is formed using the amorphous silicon 320 and the silicon oxide film 319 as masks. Accordingly, as shown in an A-A cross section of FIG. 49, the body B is isolated in a self aligned manner at an interval of a width 0.5 F toward a column direction. As shown in a 2-2 cross section of FIG. 48, the N-type polysilicon 315 as a second gate electrode is isolated in a self aligned manner at an interval of a width 0.5 F toward a column direction. In this case, a B-B cross section and a C-C cross section are the same as those shown in FIG. 51A and FIG. 51B.

Figure 52:
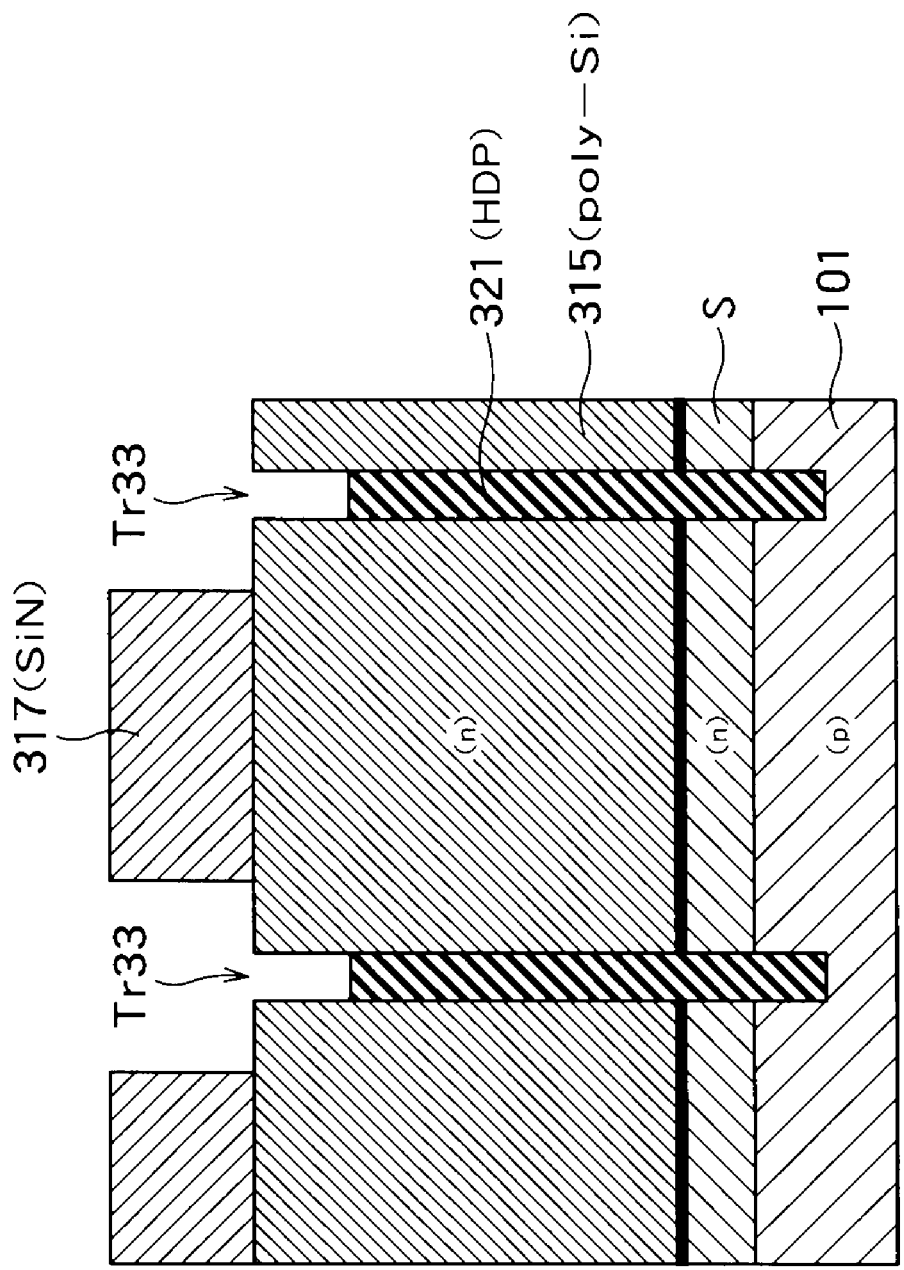
Figure 53:
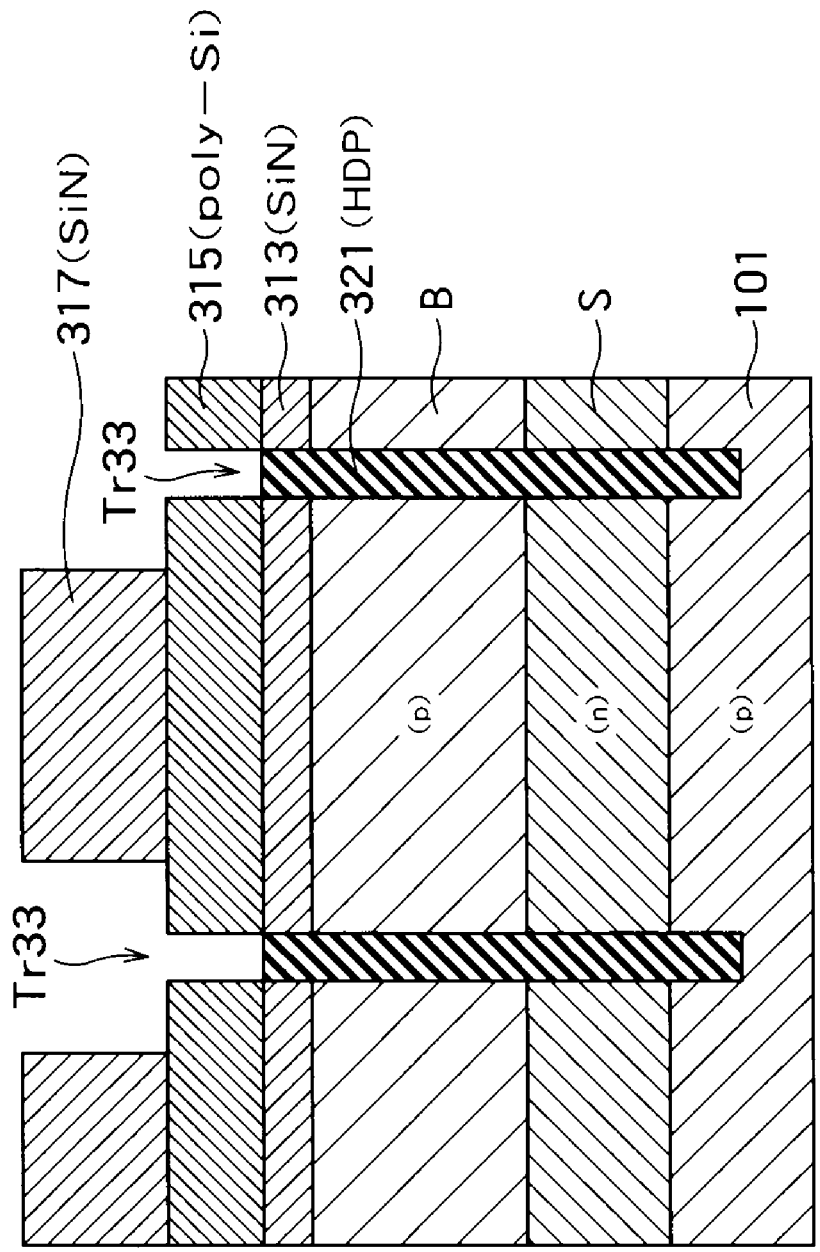
Figure 54:
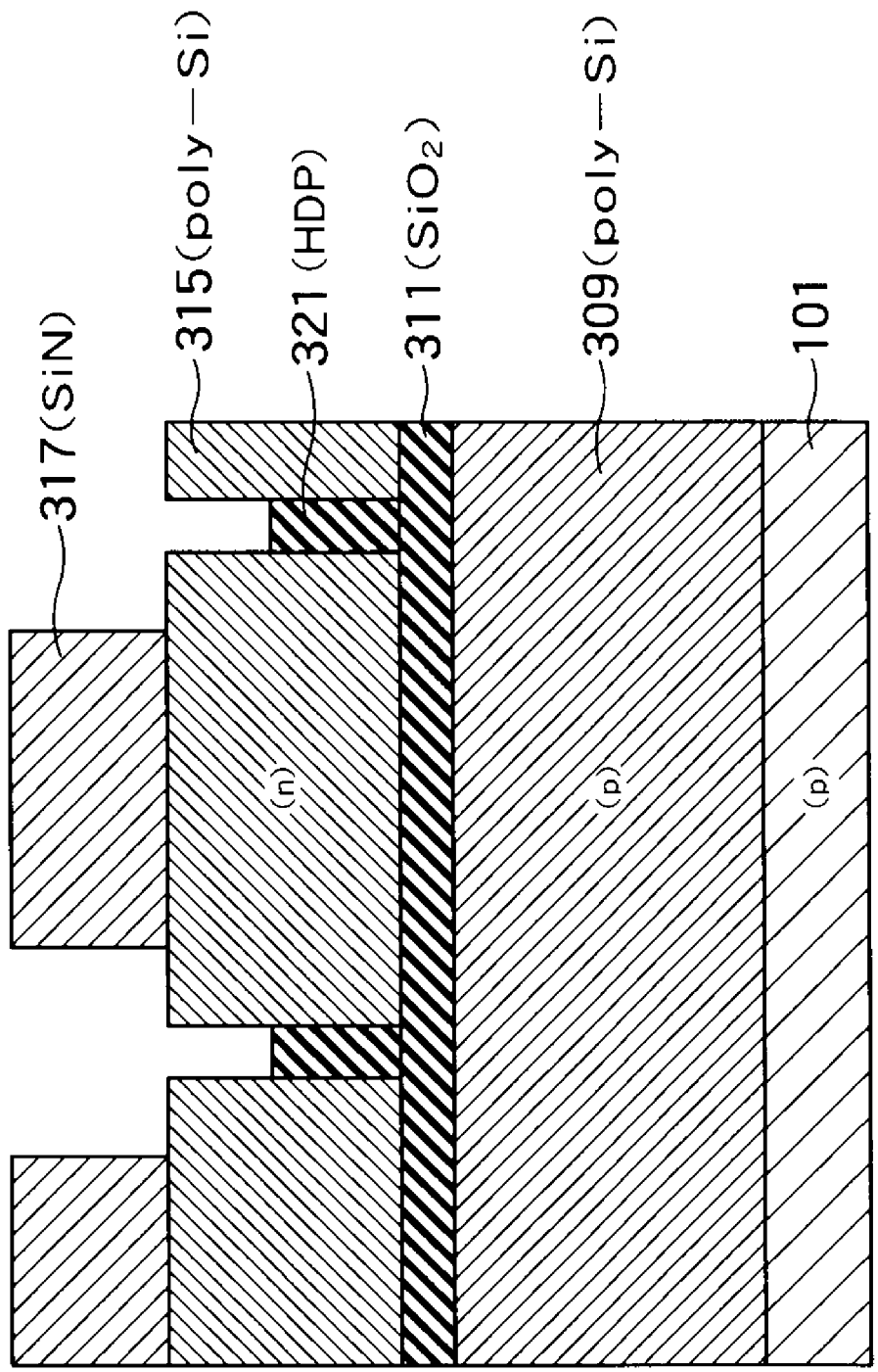
Figure 55:
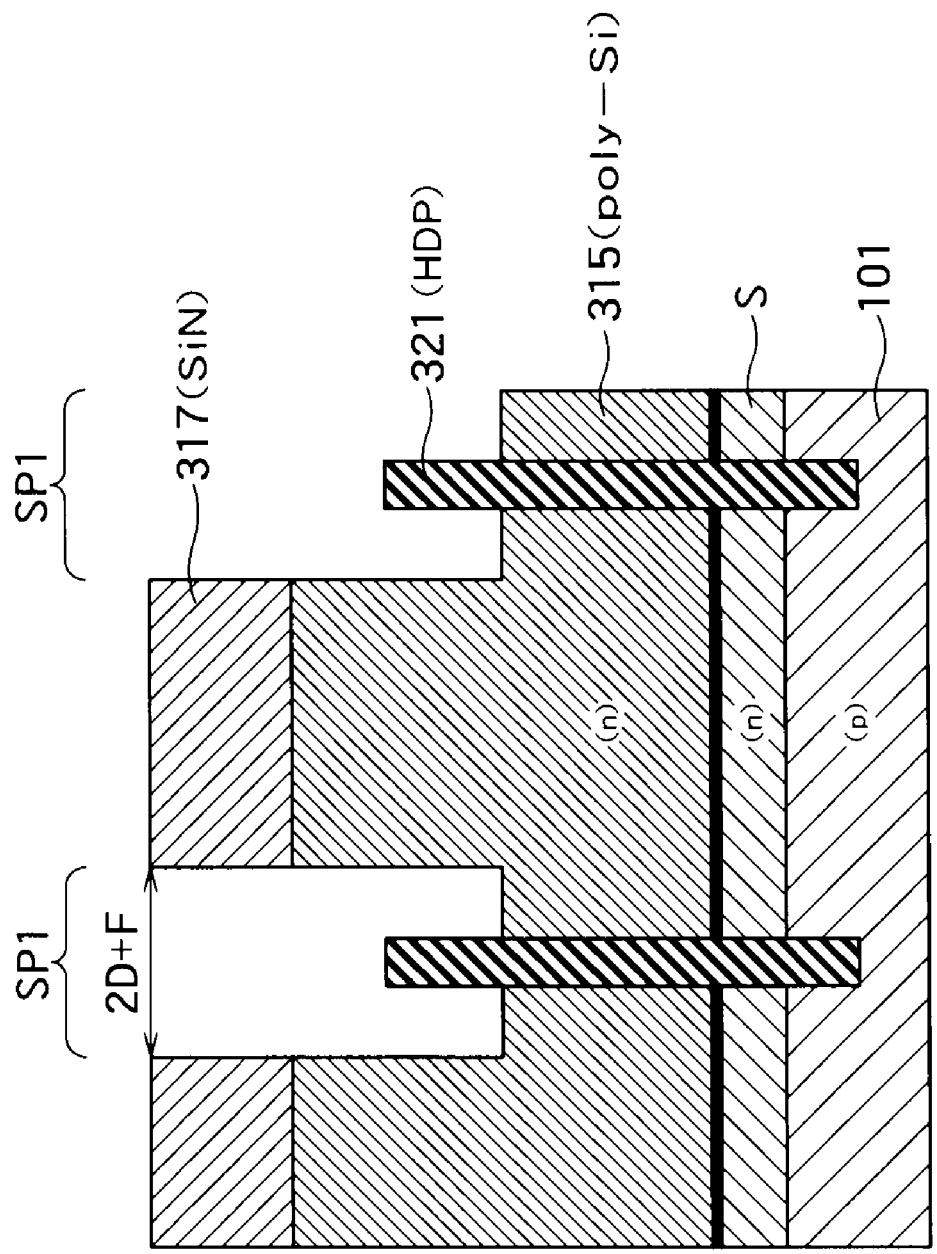
Figure 56:
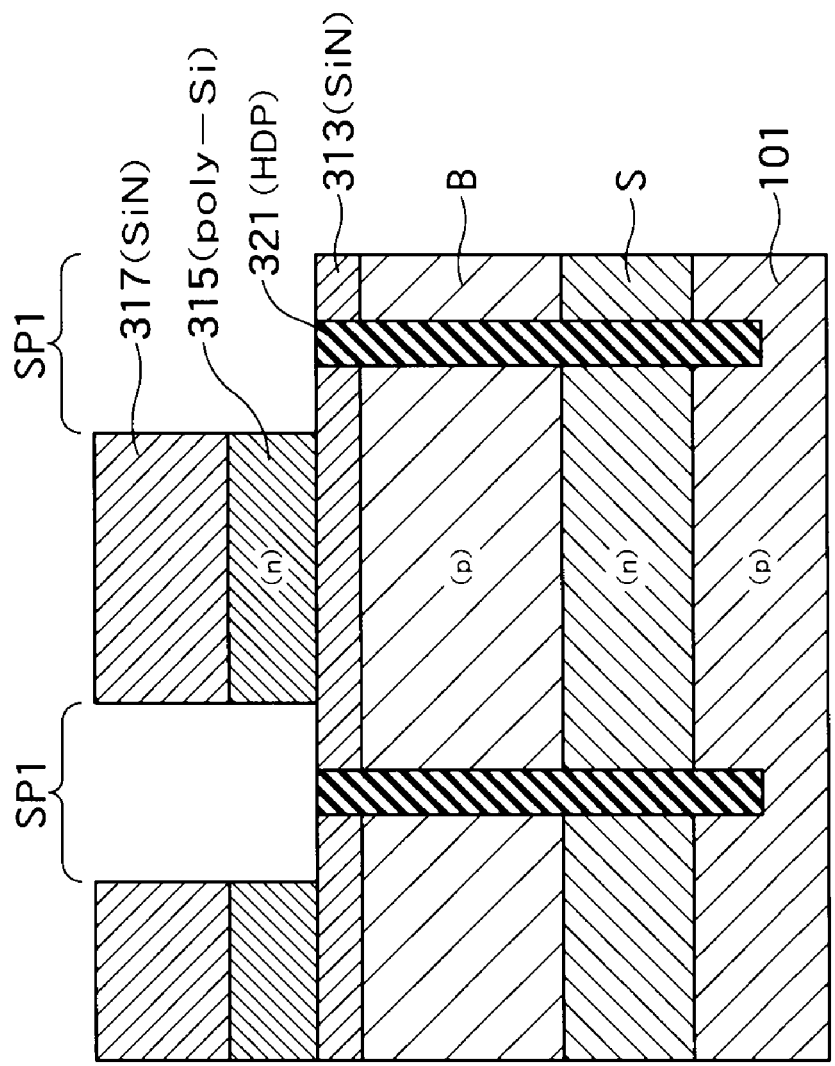
Figure 57:
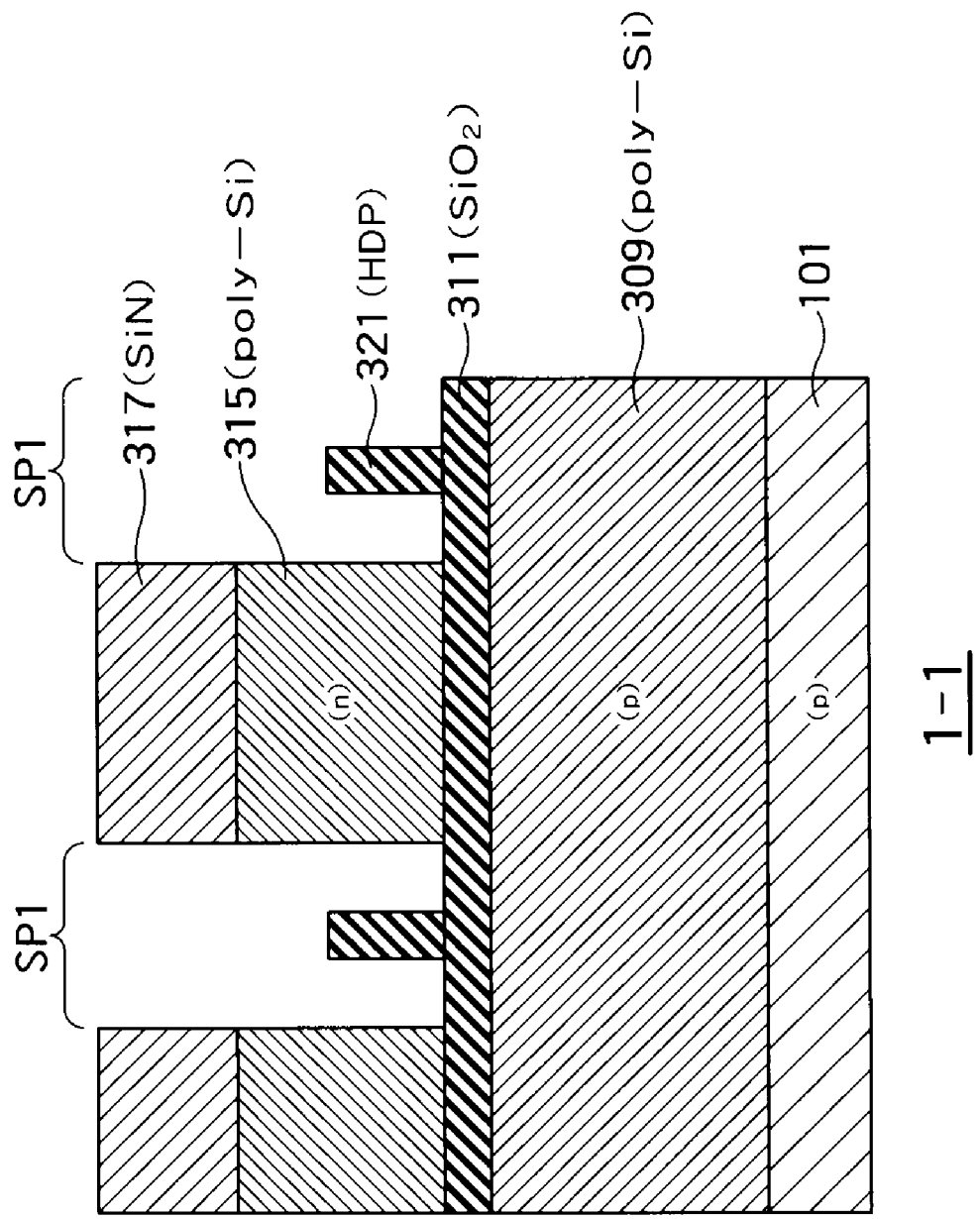
Figure 58:
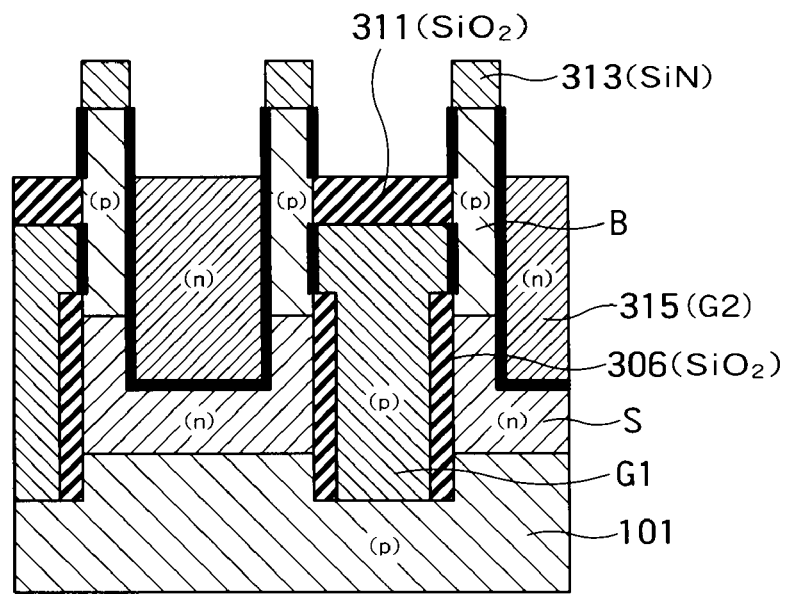

Next, as shown in FIG. 52 to FIG. 54, a silicon oxide film 321 is filled into the Tr33 by HDP. Next, as shown in FIG. 55 to FIG. 58, an upper part of the N-type polysilicon 315 is etched using the silicon nitride film 317 as a mask. Accordingly, as shown in a 2-2 cross section of FIG. 55, the polysilicon is formed in an inversed T-shape. The N-type polysilicon 315 is the second gate electrode G2. That is, while a lower part of the second gate electrode G2 is isolated to a column direction by a width 0.5 F, an upper part of the second gate electrode G2 is isolated by a width (2D+F) of the first space SP1.

Figure 59:
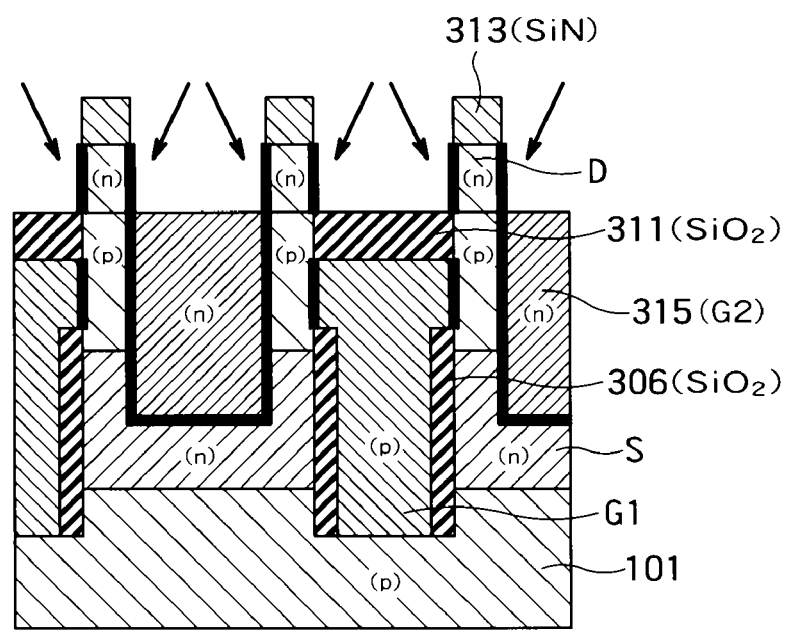
Figure 60:
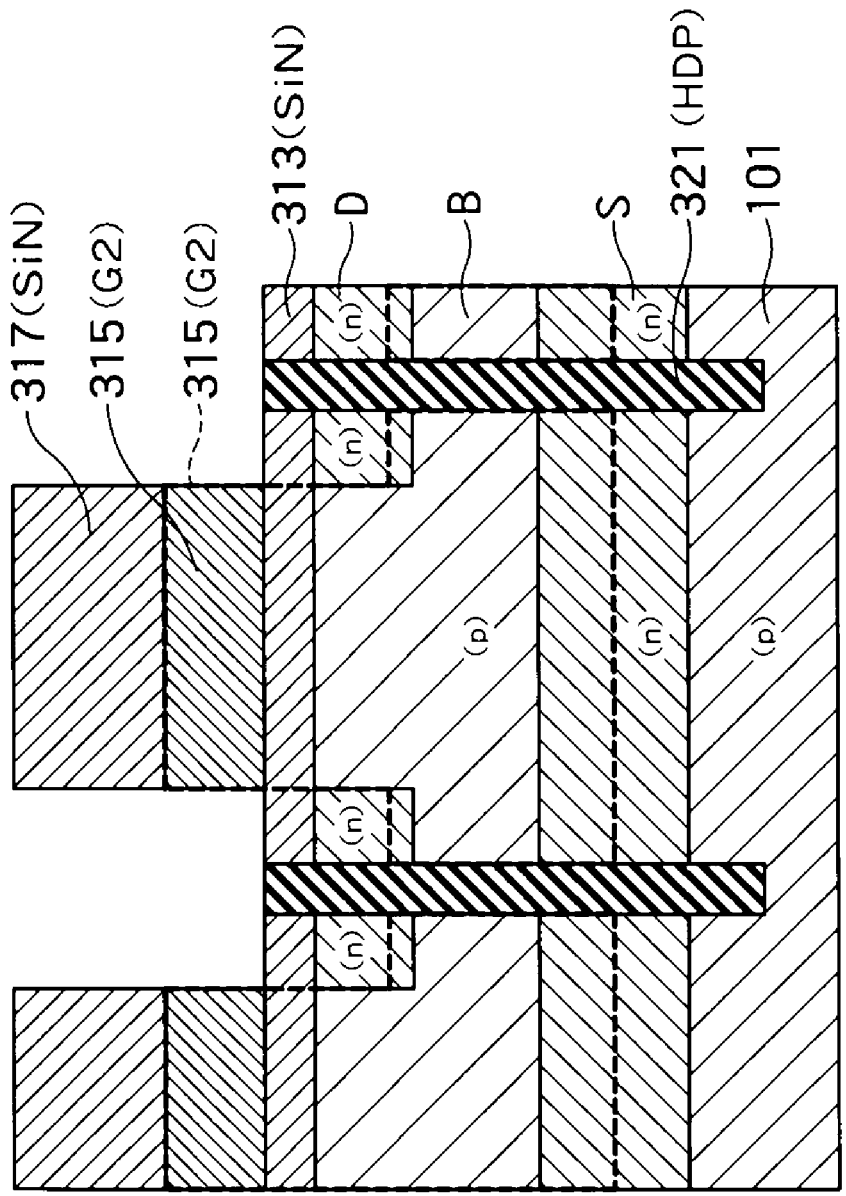

Next, as shown by an arrowhead in FIG. 59, an N-type impurity is ion implanted from an oblique direction, thereby forming the drain layer D to match the shape of the N-type polysilicon 315 (the second gate electrode G2) as shown in FIG. 60. A broken-line part shown in FIG. 60 shows a shape of the second gate electrode G2. However, the second gate electrode G2 is not shown in a cross-sectional view in FIG. 60.

The second gate electrode G2 and the drain layer D are overlapped with each other. Accordingly, parasitic resistance between the source and the drain becomes small. At the time of writing data using a GIDL current, the GIDL current can be increased by overlapping the second gate electrode G2 with the drain layer D. On the other hand, the first gate electrode (plate) G1 is not overlapped with the drain layer D. Accordingly, the GIDL current at the data holding time can be decreased, and the data retention time in the "0" cells increases.

Figure 61:
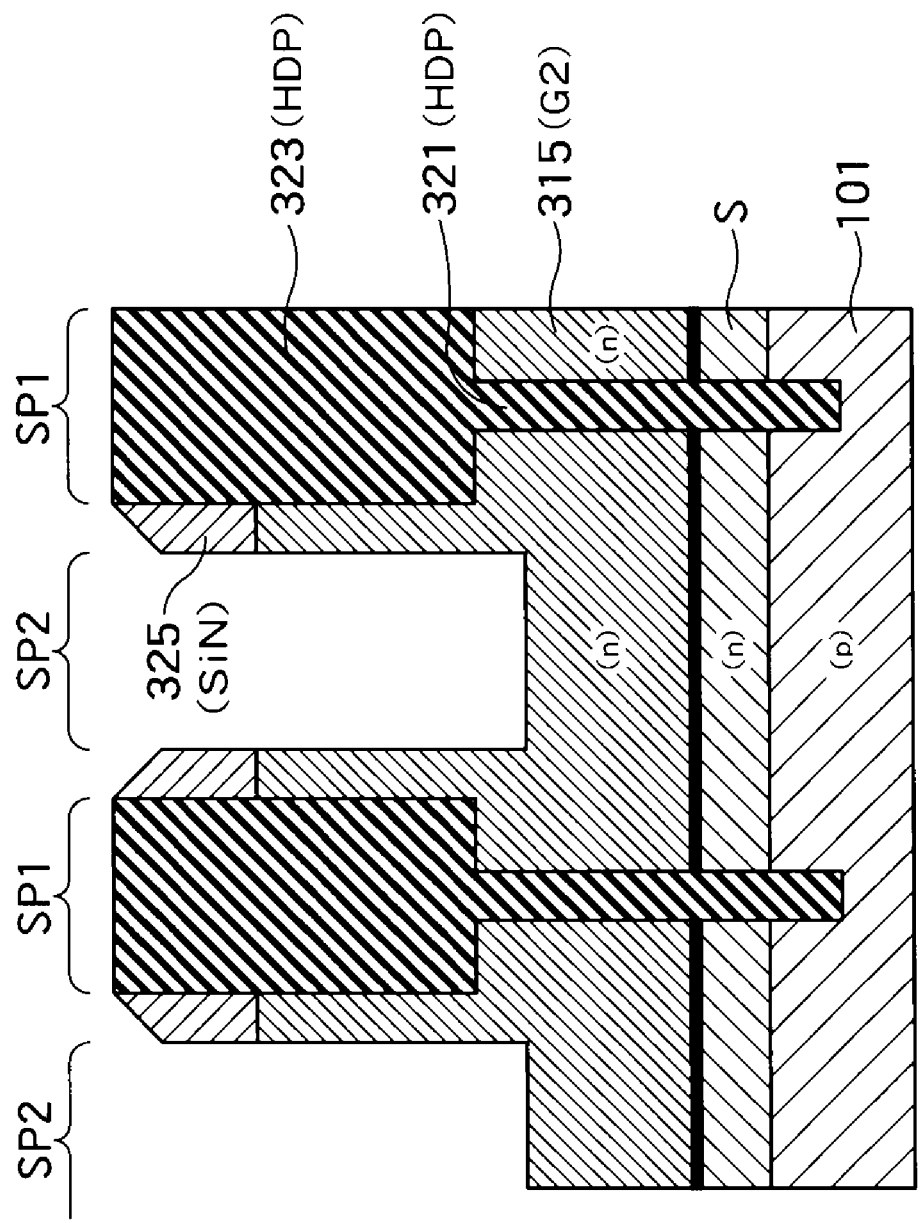
Figure 62:
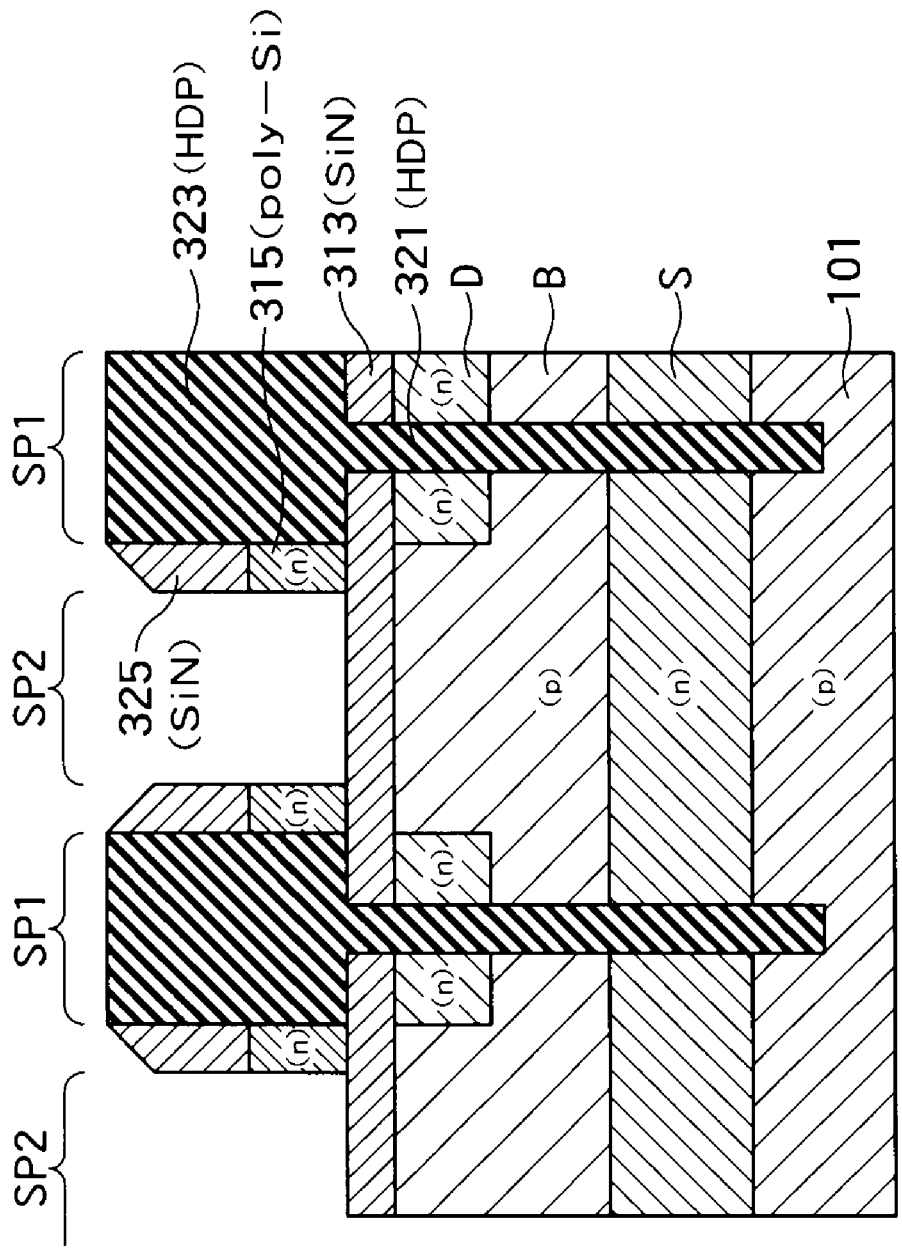
Figure 63:
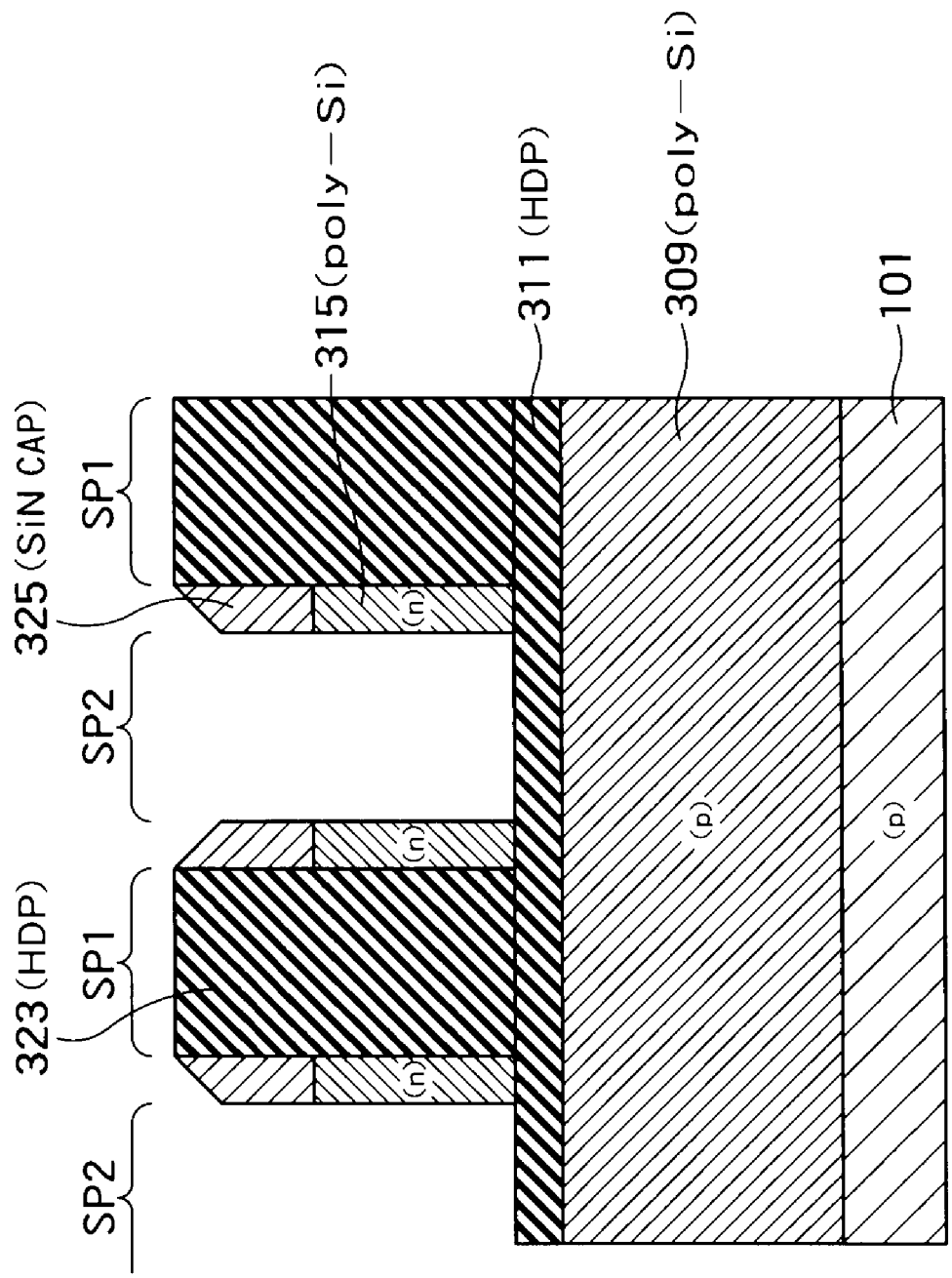
Figure 64:
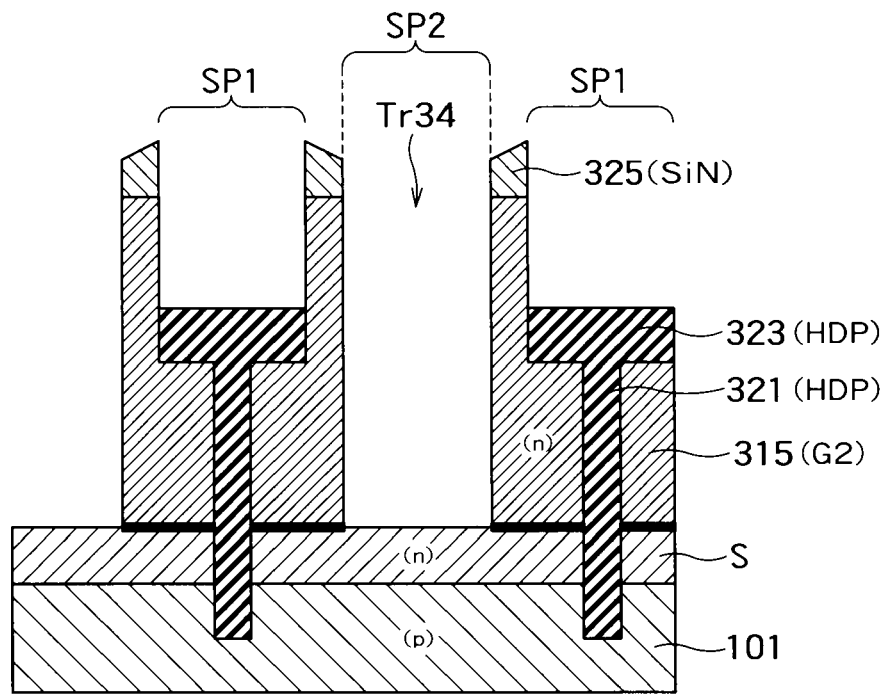
Figure 65:
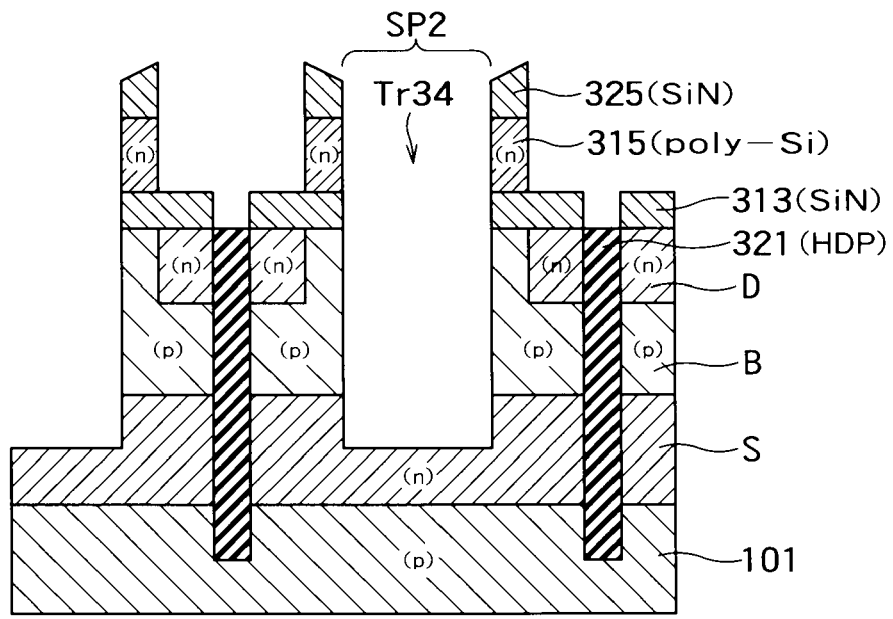
Figure 66:
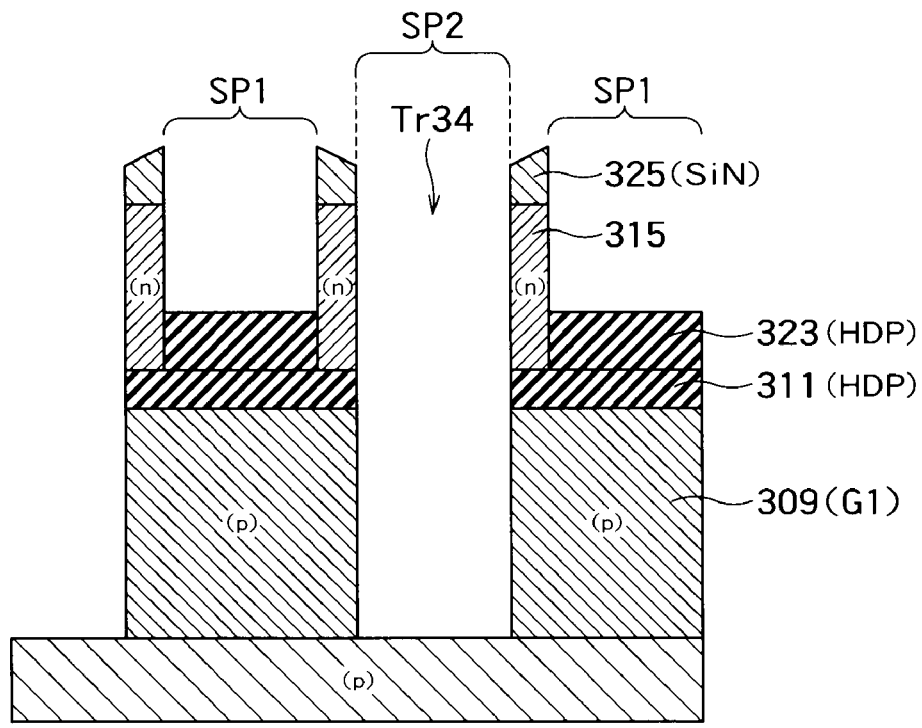
Figure 67:
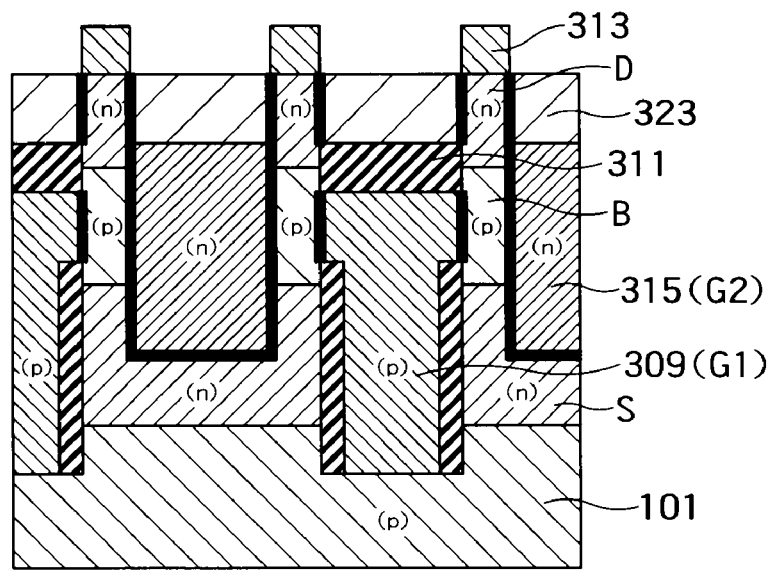

Next, as shown in FIG. 61 to FIG. 63, a silicon oxide film 323 is filled into the first space SP1 by HDP. The silicon nitride film 317 is removed by hot phosphoric acid solution. A cap 325 including a silicon nitride film is formed on a side surface of the silicon oxide film 323 exposed by removing the silicon nitride film 317. The width Y of the word line WL is determined by a film thickness of the cap 325. Therefore, the width of the word line WL can be formed smaller than F. The N-type polysilicon 315 is anisotropically etched until the silicon oxide film 311 is exposed, using the cap 325 and the silicon oxide film 323 as masks.

Next, as shown in FIG. 64 to FIG. 67, the silicon nitride film 313, the body B, the silicon oxide film 311, the P-type polysilicon 309, and the N-type polysilicon 315 in the second space SP2 are anisotropically etched using the cap 325 and the silicon oxide film 323 as masks. A trench Tr34 is formed to reach the source layer S or the P-type well 101. Accordingly, in a 2-2 cross section of FIG. 64, the second gate electrodes G2 are isolated by each memory cell. As shown in an A-A cross section of FIG. 65, the bodies B are isolated by each memory cell. In a 1-1 cross section of FIG. 66, the first gate electrodes G1 are isolated by each two memory cells.

Next, the silicon nitride films 325 and 313 are removed. Because the silicon nitride film 313 is removed, a cavity is formed below the N-type polysilicon 315 (the word line) shown in FIG. 65. A silicon nitride film is deposited again, and this is etched back. Accordingly, a spacer 327 is formed as shown in FIG. 37. The spacer 327 is also filled below the word line WL. A high-concentration N-type impurity is introduced into the source layer S and the drain layer D. The silicide 50 is formed on the surface of the source layer S and the drain layer D.

Thereafter, as shown in FIG. 37, the interlayer dielectric film ILD, the source line contact SLC, and the bit line contact BLC are formed. Further, the source line SL and the bit line BL are formed, thereby obtaining the configuration of the FBC memory according to the third embodiment.

Fourth Embodiment

Figure 68:
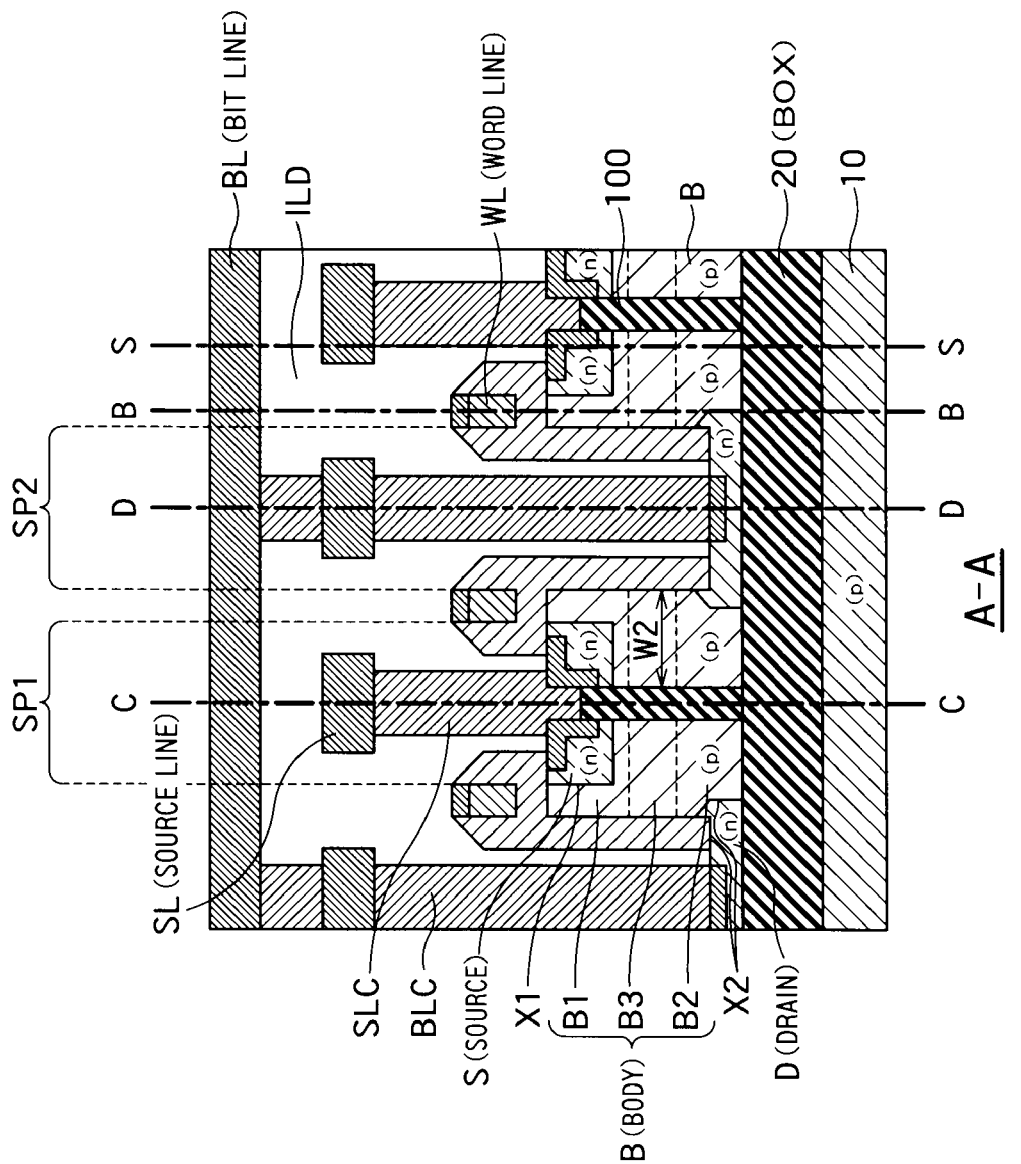
FIG. 68 to FIG. 71 are cross-sectional views showing a configuration of an FBC memory according to a fourth embodiment of the present invention.
Figure 69:
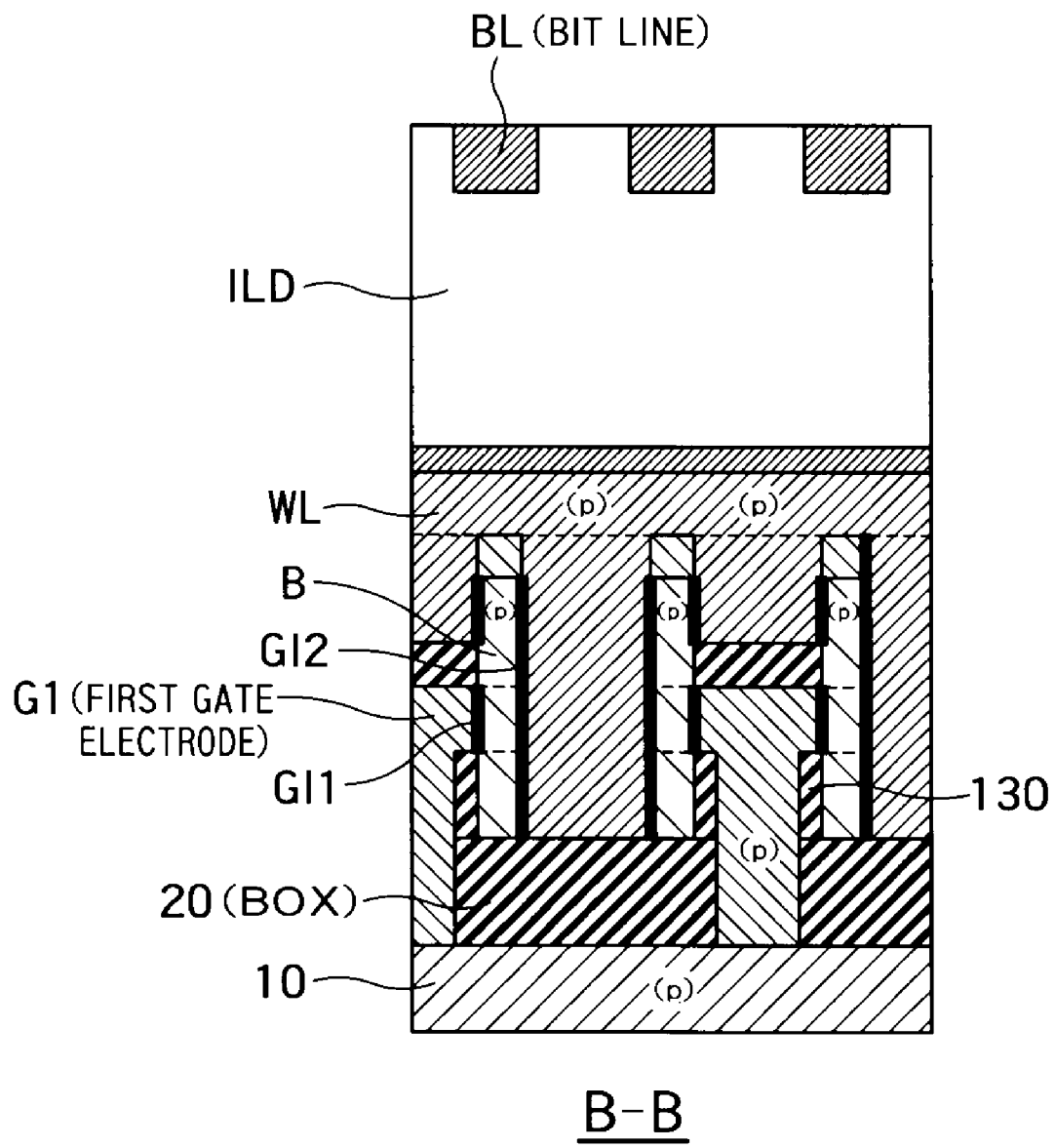
Figure 70:
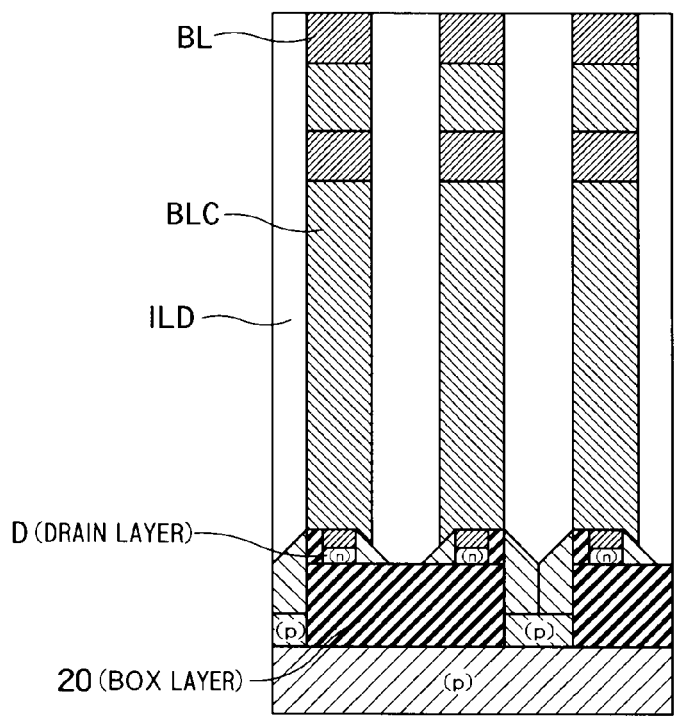

FIG. 68 to FIG. 71 are cross-sectional views showing a configuration of an FBC memory according to a fourth embodiment of the present invention. In the fourth embodiment, as shown in FIG. 68, the source line contact SLC is formed on the first space SP1, and the bit line contact BLC is formed in the second space SP2. That is, in the fourth embodiment, a positional relationship between the source line contact SLC and the bit line contact BLC is opposite to that in the third embodiment.

Further, the fourth embodiment is different from the third embodiment in that the FBC memory is formed on the SOI substrate, as shown in FIG. 68 to FIG. 71. Other configurations of the fourth embodiment can be basically identical to those of the third embodiment.

An area of the PN junction X2 between the body and the drain shown in FIG. 68 is smaller than an area of the PN junction X1 between the body and the drain in the third embodiment. Further, the drain layer D is isolated from the substrate 10 by the thick BOX layer 20. Therefore, bit line capacitance according to the fourth embodiment becomes smaller than bit line capacitance according to the third embodiment. This leads to a high-speed operation and lower power consumption of the FBC memory.

Because the area of the PN junction between the body and the drain is small, a leak current of the PN junction is small in the fourth embodiment. This leads to an increase in the data retention time.

Figure 71:
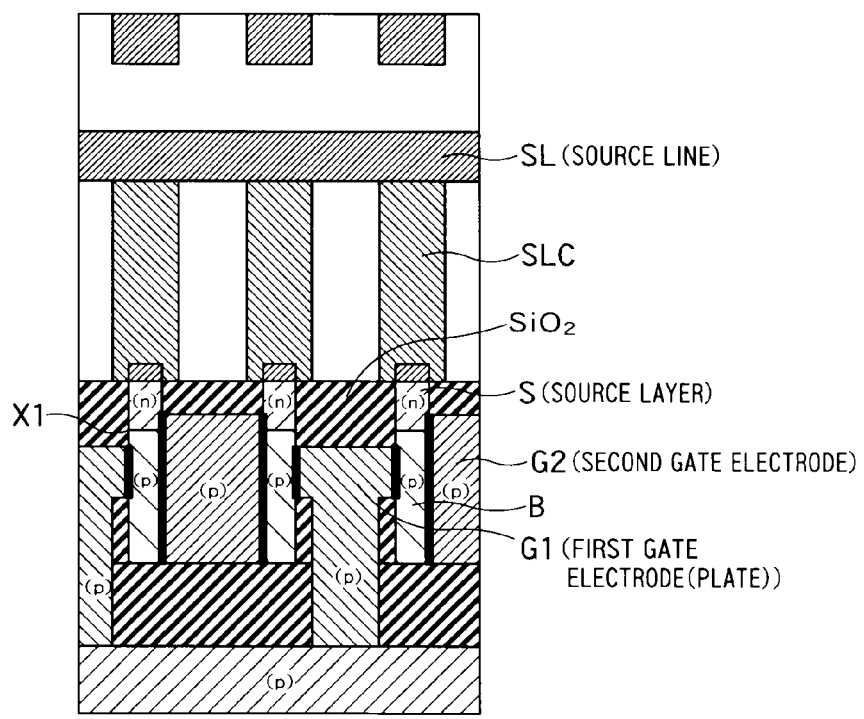

In the fourth embodiment, as shown in FIG. 68 and FIG. 71, because the source layers S adjacent in a column direction are electrically isolated, the source layer S can be selectively driven. The body B is connected between the source layer S and the drain layer D, and is formed to have a vertically large length. Therefore, in the fourth embodiment, an occupied area of the body B is small like a vertical FET. Even when a cell size is downscaled, the distance between the source and the drain can be held. Accordingly, reduction of a signal amount following the downscaling of the gate length can be prevented. Meanwhile, as shown in FIG. 68, the silicide 50 in contact with the source layer S is formed on an outer side surface and a top surface of the U-shaped semiconductor layer. A contact area between the silicide 50 and the source layer S can be increased by increasing a length of the source layer S. Therefore, even when the width Ts of the body B in a row direction is decreased to achieve a fully depleted operation, parasitic resistance of the source layer S can be sufficiently reduced.

The fourth embodiment can also achieve other effects of the third embodiment.

In the fourth embodiment, of course, the second N-type region can be a source and the first N-type region can be a drain. In this case, a positional relationship between the source line contact and the bit line contact becomes opposite.

Fifth Embodiment

Figure 72:
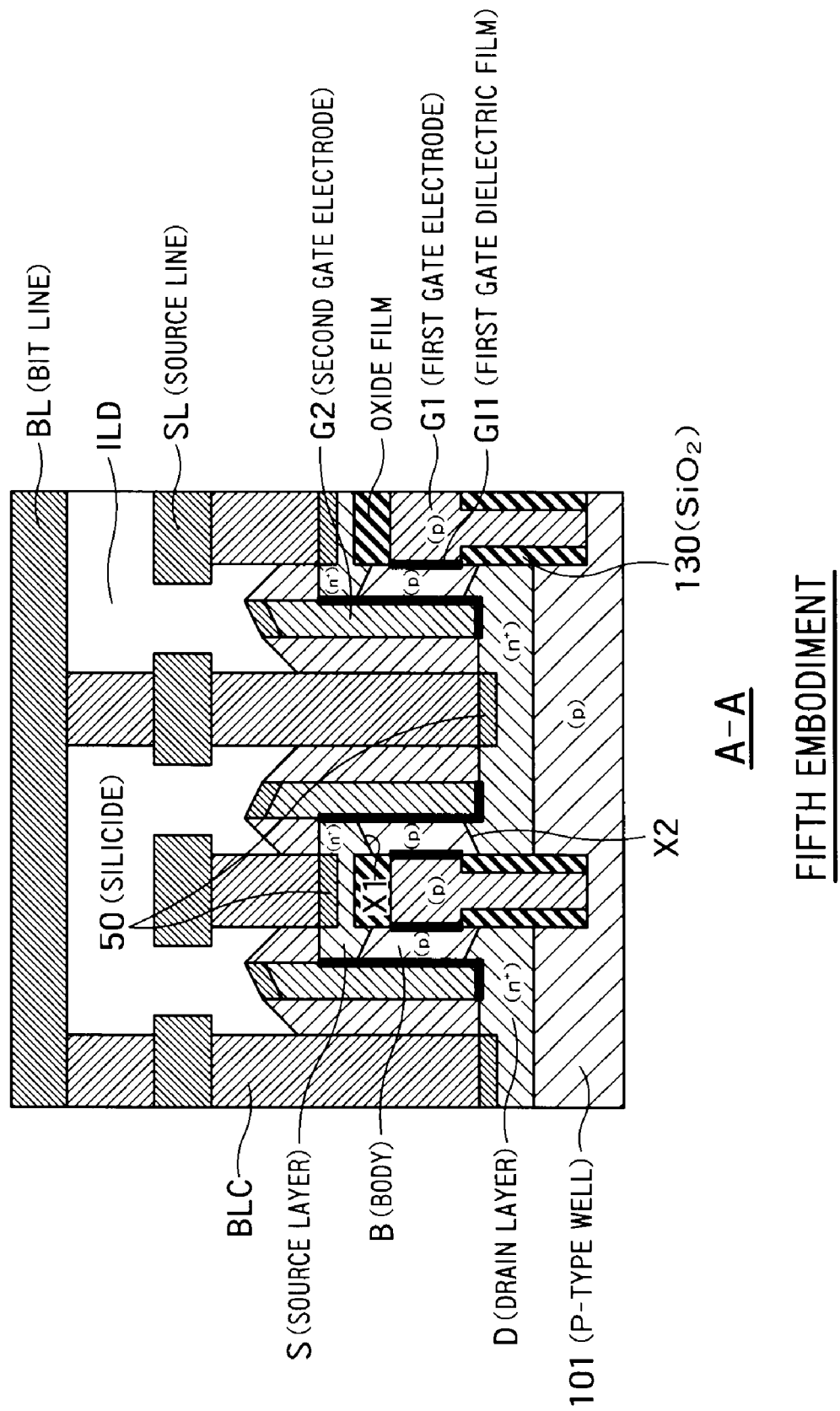
FIG. 72 to FIG. 74 are cross-sectional views showing a configuration of an FBC memory according to a fifth embodiment of the present invention.
Figure 73:
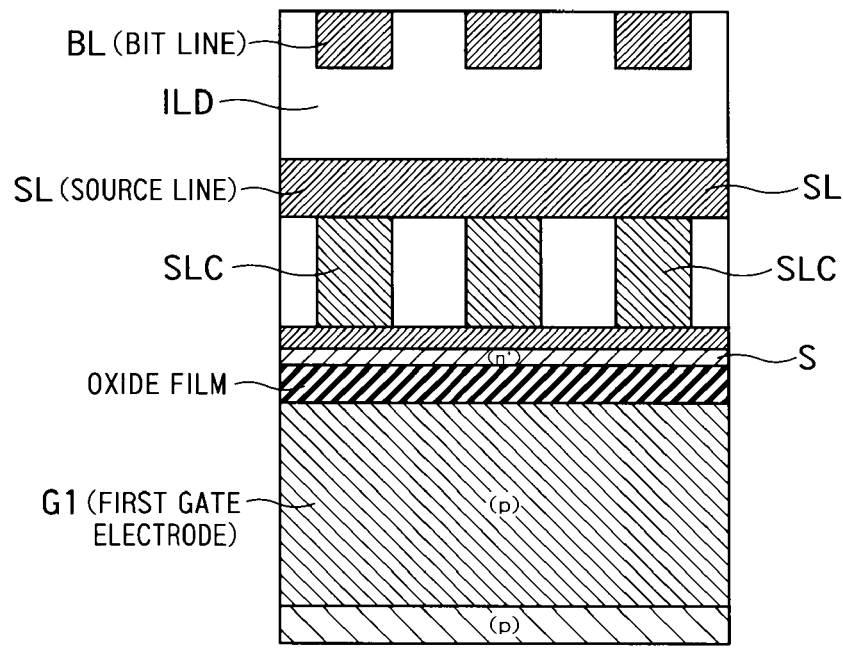
Figure 74:
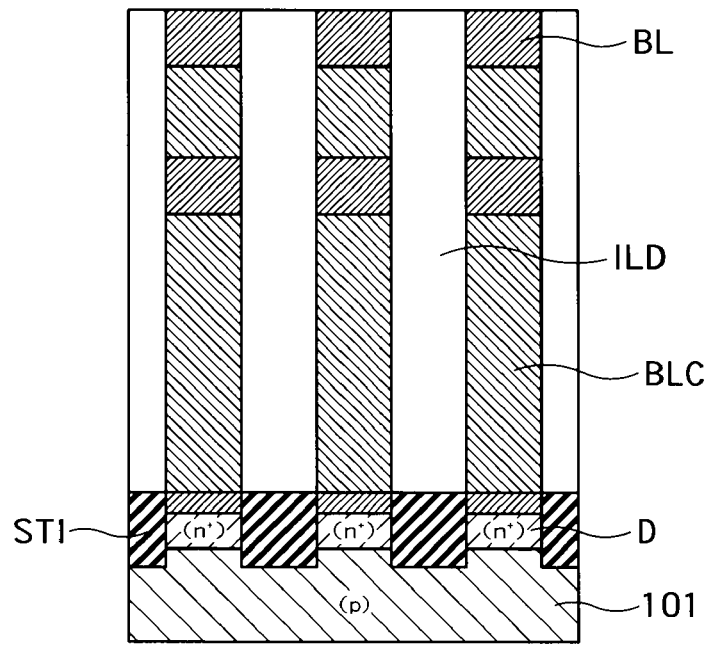

FIG. 72 to FIG. 74 are cross-sectional views showing a configuration of an FBC memory according to a fifth embodiment of the present invention. A plane configuration in the fifth embodiment is similar to those of the plan views shown in FIG. 1 and FIG. 2. The fifth embodiment is different from the first embodiment in that the bulk silicon substrate 10 is used. The FBC memory according to the fifth embodiment can be manufactured by a low cost, because the bulk silicon substrate is used. The fifth embodiment can achieve effects identical to those of the first embodiment.

As shown in FIG. 72 and FIG. 73, the first gate electrode G1 including a P-type silicon is connected in common to the P-type well 101. Accordingly, a plate potential can be applied to all the first gate electrodes G1. The body B is isolated from the P-type well 101 by the drain layer D.

As shown in FIG. 74, two adjacent drain layers D are isolated from each other by STI in a cross section in a row direction. Because the P-type well 101 is formed below the drain layer D, the adjacent drain layers D are electrically isolated from each other. However, two memory cells adjacent in a column direction share the drain layer D.

The first gate electrode G1, the third insulation film (silicon oxide film) 130, and the drain layer D shown in FIG. 72 can be formed by the manufacturing method according to the second embodiment using the bulk substrate. The source layer D, the second gate electrode G2 or the like can be formed by the manufacturing method according to the first embodiment.

The invention claimed is:

1. A semiconductor memory device comprising:
   a semiconductor substrate;
   a plurality of bit lines extending to a first direction;
   a plurality of word lines extending to a second direction crossing with the first direction;
   a plurality of source lines extending to the second direction;
   a semiconductor layer formed in a U-shape on the semiconductor substrate in a cross section along the first direction;
   a first diffusion layer provided at an upper part of the U-shaped semiconductor layer;
   a second diffusion layer provided at a lower part of the U-shaped semiconductor layer;
   a body formed at an intermediate portion of the semiconductor layer between the first diffusion layer and the second diffusion layer, the body being in an electrically floating state, and accumulating or discharging an electric charge to store data;
   a first gate dielectric film provided on a first side surface of the body, the first side surface facing the first direction;
   a first gate electrode provided via the first gate dielectric film on the first side surface;
   a second gate dielectric film provided on a second side surface of the body, the second side surface being provided on an opposite side of the first side surface of the body and facing the first direction;
   a second gate electrode provided on the second side surface via the second gate dielectric film, and insulated from the first gate electrode;
   a bit line contact electrically connecting the bit line to one of the first and the second diffusion layers; and
   a source line contact electrically connecting the source line to the other one of the first and the second diffusion layers, wherein
   the body, the first diffusion layer, and the second diffusion layer form memory cells, and a plurality of the memory cells adjacent in the first direction alternately share the bit line contact and the source line contact.

2. The semiconductor memory device according to claim 1, wherein the first and the second diffusion layers include respectively a first plane portion and a second plane portion extending along the first direction from the first side surface of the body and formed in parallel with the surface of the semiconductor substrate, and the first and the second plane portions are shared respectively by memory cells adjacent in the first direction, and
   one of the bit line contact and the source line contact is in contact with the first plane portion, and the other one is in contact with the second plane portion.

3. The semiconductor memory device according to claim 2, wherein the first and the second plane portions are isolated from each other in a direction perpendicular to the surface of the semiconductor substrate.

4. The semiconductor memory device according to claim 1, wherein the semiconductor layer is formed unevenly in a cross section along the first direction.

5. The semiconductor memory device according to claim 1, wherein in a cross section along the first direction, the first gate electrode is provided corresponding to each convex part of the semiconductor layer, and the second gate electrode is provided corresponding to each outer side surface of the convex part of the semiconductor layer.

6. The semiconductor memory device according to claim 1, wherein the first diffusion layer and the first gate electrode are provided in substantially the same region when viewed from above the surface of the semiconductor substrate.

7. The semiconductor memory device according to claim 1, wherein the first gate electrode faces a part of a bottom surface of the U-shaped semiconductor layer.

8. The semiconductor memory device according to claim 1, wherein the first gate electrode does not face a junction between the first diffusion layer and the body and a junction between the second diffusion layer and the body.

9. The semiconductor memory device according to claim 1, wherein the memory cells adjacent in the first direction alternately share the first diffusion layer and the second diffusion layer.

10. The semiconductor memory device according to claim 1, wherein the junction between the first diffusion layer and the body is positioned higher than a top surface of the first gate electrode.

11. The semiconductor memory device according to claim 1, wherein the second diffusion layer is isolated from the semiconductor substrate by a pn junction.

12. A semiconductor memory device comprising:
   a semiconductor substrate;
   a plurality of bit lines extending to a first direction;
   a plurality of word lines extending to a second direction crossing with the first direction;
   a plurality of source lines extending to the second direction;
   a semiconductor layer formed in a U-shape on the semiconductor substrate in a cross section along the first direction;
   a first diffusion layer provided at an upper part of the U-shaped semiconductor layer;
   a second diffusion layer provided at a lower part of the U-shaped semiconductor layer;
   a body formed at an intermediate portion of the semiconductor layer between the first diffusion layer and the second diffusion layer, the body being in an electrically floating state, and accumulating or discharging an electric charge to store data;
   a first gate dielectric film provided on a first side surface of the body, the first side surface facing the second direction;
   a first gate electrode provided via the first gate dielectric film on the first side surface;

a second gate dielectric film provided on a second side surface of the body, the second side surface being provided an opposite side of the first side surface of the body and facing the second direction;

a second gate electrode provided on the second side surface via the second gate dielectric film, and insulated from the first gate electrode;

a bit line contact electrically connecting the bit line to one of the first and the second diffusion layers; and a source line contact electrically connecting the source line to the other one of the first and the second diffusion layer, wherein the body, the first diffusion layer, and the second diffusion layer form memory cells, and a plurality of the memory cells adjacent in the first direction alternately share the bit line contact and the source line contact.

13. The semiconductor memory device according to claim 12, wherein the first and the second diffusion layers include respectively a first plane portion and a second plane portion extending along a first direction and formed in parallel on the surface of the semiconductor substrate, and the first and the second plane portions are shared respectively by memory cells adjacent in the first direction, and one of the bit line contact and the source line contact is in contact with the first plane portion, and the other one is in contact with the second plane portion.

14. The semiconductor memory device according to claim 12, wherein the junction between the first diffusion layer and the body is positioned higher than a top surface of the first gate electrode.

15. The semiconductor memory device according to claim 12, wherein the second gate electrode is integratedly formed with the word line.

16. The semiconductor memory device according to claim 12, wherein the first gate electrode faces the second diffusion layer via a third gate dielectric film having a larger EOT (Equivalent Oxide Thickness) than that of the first gate dielectric film, and a boundary portion between the first gate dielectric film and the third gate dielectric film is positioned higher than a position of a junction between the body and the second diffusion layer.

17. The semiconductor memory device according to claim 12, wherein the body includes a projection stretched to a position higher than a top surface of the first diffusion layer, and the second gate electrode faces both side surfaces of the projection.

18. The semiconductor memory device according to claim 12, wherein the memory cells adjacent in the first direction alternately share the first diffusion layer and the second diffusion layer.

19. The semiconductor memory device according to claim 12, further comprising an isolation dielectric film electrically isolating the body of one memory cell from the body of the other memory cell, in the two memory cells adjacent in the first direction.

20. The semiconductor memory device according to claim 1, wherein the second diffusion layer is isolated from the semiconductor substrate by a pn junction.

* * * * *